US009831437B2

(12) United States Patent
Zeng et al.

(10) Patent No.: US 9,831,437 B2
(45) Date of Patent: Nov. 28, 2017

(54) ORGANIC ELECTROLUMINESCENT MATERIALS AND DEVICES

(71) Applicant: Universal Display Corporation, Ewing, NJ (US)

(72) Inventors: Lichang Zeng, Lawrenceville, NJ (US); Vadim Adamovich, Yardley, PA (US); Ting-Chih Wang, Lawrenceville, NJ (US); Chuanjun Xia, Lawrenceville, NJ (US); Michael S. Weaver, Princeton, NJ (US); Hitoshi Yamamoto, Pennington, NJ (US); Bert Alleyne, Newtown, PA (US)

(73) Assignee: Universal Display Corporation, Ewing, NJ (US)

( * ) Notice: Subject to any disclaimer, the term of this patent is extended or adjusted under 35 U.S.C. 154(b) by 624 days.

(21) Appl. No.: 14/253,471

(22) Filed: Apr. 15, 2014

(65) Prior Publication Data

US 2015/0053938 A1 Feb. 26, 2015

Related U.S. Application Data

(60) Provisional application No. 61/894,160, filed on Oct. 22, 2013, provisional application No. 61/867,858, filed on Aug. 20, 2013, provisional application No. 61/874,444, filed on Sep. 6, 2013, provisional application No. 61/920,544, filed on Dec. 24, 2013, provisional application No. 61/940,603, filed on Feb. 17, 2014.

(51) Int. Cl.
| | |
|---|---|
| *H01L 51/54* | (2006.01) |
| *C09K 11/06* | (2006.01) |
| *H01L 51/00* | (2006.01) |
| *H01L 51/50* | (2006.01) |

(52) U.S. Cl.
CPC ...... *H01L 51/0054* (2013.01); *H01L 51/0067* (2013.01); *H01L 51/0072* (2013.01); *H01L 51/5016* (2013.01); *H01L 51/5056* (2013.01); *H01L 51/5072* (2013.01); *H01L 51/5096* (2013.01); *H01L 2251/5384* (2013.01)

(58) Field of Classification Search
None
See application file for complete search history.

(56) References Cited

U.S. PATENT DOCUMENTS

| | | | |
|---|---|---|---|
| 4,769,292 A | 9/1988 | Tang et al. | |
| 5,061,569 A | 10/1991 | VanSlyke et al. | |
| 5,247,190 A | 9/1993 | Friend et al. | |
| 5,703,436 A | 12/1997 | Forrest et al. | |
| 5,707,745 A | 1/1998 | Forrest et al. | |
| 5,834,893 A | 11/1998 | Bulovic et al. | |
| 5,844,363 A | 12/1998 | Gu et al. | |
| 5,981,092 A | 11/1999 | Arai et al. | |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,294,398 B1 | 9/2001 | Kim et al. | |
| 6,303,238 B1 | 10/2001 | Thompson et al. | |
| 6,337,102 B1 | 1/2002 | Forrest et al. | |
| 6,468,819 B1 | 10/2002 | Kim et al. | |
| 6,528,187 B1 | 3/2003 | Okada | |
| 6,687,266 B1 | 2/2004 | Ma et al. | |
| 6,835,469 B2 | 12/2004 | Kwong et al. | |
| 6,921,915 B2 | 7/2005 | Takiguchi et al. | |
| 7,087,321 B2 | 8/2006 | Kwong et al. | |
| 7,090,928 B2 | 8/2006 | Thompson et al. | |
| 7,154,114 B2 | 12/2006 | Brooks et al. | |
| 7,250,226 B2 | 7/2007 | Tokito et al. | |
| 7,252,859 B2 | 8/2007 | Ng et al. | |

(Continued)

FOREIGN PATENT DOCUMENTS

| | | |
|---|---|---|
| EP | 0650955 | 5/1995 |
| EP | 1156536 | 11/2001 |

(Continued)

OTHER PUBLICATIONS

Gagnon et al. Organic Letters 2010, 12, 404-407. Year of publication: 2010.*
Adachi, Chihaya et al., "Organic Electroluminescent Device Having a Hole Conductor as an Emitting Layer," Appl. Phys. Lett., 55(15): 1489-1491 (1989).
Adachi, Chihaya et al., "Nearly 100% Internal Phosphorescence Efficiency in an Organic Light Emitting Device," J. Appl. Phys., 90(10): 5048-5051 (2001).
Adachi, Chihaya et al., "High-Efficiency Red Electrophosphorescence Devices," Appl. Phys. Lett., 78(11)1622-1624 (2001).
Aonuma, Masaki et al., "Material Design of Hole Transport Materials Capable of Thick-Film Formation in Organic Light Emitting Diodes," Appl. Phys. Lett., 90:183503-1-183503-3.

(Continued)

*Primary Examiner* — Andrew K Bohaty
(74) *Attorney, Agent, or Firm* — Duane Morris LLP

(57) ABSTRACT

A composition formed of a first mixture of a first compound and a second compound wherein the first compound has different chemical structure than the second compound; the first compound is capable of functioning as a hole transporting material in an organic light emitting device at room temperature; the first compound comprises at least one carbazole group; the first compound has a evaporation temperature T1 of 150 to 350° C.; the second compound has evaporation temperature T2 of 150 to 350° C.; the absolute value of T1−T2 is less than 20° C.; the first compound having a concentration C1 in said first mixture, and the first compound having a concentration C2 in a film formed by evaporating the first mixture in a vacuum deposition tool at a constant pressure between $1 \times 10^{-6}$ Torr to $1 \times 10^{-9}$ Torr, at a 2 Å/sec deposition rate on a surface positioned at a predefined distance away from the mixture being evaporated; and wherein the absolute value of (C1−C2)/C1 is less than 5%.

17 Claims, 3 Drawing Sheets

(56) References Cited

U.S. PATENT DOCUMENTS

| | | | |
|---|---|---|---|
| 7,279,704 B2 | 10/2007 | Walters et al. | |
| 7,332,232 B2 | 2/2008 | Ma et al. | |
| 7,338,722 B2 | 3/2008 | Thompson et al. | |
| 7,393,599 B2 | 7/2008 | Thompson et al. | |
| 7,396,598 B2 | 7/2008 | Takeuchi et al. | |
| 7,431,968 B1 | 10/2008 | Shtein et al. | |
| 7,445,855 B2 | 11/2008 | Mackenzie et al. | |
| 7,534,505 B2 | 5/2009 | Lin et al. | |
| 2002/0034656 A1 | 3/2002 | Thompson et al. | |
| 2002/0134984 A1 | 9/2002 | Igarashi | |
| 2002/0158242 A1 | 10/2002 | Son et al. | |
| 2003/0138657 A1 | 7/2003 | Li et al. | |
| 2003/0151042 A1 | 8/2003 | Hueschen | |
| 2003/0152802 A1 | 8/2003 | Tsuboyama et al. | |
| 2003/0175553 A1 | 9/2003 | Thompson et al. | |
| 2003/0230980 A1 | 12/2003 | Forrest et al. | |
| 2004/0036077 A1 | 2/2004 | Ise | |
| 2004/0137267 A1 | 7/2004 | Igarashi et al. | |
| 2004/0137268 A1 | 7/2004 | Igarashi et al. | |
| 2004/0174116 A1 | 9/2004 | Lu et al. | |
| 2005/0025993 A1 | 2/2005 | Thompson et al. | |
| 2005/0112407 A1 | 5/2005 | Ogasawara et al. | |
| 2005/0238919 A1 | 10/2005 | Ogasawara | |
| 2005/0244673 A1 | 11/2005 | Satoh et al. | |
| 2005/0260441 A1 | 11/2005 | Thompson et al. | |
| 2005/0260449 A1 | 11/2005 | Walters et al. | |
| 2006/0008670 A1 | 1/2006 | Lin et al. | |
| 2006/0202194 A1 | 9/2006 | Jeong et al. | |
| 2006/0232198 A1* | 10/2006 | Kawamura | C07C 211/54 313/504 |
| 2006/0240279 A1 | 10/2006 | Adamovich et al. | |
| 2006/0251923 A1 | 11/2006 | Lin et al. | |
| 2006/0263635 A1 | 11/2006 | Ise | |
| 2006/0280965 A1 | 12/2006 | Kwong et al. | |
| 2007/0190359 A1 | 8/2007 | Knowles et al. | |
| 2007/0247061 A1 | 10/2007 | Adamovich et al. | |
| 2007/0249148 A1 | 10/2007 | Werner et al. | |
| 2007/0278938 A1 | 12/2007 | Yabunouchi et al. | |
| 2008/0015355 A1 | 1/2008 | Schafer et al. | |
| 2008/0018221 A1 | 1/2008 | Egen et al. | |
| 2008/0106190 A1 | 5/2008 | Yabunouchi et al. | |
| 2008/0124572 A1 | 5/2008 | Mizuki et al. | |
| 2008/0220265 A1 | 9/2008 | Xia et al. | |
| 2008/0297033 A1 | 12/2008 | Knowles et al. | |
| 2009/0008605 A1 | 1/2009 | Kawamura et al. | |
| 2009/0009065 A1 | 1/2009 | Nishimura et al. | |
| 2009/0017330 A1 | 1/2009 | Iwakuma et al. | |
| 2009/0030202 A1 | 1/2009 | Iwakuma et al. | |
| 2009/0039776 A1 | 2/2009 | Yamada et al. | |
| 2009/0045730 A1 | 2/2009 | Nishimura et al. | |
| 2009/0045731 A1 | 2/2009 | Nishimura et al. | |
| 2009/0101870 A1 | 4/2009 | Prakash et al. | |
| 2009/0108737 A1 | 4/2009 | Kwong et al. | |
| 2009/0115316 A1 | 5/2009 | Zheng et al. | |
| 2009/0165846 A1 | 7/2009 | Johannes et al. | |
| 2009/0167162 A1 | 7/2009 | Lin et al. | |
| 2009/0179554 A1 | 7/2009 | Kuma et al. | |
| 2010/0187977 A1* | 7/2010 | Kai | C07D 487/04 313/504 |
| 2011/0254436 A1* | 10/2011 | Cheng | C07C 15/20 313/504 |
| 2012/0181511 A1 | 7/2012 | Ma et al. | |
| 2012/0241732 A1 | 9/2012 | Endo et al. | |
| 2012/0319146 A1 | 12/2012 | Adamovich et al. | |
| 2013/0112952 A1 | 5/2013 | Adamovich et al. | |
| 2013/0248849 A1 | 9/2013 | Feldman et al. | |
| 2013/0264561 A1 | 10/2013 | Dobbs et al. | |
| 2013/0313531 A1 | 11/2013 | Kaminaga et al. | |

FOREIGN PATENT DOCUMENTS

| | | | |
|---|---|---|---|
| EP | 1725079 | 11/2006 | |
| EP | 2034538 | 3/2009 | |
| EP | 2166592 | 3/2010 | |
| JP | 200511610 | 1/2005 | |
| JP | 2007123392 | 5/2007 | |
| JP | 2007254297 | 10/2007 | |
| JP | 2008074939 | 4/2008 | |
| JP | 2012056880 | 3/2012 | |
| JP | WO 2012056919 A1 * | 5/2012 | ............ C07C 13/72 |
| WO | 99/53724 | 10/1999 | |
| WO | 0139234 | 5/2001 | |
| WO | 0202714 | 1/2002 | |
| WO | 0215645 | 2/2002 | |
| WO | 03040257 | 5/2003 | |
| WO | 03060956 | 7/2003 | |
| WO | 2004/070787 | 8/2004 | |
| WO | 2004093207 | 10/2004 | |
| WO | 2004107822 | 12/2004 | |
| WO | 2005014551 | 2/2005 | |
| WO | 2005019373 | 3/2005 | |
| WO | 2005030900 | 4/2005 | |
| WO | 2005089025 | 9/2005 | |
| WO | 2005123873 | 12/2005 | |
| WO | 2006009024 | 1/2006 | |
| WO | 2006056418 | 6/2006 | |
| WO | 2006072002 | 7/2006 | |
| WO | 2006082742 | 8/2006 | |
| WO | 2006098120 | 9/2006 | |
| WO | 2006100298 | 9/2006 | |
| WO | 2006103874 | 10/2006 | |
| WO | 2006114966 | 11/2006 | |
| WO | 2006132173 | 12/2006 | |
| WO | 2007002683 | 1/2007 | |
| WO | 2007004380 | 1/2007 | |
| WO | 2007063754 | 6/2007 | |
| WO | 2007063796 | 6/2007 | |
| WO | 2008056746 | 5/2008 | |
| WO | 2008101842 | 8/2008 | |
| WO | 2008132085 | 11/2008 | |
| WO | 2009000673 | 12/2008 | |
| WO | 2009003898 | 1/2009 | |
| WO | 2009008311 | 1/2009 | |
| WO | 2009018009 | 2/2009 | |
| WO | 2009/030981 | 3/2009 | |
| WO | 2009050290 | 4/2009 | |
| WO | 2009021126 | 5/2009 | |
| WO | 2009062578 | 5/2009 | |
| WO | 2009063833 | 5/2009 | |
| WO | 2009066778 | 5/2009 | |
| WO | 2009066779 | 5/2009 | |
| WO | 2009086028 | 7/2009 | |
| WO | 2009100991 | 8/2009 | |
| WO | 2010107244 | 9/2010 | |
| WO | 2011013843 | 2/2011 | |
| WO | 2011081423 | 7/2011 | |
| WO | 2011136755 | 11/2011 | |
| WO | 2012005363 | 1/2012 | |
| WO | 2012165844 | 12/2012 | |

OTHER PUBLICATIONS

Baldo et al., Highly Efficient Phosphorescent Emission from Organic Electroluminescent Devices, Nature, vol. 395, 151-154, (1998).

Baldo et al., Very high-efficiency green organic light-emitting devices based on electrophosphorescence, Appl. Phys. Lett., vol. 75, No. 3, 4-6 (1999).

Gao, Zhiqiang et al., "Bright-Blue Electroluminescence From a Silyl-Substituted ter-(phenylene-vinylene) derivative," Appl. Phys. Lett., 74(6): 865-867 (1999).

Guo, Tzung-Fang et al., "Highly Efficient Electrophosphorescent Polymer Light-Emitting Devices," Organic Electronics, 115-20 (2000).

Hamada, Yuji et al., "High Luminance in Organic Electroluminescent Devices with Bis(10-hydroxybenzo[h]quinolinato) beryllium as an Emitter, " Chem. Lett., 905-906 (1993).

Holmes, R.J. et al., "Blue Organic Electrophosphorescence Using Exothermic Host-Guest Energy Transfer," Appl. Phys. Lett., 82(15):2422-2424 (2003).

Hu, Nan-Xing et al., "Novel High Tg Hole-Transport Molecules Based on Indolo[3,2-b]carbazoles for Organic Light-Emitting Devices," Synthetic Metals, 111-112:421-424 (2000).

(56) References Cited

OTHER PUBLICATIONS

Huang, Jinsong et al., "Highly Efficient Red-Emission Polymer Phosphorescent Light-Emitting Diodes Based on Two Novel Tris(1-phenylisoquinolinato-C2,N)iridium(III) Derivates," Adv. Mater, 19:739-743 (2007).
Huang, Wei-Sheng et al., "Highly Phosphorescent Bis-Cyclometalated Iridium Complexes Containing Benzoimidazole-Based Ligands," Chem. Mater., 16(12):2480-2488 (2004).
Hung, L.S. et al., "Anode Modification in Organic Light-Emitting Diodes by Low-Frequency Plasma Polymerization of CHF3," Appl. Phys. Lett., 78(5):673-675 (2001).
Ikai, Masamichi and Tokito, Shizuo, "Highly Efficient Phosphorescence From Organic Light-Emitting Devices with an Exciton-Block Layer," Appl. Phys. Lett., 79(2):156-158 (2001).
Ikeda, Hisao et al., "P-185 Low-Drive-Voltage OLEDs with a Buffer Layer Having Molybdenum Oxide," SID Symposium Digest, 37:923-926 (2006).
Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993).
Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).
Kido, Junji et al., 1,2,4-Triazole Derivative as an Electron Transport Layer in Organic Electroluminescent Devices, Jpn. J. Appl. Phys., 32:L917-L920 (1993).
Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino) triphenylamine (m-MTDATA), as Hole-Transport Materials," Adv. Mater., 6(9):677-679 (1994).
Kwong, Raymond C. et al., "High Operational Stability of Electrophosphorescent Devices," Appl. Phys. Lett., 81(1)162-164 (2002).
Lamansky, Sergey et al., "Synthesis and Characterization of Phosphorescent Cyclometalated Iridium Complexes," Inorg. Chem., 40(7):1704-1711 (2001).
Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).
Lo, Shih-Chun et al., "Blue Phosphorescence from Iridium(III) Complexes at Room Temperature," Chem. Mater., 18(21)5119-5129 (2006).
Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).
Mi, Bao-Xiu et al., "Thermally Stable Hole-Transporting Material for Organic Light-Emitting Diode an Isoindole Derivative," Chem. Mater., 15(16):3148-3151 (2003).
Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4): 592-593 (2005).
Niu, Yu-Hua et al., "Highly Efficient Electrophosphorescent Devices with Saturated Red Emission from a Neutral Osmium Complex," Chem. Mater., 17(13):3532-3536 (2005).
Noda, Tetsuya and Shirota,Yasuhiko, "5,5'-Bis(dimesitylboryl)-2,2'-bithiophene and 5,5"-Bis (dimesitylboryl)-2,2'5',2"-terthiophene as a Novel Family of Electron-Transporting Amorphous Molecular Materials," J. Am. Chem. Soc., 120 (37):9714-9715 (1998).
Okumoto, Kenji et al., "Green Fluorescent Organic Light-Emitting Device with External Quantum Efficiency of Nearly 10%," Appl. Phys. Lett., 89:063504-1-063504-3 (2006).
Palilis, Leonidas C., "High Efficiency Molecular Organic Light-Emitting Diodes Based on Silole Derivatives and Their Exciplexes," Organic Electronics, 4:113-121 (2003).
Paulose, Betty Marie Jennifer S. et al., "First Examples of Alkenyl Pyridines as Organic Ligands for Phosphorescent Iridium Complexes," Adv. Mater., 16(22):2003-2007 (2004).
Ranjan, Sudhir et al., "Realizing Green Phosphorescent Light-Emitting Materials from Rhenium(I) Pyrazolato Diimine Complexes," Inorg. Chem., 42(4):1248-1255 (2003).
Sakamoto, Youichi et al., "Synthesis, Characterization, and Electron-Transport Property of Perfluorinated Phenylene Dendrimers," J. Am. Chem. Soc., 122(8):1832-1833 (2000).
Salbeck, J. et al., "Low Molecular Organic Glasses for Blue Electroluminescence," Synthetic Metals, 91209-215 (1997).
Shirota, Yasuhiko et al., "Starburst Molecules Based on p-Electron Systems as Materials for Organic Electroluminescent Devices," Journal of Luminescence, 72-74:985-991 (1997).
Sotoyama, Wataru et al., "Efficient Organic Light-Emitting Diodes with Phosphorescent Platinum Complexes Containing NcN-Coordinating Tridentate Ligand," Appl. Phys. Lett., 86:153505-1-153505-3 (2005).
Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).
T. Östergård et al., "Langmuir-Blodgett Light-Emitting Diodes of Poly(3-Hexylthiophene) Electro-Optical Characteristics Related to Structure," Synthetic Metals, 87:171-177 (1997).
Takizawa, Shin-ya et al., "Phosphorescent Iridium Complexes Based on 2-Phenylimidazo[1,2-α]pyridine Ligands Tuning of Emission Color toward the Blue Region and Application to Polymer Light-Emitting Devices," Inorg. Chem., 46(10):4308-4319 (2007).
Tang, C.W. and VanSlyke, S.A., "Organic Electroluminescent Diodes," Appl. Phys. Lett., 51(12):913-915 (1987).
Tung, Yung-Liang et al., "Organic Light-Emitting Diodes Based on Charge-Neutral Ru II PHosphorescent Emitters," Adv. Mater., 17(8)1059-1064 (2005).
Van Slyke, S. A. et al., "Organic Electroluminescent Devices with Improved Stability," Appl. Phys. Lett., 69(15):2160-2162 (1996).
Wang, Y. et al., "Highly Efficient Electroluminescent Materials Based on Fluorinated Organometallic Iridium Compounds," Appl. Phys. Lett., 79(4):449-451 (2001).
Wong, Keith Man-Chung et al., A Novel Class of Phosphorescent Gold(III) Alkynyl-Based Organic Light-Emitting Devices with Tunable Colour, Chem. Commun., 2906-2908 (2005).
Wong, Wai-Yeung, "Multifunctional Iridium Complexes Based on Carbazole Modules as Highly Efficient Electrophosphors," Angew. Chem. Int. Ed., 45:7800-7803 (2006).
Chang, Mei-Ying et al., "High-Brightness White Organic Light-Emitting Diodes Featuring a Single Emission Layer," Journal of the Electrochemical Society (2009), 156(1), J1-J5.
Wang, D. et al., "Broad wavelength modulating and design of organic white diode based on lighting by using exciplex emission from mixed acceptors," Applied Physics Letters (2006), 89(23), 233511/1-233511/3.
Adamovich, Adam et al., "High-efficiency single dopant white electrophosphorescent light-emitting diodes," New Journal of Chemistry (2002), 26(9), 1171-1178.
Coya, Carmen et al., "White emission from a single-component single-layer solution processed OLED," SPIE (2009), 7415(Organic Light Emitting Materials and Devices XIII), 74151P/1-74151P/12.
Jou, Jwo-Huei et al., "Efficient, color-stable fluorescent white organic light-emitting diodes with single emission layer by vapor deposition from solvent premixed deposition source," Applied Physics Letters (2006), 88(19), 193501/1-193501/3.
Jou, Jwo-Huei et al., "Efficient pure-white organic light-emitting diodes with a solution-processed, binary-host employing single emission layer," Applied Physics Letters (2006), 88(14), 141101/1-141101/3.
Yang, J.P. et al., "White light emission from a single layer organic light emitting diode fabricated by spincoating," Chemical Physics Letters 325 (2000) 251-256.
Extended European Search Report dated Mar. 3, 2015 for corresponding EP Patent Application No. 14189545.8.

* cited by examiner

Compound 2

Compound E2

ORGANIC ELECTROLUMINESCENT MATERIALS AND DEVICES

CROSS-REFERENCE TO RELATED APPLICATIONS

This application claims priority under 35 U.S.C. §119(e) to U.S. Provisional Applications No. 61/940,603, filed on Feb. 17, 2014, No. 61/920,544, filed on Dec. 24, 2013, No. 61/894,160, filed on Oct. 22, 2013, No. 61/874,444, filed on Sep. 6, 2013, and No. 61/867,858, filed on Aug. 20, 2013, the entire contents of which are incorporated herein by reference.

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices (OLEDs), and more specifically to organic materials used in such devices. More specifically, the present invention relates to novel premixed host systems for phosphorescent organic light emitting devices (PHOLEDs).

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

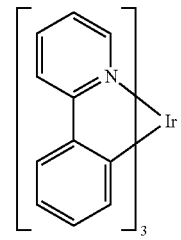

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

The present disclosure provides a novel host composition comprising a mixture of a first compound and a second compound that is a stable co-evaporation mixture. In the mixture, the first compound has different chemical structure than the second compound. The first compound is capable of functioning as a hole transporting material in an organic light emitting device at room temperature. Hole transporting material normally has a HOMO level between −5.0 and −6.0 eV. The first compound comprises at least one carbazole group, and can have an evaporation temperature T1 of 150 to 350° C. The second compound can have a evaporation temperature T2 of 150 to 350° C. In order to form the inventive composition comprising a mixture of a first compound and a second compound, the absolute value of T1−T2, the difference between T1 and T2, should be less than 20° C.

According to an embodiment of the present disclosure, a first device comprising a phosphorescent organic light-emitting device incorporating the novel host composition is disclosed. The phosphorescent organic light-emitting device comprises: an anode; a cathode; and an organic layer, disposed between the anode and the cathode, comprising a first organic composition comprising a mixture of a first compound and a second compound, wherein the first compound has different chemical structure than the second compound;
  wherein the first compound is capable of functioning as a hole transporting material in an organic light emitting device at room temperature;
  wherein the first compound comprises at least one carbazole group;
  wherein the first compound has evaporation temperature of T1 of 150 to 350° C.;
  wherein the second compound has evaporation temperature of T2 of 150 to 350° C.;
  wherein the absolute value of T1−T2 is less than 20° C.;
  wherein the first compound has a concentration C1 in said mixture, and the first compound has a concentration C2 in a film formed by evaporating the mixture in a vacuum deposition tool at a constant pressure between $1 \times 10^{-6}$ Torr to $1 \times 10^{-9}$ Torr, at a 2 Å/sec deposition rate on a surface positioned at a predefined distance away from the mixture being evaporated; and wherein the absolute value of (C1−C2)/C1 is less than 5%.

According to an embodiment of the present disclosure, a method of fabricating an organic light emitting device comprising a first electrode, a second electrode, and a first organic layer disposed between the first electrode and the second electrode, wherein the first organic layer comprises a first organic composition further comprising a mixture of a first compound and a second compound, is disclosed. The method comprises:
  providing a substrate having the first electrode disposed thereon;
  depositing the first organic composition over the first electrode; and
  depositing the second electrode over the first organic layer, wherein the first compound has different chemical structure than the second compound;
    wherein the first compound is capable of functioning as a hole transporting material in an organic light emitting device at room temperature;
    wherein the first compound comprises at least one carbazole group;
    wherein the first compound has evaporation temperature T1 of 150 to 350° C.;
    wherein the second compound has evaporation temperature T2 of 150 to 350° C.;
    wherein the absolute value of T1−T2 is less than 20° C.;
    wherein the first compound has a concentration C1 in said mixture, and the first compound has a concentration C2 in a film formed by evaporating the mixture in a vacuum deposition tool at a constant pressure between $1 \times 10^{-6}$ Torr to $1 \times 10^{-9}$ Torr, at a 2 Å/sec deposition rate on a surface positioned at a predefined distance away from the mixture being evaporated; and wherein the absolute value of (C1−C2)/C1 is less than 5%.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75. No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
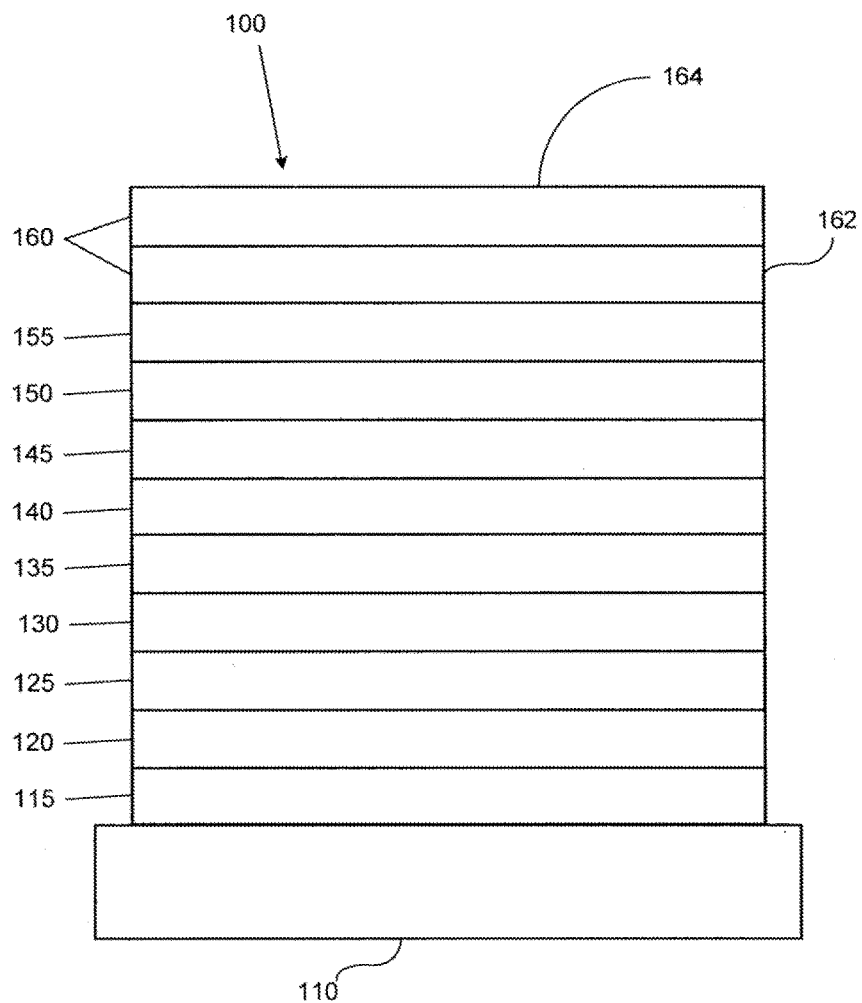
FIG. 1 shows an organic light emitting device that can incorporate the inventive host material disclosed herein.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
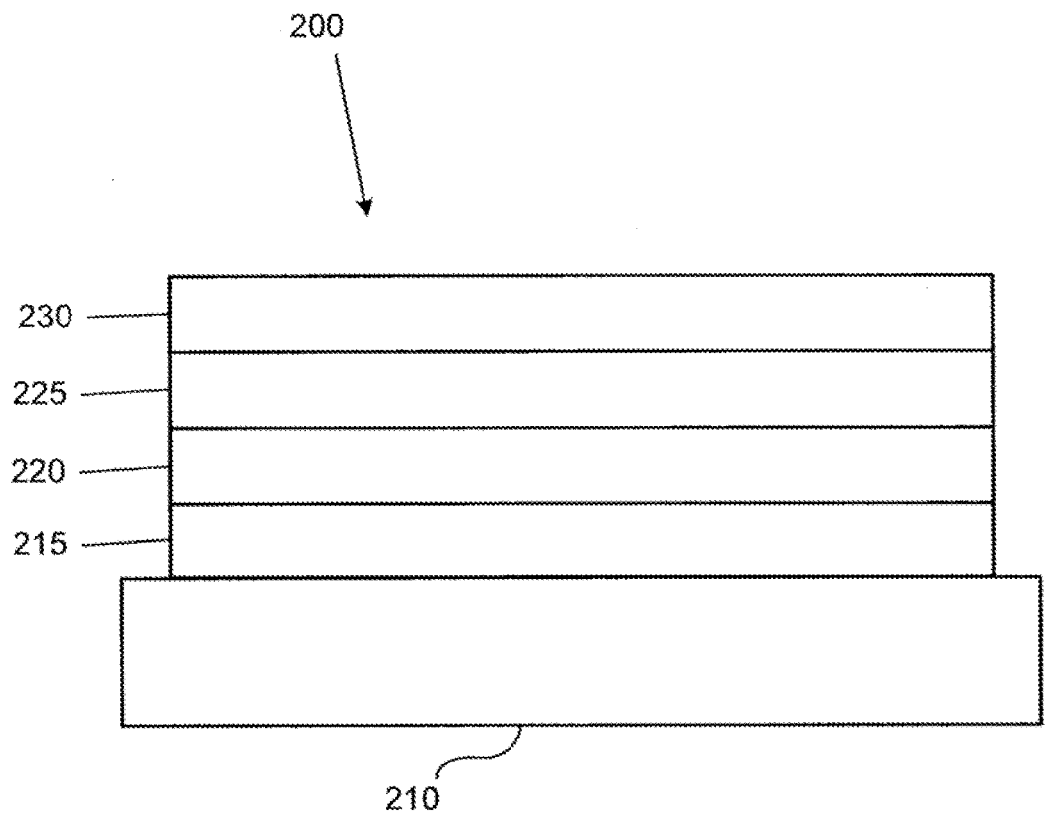
FIG. 2 shows an inverted organic light emitting device that can incorporate the inventive host material disclosed herein.
Figure 3:
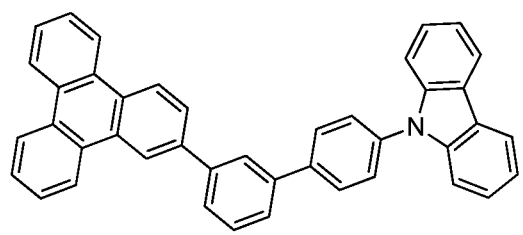
FIG. 3 shows Compounds 2 and E2 representing the first and second compounds which are example components of the novel organic host composition disclosed herein.
Figure 3:
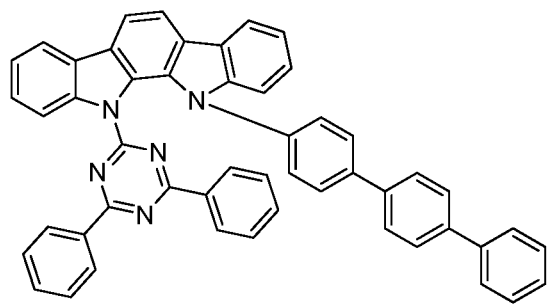

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention may be incorporated into a wide variety of consumer products, including flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The term "halo" or "halogen" as used herein includes fluorine, chlorine, bromine, and iodine.

The term "alkyl" as used herein contemplates both straight and branched chain alkyl radicals. Preferred alkyl groups are those containing from one to fifteen carbon atoms and includes methyl, ethyl, propyl, isopropyl, butyl, isobutyl, tert-butyl, and the like. Additionally, the alkyl group may be optionally substituted.

The term "cycloalkyl" as used herein contemplates cyclic alkyl radicals. Preferred cycloalkyl groups are those containing 3 to 7 carbon atoms and includes cyclopropyl, cyclopentyl, cyclohexyl, and the like. Additionally, the cycloalkyl group may be optionally substituted.

The term "alkenyl" as used herein contemplates both straight and branched chain alkene radicals. Preferred alkenyl groups are those containing two to fifteen carbon atoms. Additionally, the alkenyl group may be optionally substituted.

The term "alkynyl" as used herein contemplates both straight and branched chain alkyne radicals. Preferred alkynyl groups are those containing two to fifteen carbon atoms. Additionally, the alkynyl group may be optionally substituted.

The terms "aralkyl" or "arylalkyl" as used herein are used interchangeably and contemplate an alkyl group that has as a substituent an aromatic group. Additionally, the aralkyl group may be optionally substituted.

The term "heterocyclic group" as used herein contemplates aromatic and non-aromatic cyclic radicals. Heteroaromatic cyclic radicals also refer to heteroaryl. Preferred hetero-non-aromatic cyclic groups are those containing 3 or 7 ring atoms which includes at least one hetero atom, and includes cyclic amines such as morpholino, piperdino, pyrrolidino, and the like, and cyclic ethers, such as tetrahydrofuran, tetrahydropyran, and the like. Additionally, the heterocyclic group may be optionally substituted.

The term "aryl" or "aromatic group" as used herein contemplates single-ring groups and polycyclic ring systems. The polycyclic rings may have two or more rings in which two carbons are common to two adjoining rings (the rings are "fused") wherein at least one of the rings is aromatic, e.g., the other rings can be cycloalkyls, cycloalkenyls, aryl, heterocycles, and/or heteroaryls. Additionally, the aryl group may be optionally substituted.

The term "heteroaryl" as used herein contemplates single-ring hetero-aromatic groups that may include from one to three heteroatoms, for example, pyrrole, furan, thiophene, imidazole, oxazole, thiazole, triazole, pyrazole, pyridine, pyrazine and pyrimidine, and the like. The term heteroaryl also includes polycyclic hetero-aromatic systems having two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. Additionally, the heteroaryl group may be optionally substituted.

The alkyl, cycloalkyl, alkenyl, alkynyl, aralkyl, heterocyclic group, aryl, and heteroaryl may be optionally substituted with one or more substituents selected from the group consisting of hydrogen, deuterium, halogen, alkyl, cycloalkyl, heteroalkyl, arylalkyl, alkoxy, aryloxy, amino, cyclic amino, silyl, alkenyl, cycloalkenyl, heteroalkenyl, alkynyl, aryl, heteroaryl, acyl, carbonyl, carboxylic acid, ether, ester, nitrile, isonitrile, sulfanyl, sulfinyl, sulfonyl, phosphino, and combinations thereof.

As used herein, "substituted" indicates that a substituent other than H is bonded to the relevant position, such as carbon. Thus, for example, where $R^1$ is mono-substituted, then one $R^1$ must be other than H. Similarly, where $R^1$ is di-substituted, then two of $R^1$ must be other than H. Similarly, where $R^1$ is unsubstituted, $R^1$ is hydrogen for all available positions.

The "aza" designation in the fragments described herein, i.e. aza-dibenzofuran, aza-dibenzothiophene, etc. means that one or more of the C—H groups in the respective fragment can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

It is to be understood that when a molecular fragment is described as being a substituent or otherwise attached to another moiety, its name may be written as if it were a fragment (e.g. naphthyl, dibenzofuryl) or as if it were the whole molecule (e.g. naphthalene, dibenzofuran). As used herein, these different ways of designating a substituent or attached fragment are considered to be equivalent.

Often, the emissive layer (EML) of OLED devices exhibiting good lifetime and efficiency requires more than two components (e.g. 3 or 4 components). For this purpose, 3 or 4 source materials are required to fabricate such an EML, which is very complicated and costly compared to a standard two-component EML with a single host and an emitter, which requires only two sources. Premixing two or more materials and evaporating them from one source can reduce the complexity of the fabrication process. Selected hole transporting hosts and another type of hosts, such as electron transporting hosts can be mixed and co-evaporated from one crucible and achieve stable evaporation.

However, the co-evaporation must be stable, i.e. the composition of the evaporated film should remain constant during the manufacturing process. Any composition change may affect the device performance adversely. In order to obtain a stable co-evaporation from a mixture of compounds under vacuum, one would assume that the materials must have the same evaporation temperature under the same condition. However, this may not be the only parameter one has to consider. When the two compounds are mixed together, they may interact with each other and their evaporation properties may differ from their individual properties. On the other hand, materials with slightly different evaporation temperatures may form a stable co-evaporation mixture. Therefore, it is extremely difficult to achieve a stable co-evaporation mixture. So far, there have been very few stable co-evaporation mixture examples despite that there have been tens of thousands of hosts materials available in the literature. "Evaporation temperature" of a material is measured in a vacuum deposition tool at a constant pressure, between $1\times10^{-6}$ Torr to $1\times10^{-9}$ Torr, at a 2 Å/sec deposition rate on a surface positioned at a set distance away from the evaporation source of the material being evaporated, e.g. sublimation crucible in a VTE tool. The various measured values such as temperature, pressure, deposition rate, etc. disclosed herein are expected to have nominal variations because of the expected tolerances in the measurements that produced these quantitative values as understood by one of ordinary skill in the art.

This disclosure describes the new class of hole transporting and electron transporting hosts which can be premixed to provide a stable co-evaporation mixture that is useful as a host material for green phosphorescent emitters. Many factors other than temperatures can contribute to the evaporation, such as miscibility of different materials, different phase transition. The inventors found that when two materials have similar evaporation temperature, and similar mass loss rate or similar vapor pressure, the two materials can co-evaporate consistently. Mass loss rate is defined as percentage of mass lost over time (minute) and is determined by measuring the time it takes to lose the first 10% of the mass as measured by thermal gravity analysis (TGA) under same experimental condition at a same constant given temperature for each compound after the composition reach a steady evaporation state. The constant given temperature is one temperature point that is chosen so that the value of mass loss rate is between about 0.05 to 0.50 percentage/min. Skilled person in this field should appreciate that in order to compare two parameters, the experimental condition should be consistent. The method of measuring mass loss rate and vapor pressure is well known in the art and can be found, for example, in Bull. et al. Mater. Sci. 2011, 34, 7.

Current state of the art green phosphorescent host materials consist of two components: a hole transporting cohost (h-host) and an electron transporting cohost (e-host). Some examples of such green phosphorescent host materials are disclosed for example in U.S. Pat. No. 6,803,720. In order to fabricate EML of a PHOLED with such host material, three evaporation sources are required: one for h-host, another one for c-host, and a third one for the emitter. The concentration of the cohost and the emitter is critical for the device performance and typically, the rate of deposition of each component is measured individually during the deposition. This makes the fabrication process complicated and costly. Thus, it is desired to mix at least two of the components to reduce the number of sources.

The host compounds Compound 2 and Compound E2 show stable premixability, which means they can be premixed and codeposited from one source without changing the composition. Uniform co-evaporation of the two hosts is critical for the consistency of the devices performance fabricated from this mixture.

The premixability of these two compounds was tested by high pressure liquid chromatography (HPLC) analysis of evaporated films. For this purpose, the 0.15 g of Compound 2 and 0.15 g of Compound E2 were mixed and ground. 0.3 g of the mixture was loaded into the evaporation source of the VTE vacuum chamber. The chamber was pumped down to $10^{-7}$ Torr pressure. The premixed components were deposited at the rate of 2 Å/s onto glass substrates. The substrates were replaced continuously after deposition of 600 Å film without stopping the deposition process so that the source is maintained at proper temperature and avoid cooling the source. The deposited films were analyzed by HPLC and results are shown in Table 1 below. Seven such substrate samples were taken and are labeled as Plate1 to Plate7 in Table 1. The composition of the components Compound 2 and Compound E2 did not change significantly from Plate1 to Plate7. Some fluctuations in the concentrations do not reveal any trend and can be explained by the accuracy of sample collection and HPLC analysis. Normally, the change of the concentration before and after depositions within 5% throughout the process is considered to be good and useful for commercial OLED application.

TABLE 1

HPLC composition (%) of sequentially deposited films from premixed hosts, (h-host:e-host), with ratio 1:1. (HPLC Conditions C18, 100 45 min, Detected wavelength 254 nm)

| Films (600 Å) | Compound 2 (h-host) | Compound E2 (e-host) |
|---|---|---|
| Plate1 | 54.1 | 45.9 |
| Plate2 | 57.3 | 42.7 |
| Plate3 | 56.9 | 43.1 |
| Plate4 | 56.7 | 43.3 |
| Plate5 | 56.4 | 43.6 |

TABLE 1-continued

HPLC composition (%) of sequentially deposited films from premixed hosts, (h-host:e-host), with ratio 1:1. (HPLC Conditions C18, 100 45 min, Detected wavelength 254 nm)

| Films (600 Å) | Compound 2 (h-host) | Compound E2 (e-host) |
|---|---|---|
| Plate6 | 56.1 | 43.9 |
| Plate7 | 54.6 | 45.4 |

This is evidence that Compound 2 and Compound E2 form a stable co-evaporation mixture. Inventors conclude that other hosts from these families can be premixed to be used as hosts for PHOLEDs. Table 2 below shows some representative examples which the inventors believe are suitable for pre-mixing and evaporation from a common source based on the compounds' evaporation temperature and their similar chemical structures.

TABLE 2

Examples of possible premix pairs.

| Mixture number | Hole transporting host | Electron transporting host |
|---|---|---|
| 1 | Compound 2 | Compound E2 |
| 2 | Compound 3 | Compound E4 |
| 3 | Compound 1 | Compound E5 |
| 4 | Compound 6 | Compound E7 |
| 5 | Compound 7 | Compound E7 |
| 6 | Compound 9 | Compound E8 |
| 7 | Compound 17 | Compound E8 |
| 8 | Compound 15 | Compound E18 |

HOMO and LUMO levels of selected compounds for the possible premix pairs are listed in Table 3 below. The HOMO/LUMO levels were obtained through differential pulse voltammetry in DMF solutions at a concentration of $10^{-3}$ M, with 0.1 M tetrabutylammonium hexafluorophosphate as the supporting electrolyte. A glass carbon disk, a platinum wire and a silver wire are used as the working, counter and pseudo reference electrodes, respectively. Ferrocene is added into the solution to serve as the internal standard for each measurement. The resultant oxidation potential ($E_{ox}$) and reduction potential ($E_{red}$), adjusted to ferrocene, are used to calculate the HOMO/LUMO levels as $-4.8$ eV$-qE_{ox}$ and $-4.8$ eV$-qE_{red}$, respectively, where q is the electron charge.

TABLE 3

HOMO and LUMO levels of selected compounds for premix pairs.

| Compound | HOMO (eV) | LUMO (eV) |
|---|---|---|
| Compound 1 | −5.7 | −2.1 |
| Compound 2 | −5.7 | −2.1 |
| Compound E2 | −5.6 | −2.7 |
| Compound E69 | −5.6 | −2.7 |

Having HOMO and LUMO levels at −5.7 eV and −2.1 eV, respectively, both Compounds 1 and 2 are considered as hole-transporting hosts. On the other hand, Compounds E2 and E69 have deep LUMO levels at −2.7 eV and are used as electron-transporting hosts.

Structures of the Host Compounds:

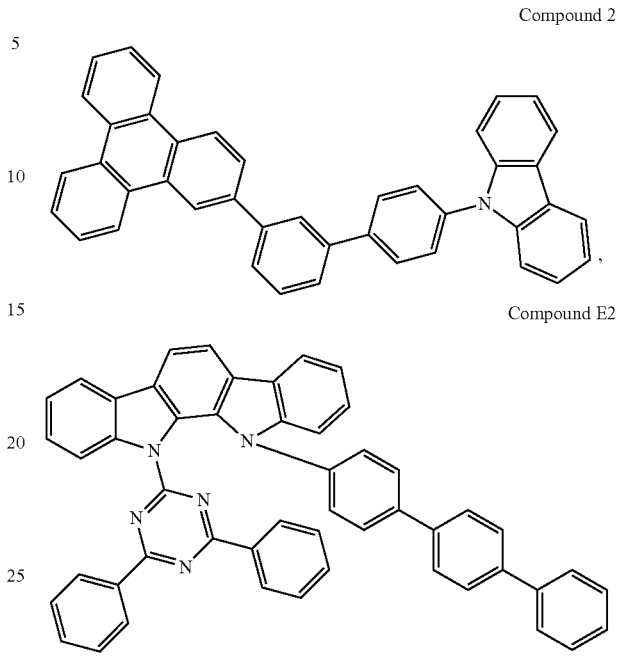

According to an embodiment of the present disclosure, a novel host composition comprising a mixture of a first compound and a second compound that is a stable co-evaporation mixture is disclosed. In the mixture, the first compound has different chemical structure than the second compound. The first compound is capable of functioning as a hole transporting material in an organic light emitting device at room temperature. The first compound can have a HOMO level between −5.0 and −6.0 eV. The first compound comprises at least one carbazole group, and can have a evaporation temperature T1 of 150 to 350° C. The second compound can have a evaporation temperature T2 of 150 to 350° C. In order to form the inventive composition comprising a mixture of a first compound and a second compound, the absolute value of T1−T2, the difference between T1 and T2, should be less than 20° C. Preferably, the absolute value of T1−T2 is less than 10° C. and more preferably less than 5° C.

The first compound has a concentration C1 in the mixture, and the first compound has a concentration C2 in a film formed by evaporating the mixture in a vacuum deposition tool, such as a VTE tool, at a constant pressure between $1 \times 10^{-6}$ Torr to $1 \times 10^{-9}$ Torr, at a 2 Å/sec deposition rate on a surface positioned at a predefined distance away from the evaporation source of the mixture being evaporated; and wherein the absolute value of (C1−C2)/C1 is less than 5%. The concentrations C1 and C2 are relative concentrations of the first compound. Therefore, the conditional requirement for the two compounds forming the mixture described above means that the relative concentration of the first compound in the as-deposited film (C2) should be as close to the original relative concentration of the first compound (C1) in the evaporation source mixture. One of ordinary skill in this field should realize that the concentration of each component is expressed as a relative percentage. The concentration of each component in the mixture can be measured by a suitable analytical methods such as high pressure liquid chromatography (HPLC) and nuclear magnetic resonance spectroscopy (NMR).

The inventors used HPLC and the percentage was calculated by deviding the integration area under the HPLC trace of each component by the total integration area. HPLC can use different detectors such as UV-vis, photo diode array detector, refractive index detector, fluorescence detector, and light scattering detector. Due to different materials properties, each component in the mixture may respond differently. Therefore, the measured concentration may differ from their real concentration in the mixture, however the relative ratio value of (C1−C2)/C1 is independent of these variables as long as the experimental condition is kept consistent, for example, all concentrations should be calculated under the exact same HPLC parameters for each component. It is sometimes preferred to select a measurement condition that gives calculated concentration close to the real concentration. However, it is not necessary. It is important to select a detecting condition that accurately detects each component. For example, fluorescence detector should not be used if one of the components does not fluoresce.

In another embodiment of the host composition, the first compound has a evaporation temperature T1 of 200 to 350° C. and the second compound has a evaporation temperature T2 of 200 to 350° C. Preferably, the absolute value of (C1−C2)/C1 is less than 3%.

In one embodiment of the host composition, the first compound has a vapor pressure of P1 at T1, the second compound has vapor pressure of P2 at T2, and the ratio of P1/P2 is within the range of 0.90 to 1.10.

The first compound has a first mass loss rate and the second compound has a second mass loss rate, wherein the ratio between the first mass loss rate and the second mass loss rate is within the range of 0.90 to 1.10, including the endpoints. In one embodiment, the ratio between the first mass loss rate and the second mass loss rate is within the range of 0.95 to 1.05, including the endpoints. Preferably, the ratio between the first mass loss rate and the second mass loss rate is within the range of 0.97 to 1.03, including the endpoints.

According to an embodiment of the host composition, the first compound comprises at least one of the chemical groups selected from the group consisting of triphenylene, dibenzothiophene, dibenzofuran, and dibenzoselenophene.

The second compound is capable of functioning as an electron transporting material in an organic light emitting device at room temperature. The second compound can have a LUMO level between −2.3 and −3.3 eV. The second compound comprises at least one of the chemical groups selected from the group consisting of aza-triphenylene, aza-carbazole, aza-dibenzothiophene, aza-dibenzofuran, aza-dibenzoselenophene, and non-fused N-containing six-member aromatic rings.

In one embodiment, the first compound has HOMO energy level higher than −5.7 eV. In another embodiment, the first compound has HOMO energy level higher than −5.5 eV. Preferably, the first compound has HOMO energy level higher than −5.8 eV.

Preferably, the first compound and the second compound each has a purity in excess of 99% as determined by high pressure liquid chromatography.

According to one embodiment, the novel composition can further comprise a third compound. The third compound has a different chemical structure than the first compound and the second compound, wherein the third compound has an evaporation temperature T3 of 150 to 350° C.; and wherein the absolute value of T1−T3 is less than 20° C.

According to one embodiment, the composition is in liquid form at a temperature lower than T1 and T2. In other words, where T1 and T2 are not equal, the composition is in liquid form at at temperature lower than the lower of T1 and T2.

In one embodiment of the host composition, the first compound has the formula (I):

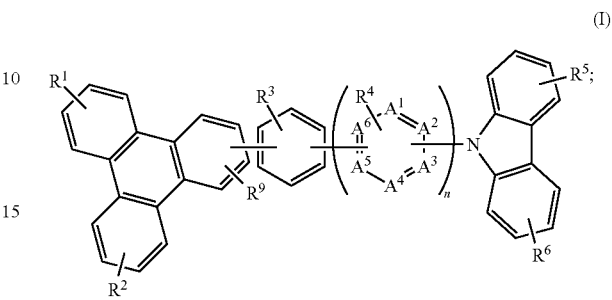

wherein
$R^1$, $R^2$, $R^3$, $R^4$, $R^5$, and $R^6$ each represent mono, di, tri, tetra substitutions, or no substitution;
$R^9$ represents mono, di, tri substitutions, or no substitution;
$R^1$, $R^2$, $R^3$, $R^4$, $R^5$, $R^6$, and $R^9$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof;
$A^1$, $A^2$, $A^3$, $A^4$, $A^5$, and $A^6$ are each independently selected from N or C; and
n is an integer from 1 to 20;
wherein the second compound has the formula (II):

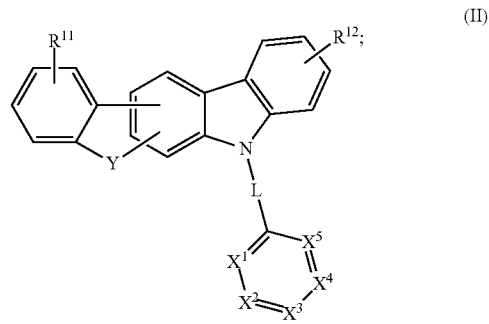

wherein
$R^{11}$ and $R^{12}$ each represent mono, di, tri, tetra substitutions, or no substitution;
Y is selected from the group consisting of O, S, Se, NR', and CR"R'";
L is a single bond or comprises an aryl or heteroaryl group having from 5-24 carbon atoms, which is optionally further substituted;
$X^1$, $X^2$, $X^3$, $X^4$, and $X^5$ are each independently selected from group consisting of CR and N;
at least one of $X^1$, $X^2$, $X^3$, $X^4$, and $X^5$ is N; and
R, R', R", and R'" are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof.

In one embodiment, in the formula (II) for the second compound, $X^1$, $X^3$, and $X^5$ are N; and $X^2$ and $X^4$ are CR.
According to an embodiment of the host composition, the first compound has the formula selected from the group consisting of:
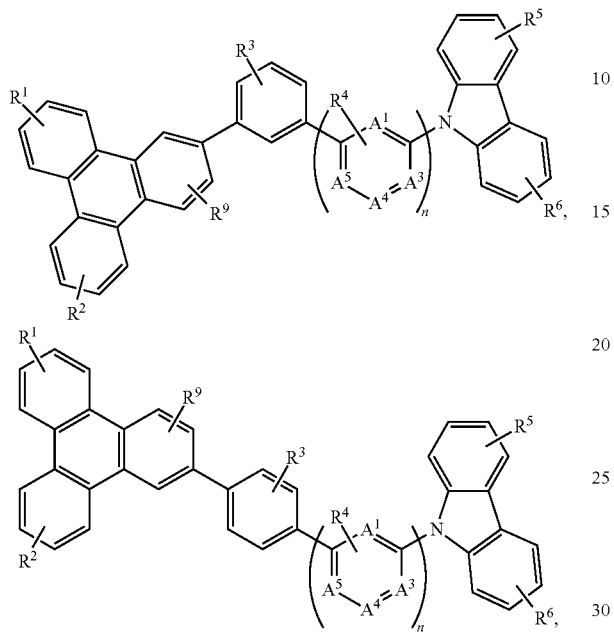
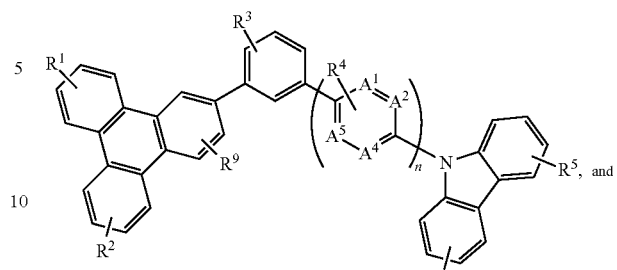
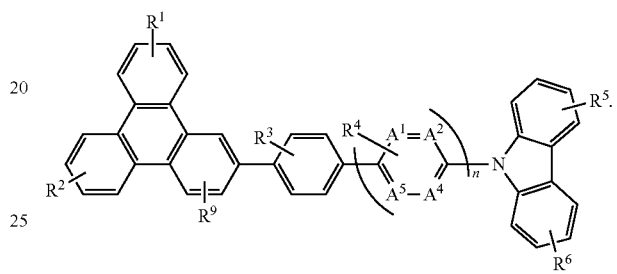
In another embodiment of the host composition, the first compound has the formula selected from the group consisting of:
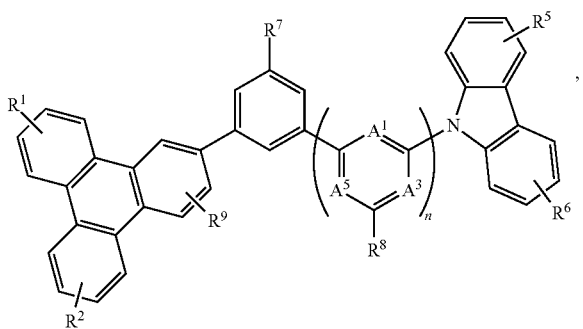
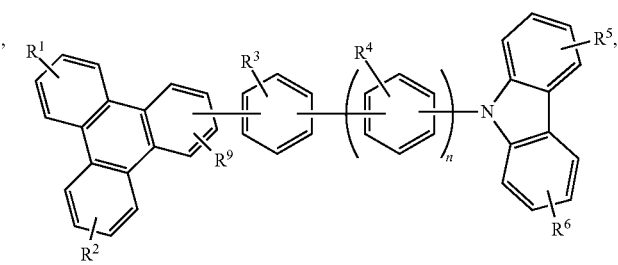
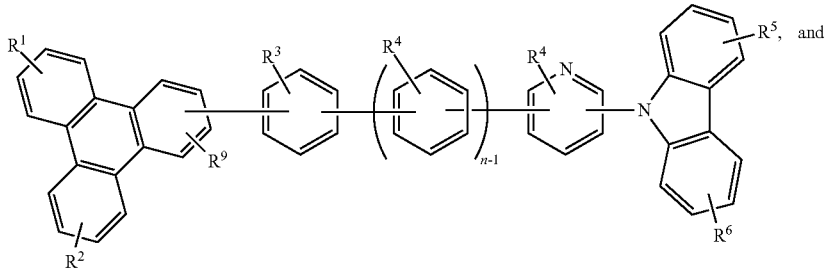
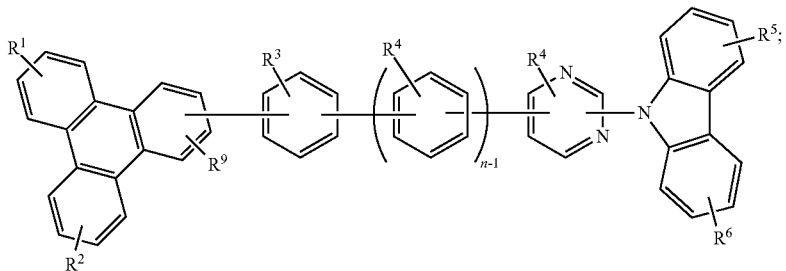

wherein $R^7$ and $R^8$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof.

In one embodiment, the first compound is selected from the group consisting of:

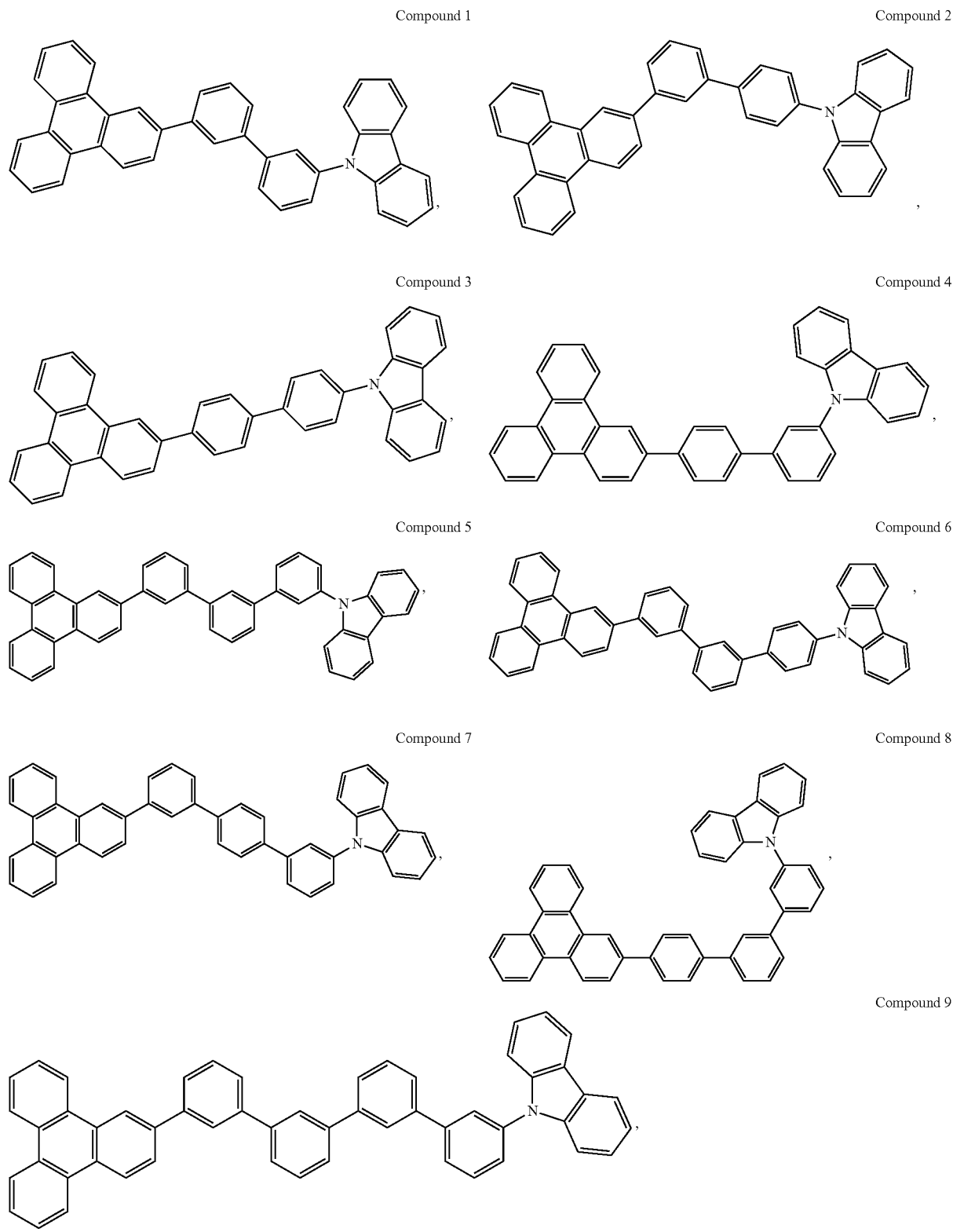

-continued
Compound 10
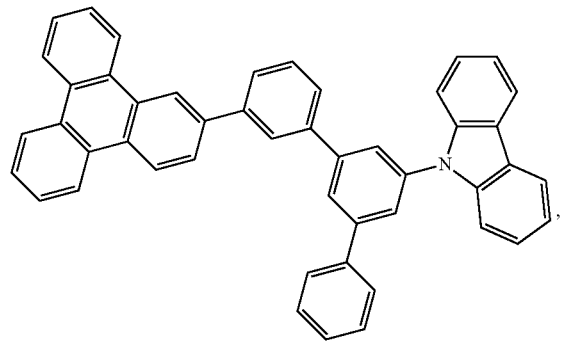
Compound 11
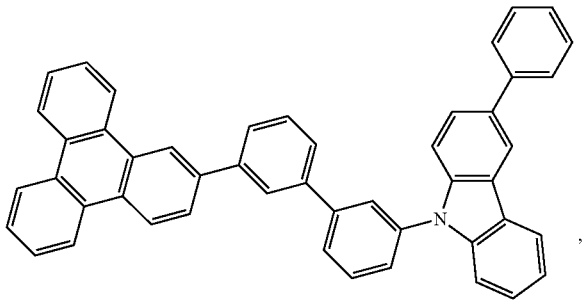
Compound 12
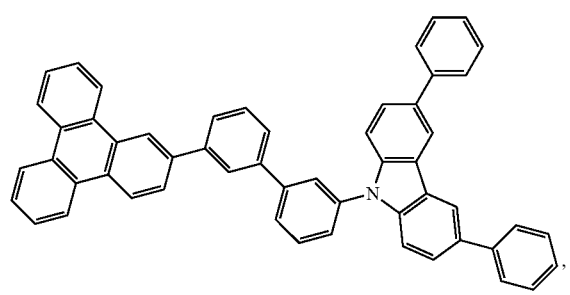
Compound 13
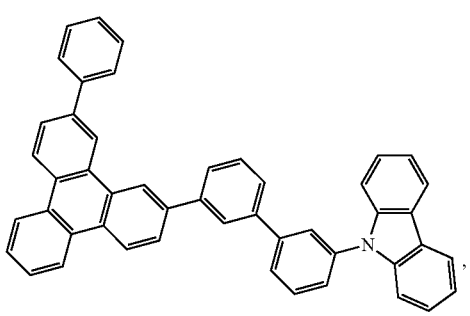
Compound 14
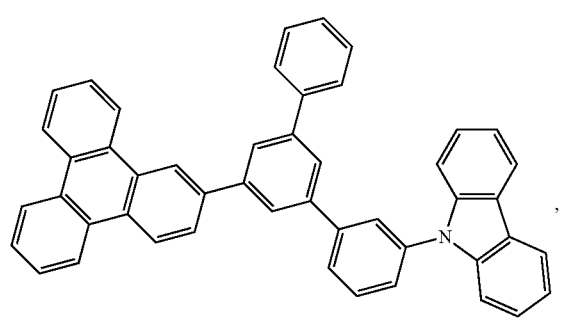
Compound 15
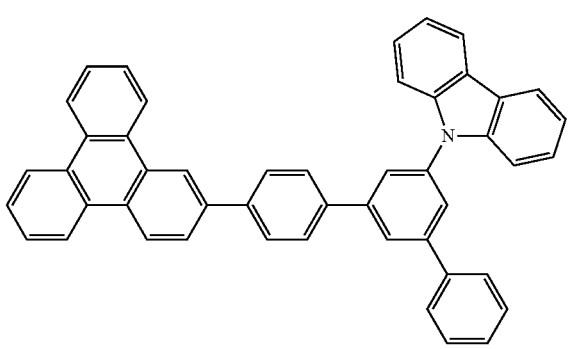
Compound 16
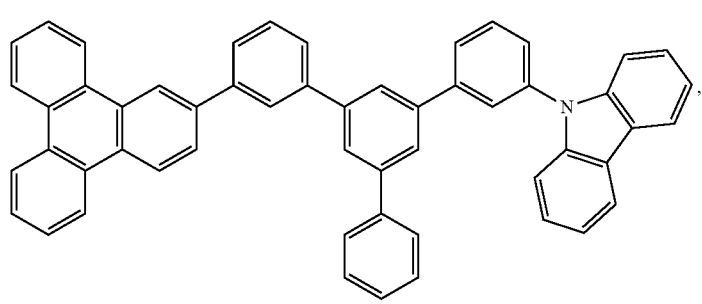
Compound 17
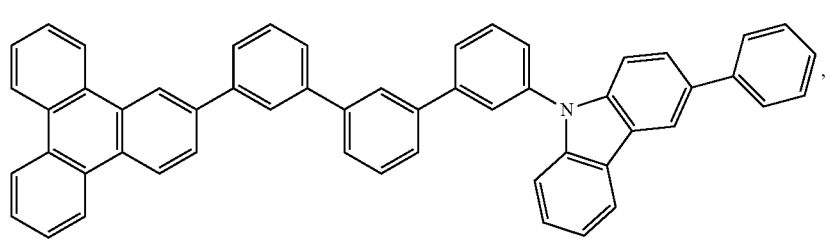

Compound 18
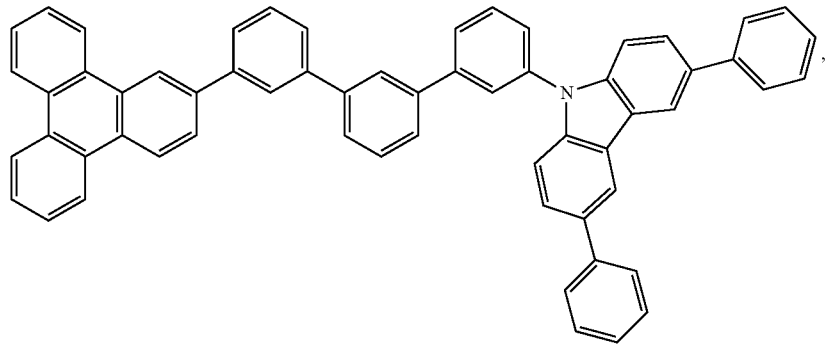
Compound 19
Compound 20
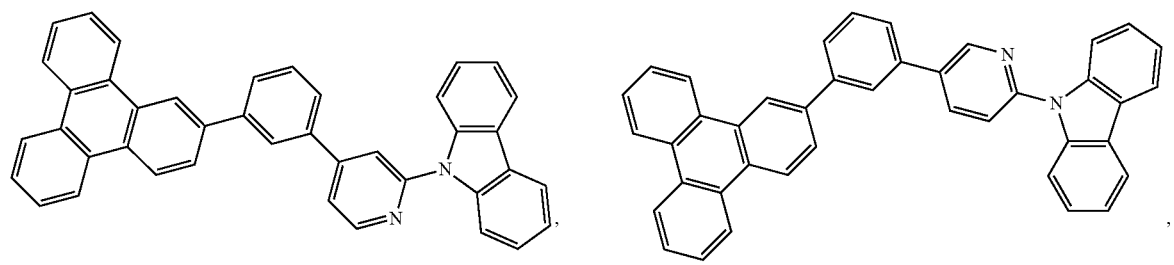
Compound 21
Compound 22
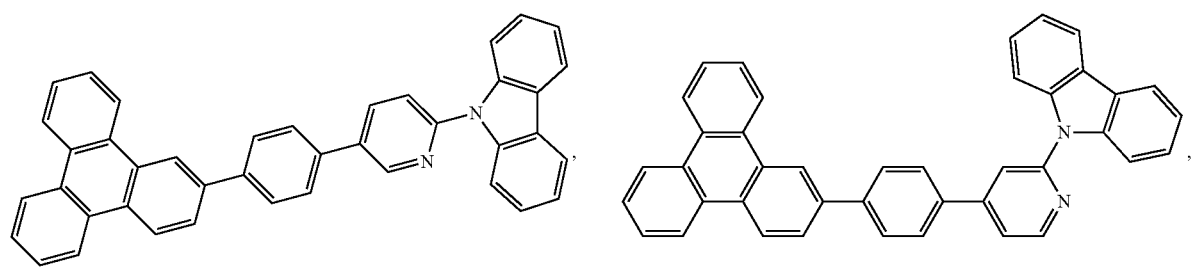
Compound 23
Compound 24
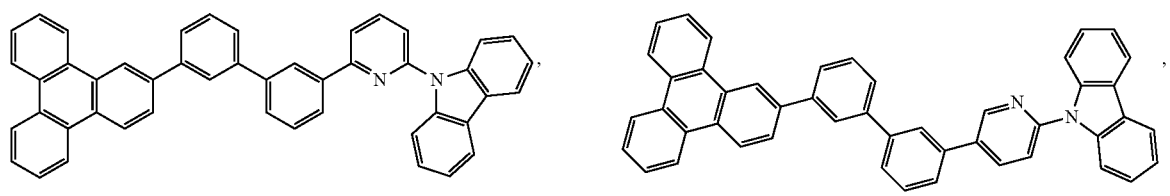
Compound 25
Compound 26
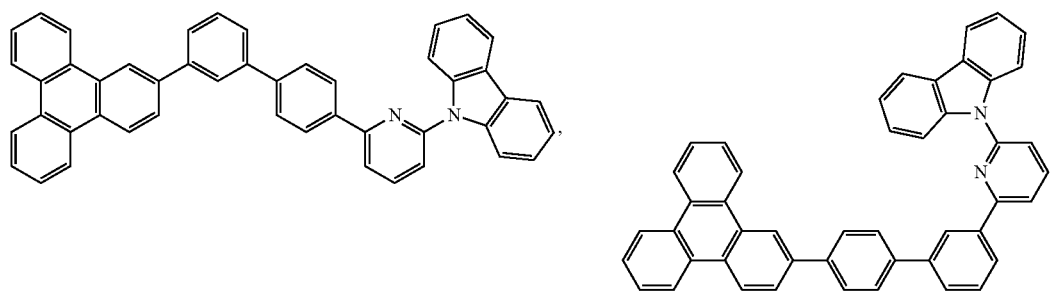

-continued
Compound 27
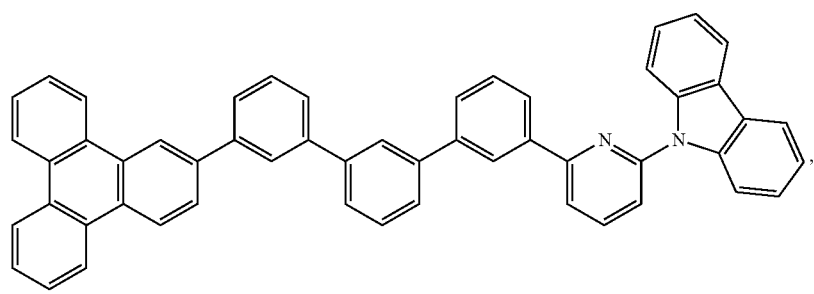
Compound 28
Compound 29
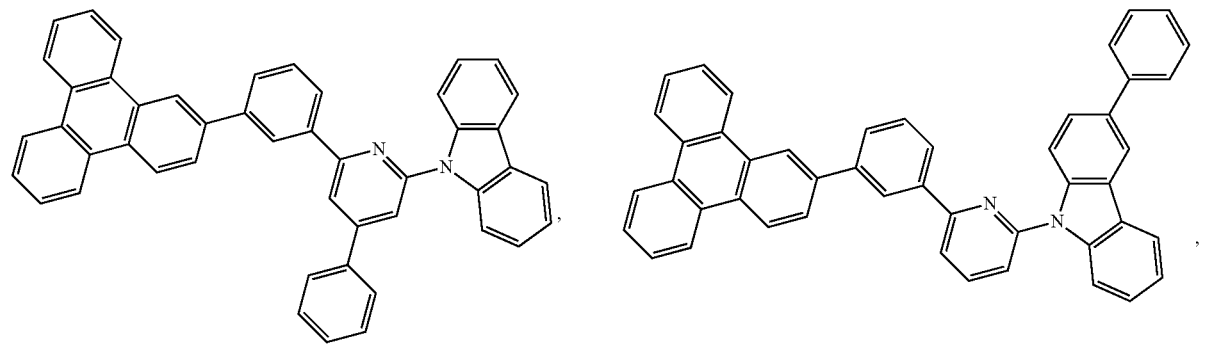
Compound 30
Compound 31
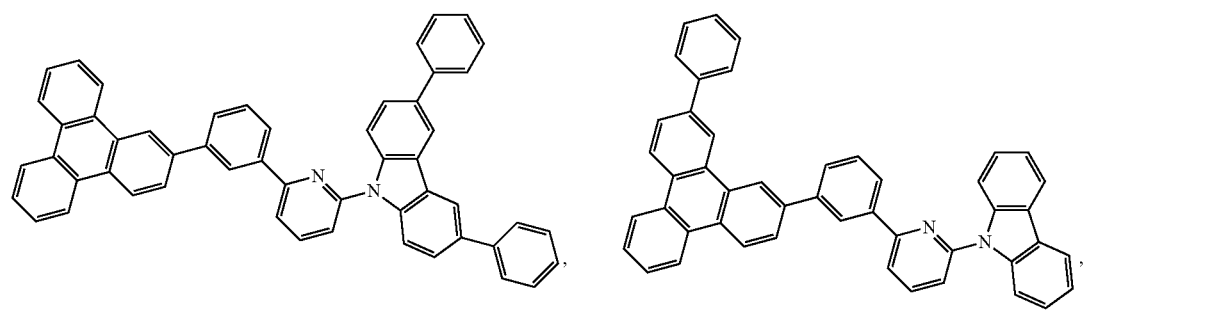
Compound 32
Compound 33
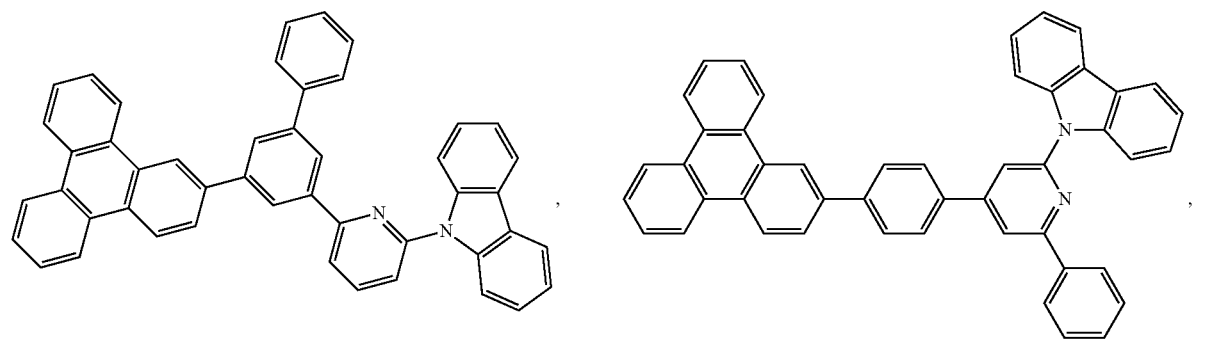
Compound 34
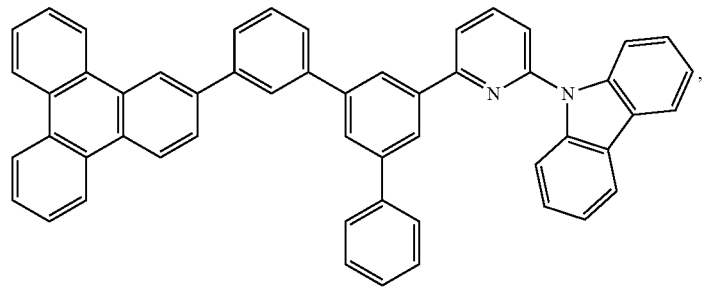

-continued
Compound 35
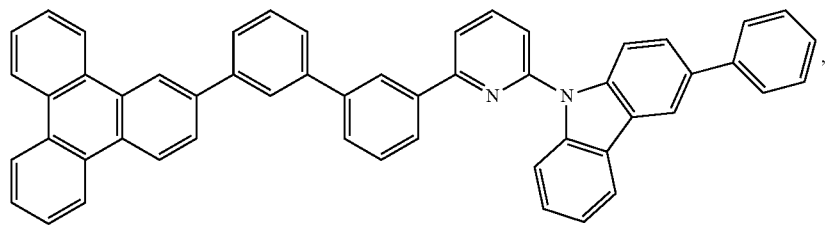
Compound 36
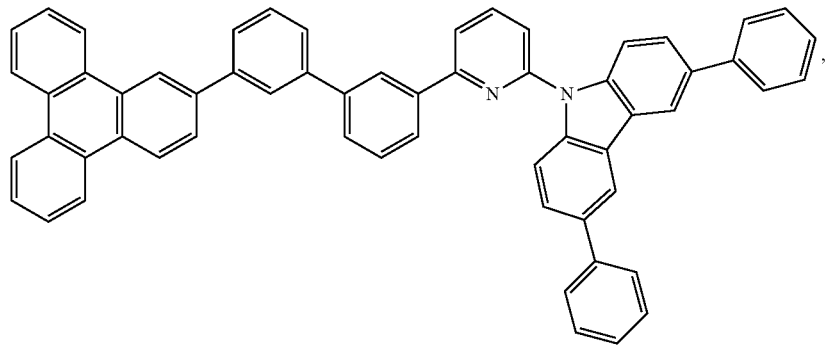
Compound 37
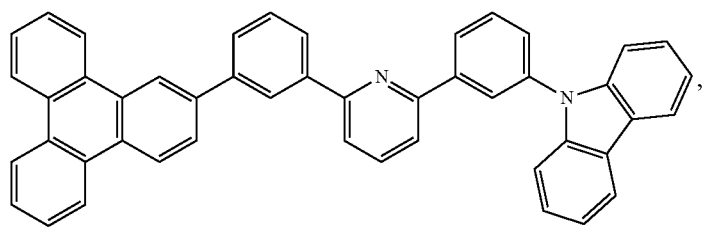
Compound 38
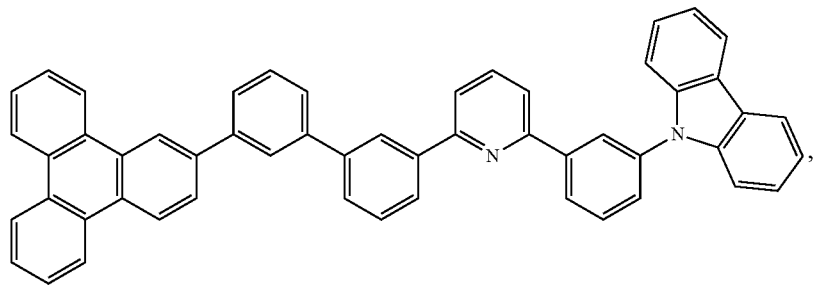
Compound 39
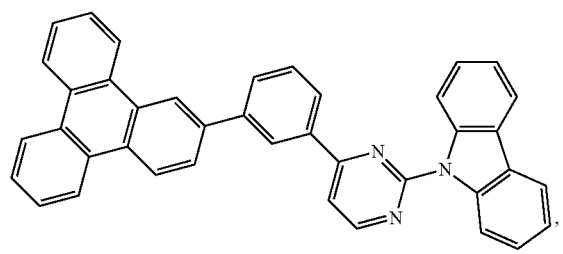
Compound 40
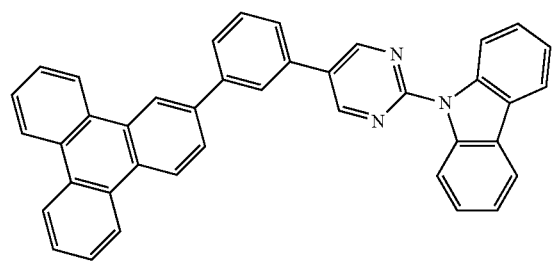
Compound 41
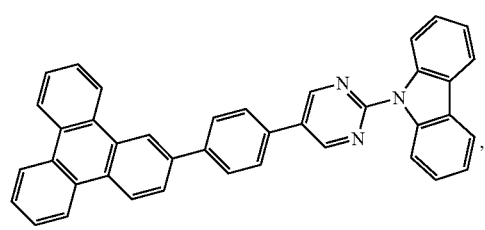
Compound 42
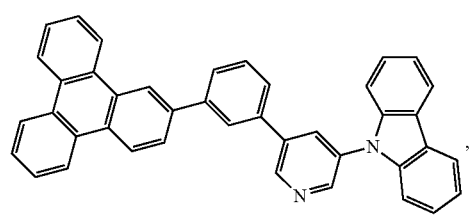

-continued
Compound 43
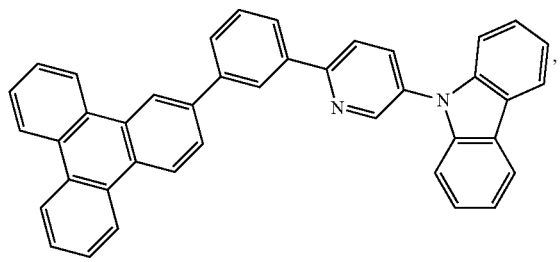
Compound 45
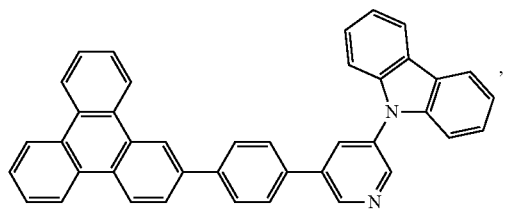
Compound 47
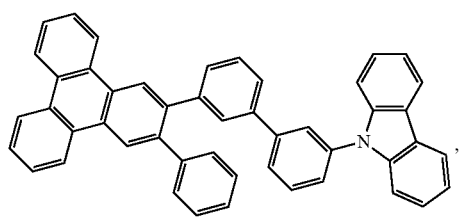
Compound 49
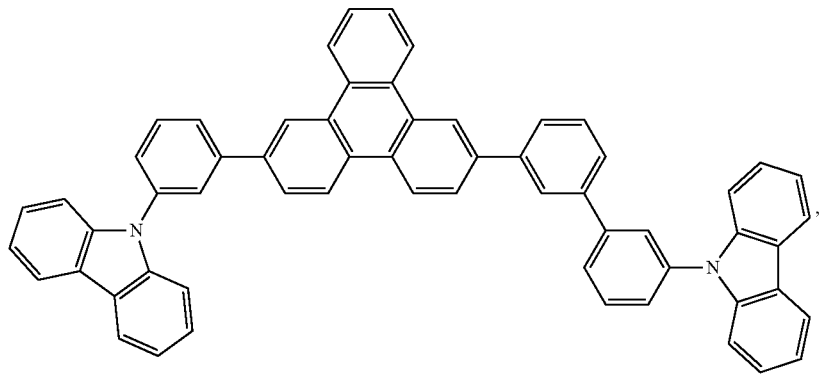
Compound 44
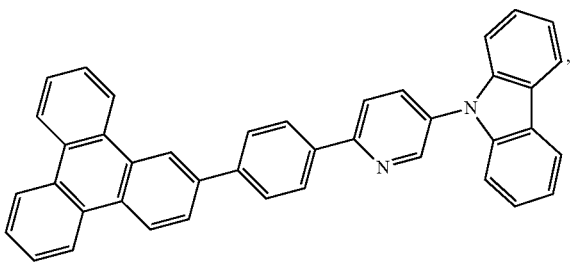
Compound 46
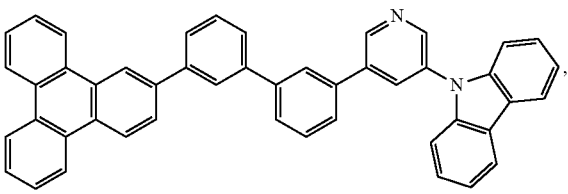
Compound 48
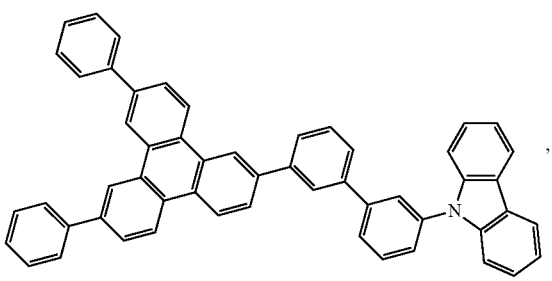
Compound 50
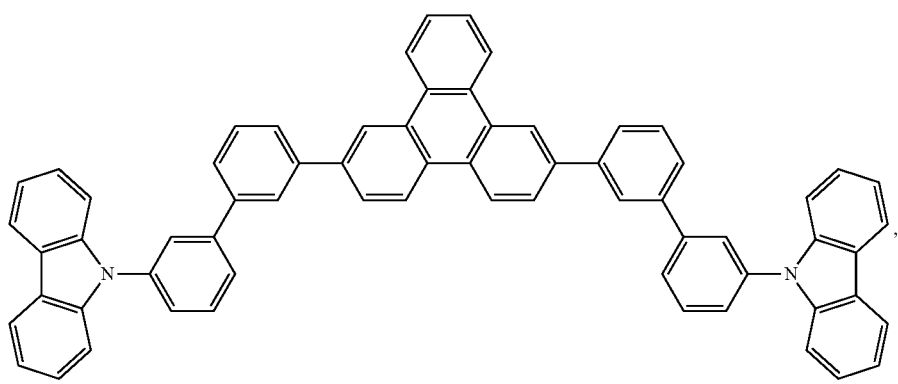

-continued
Compound 51
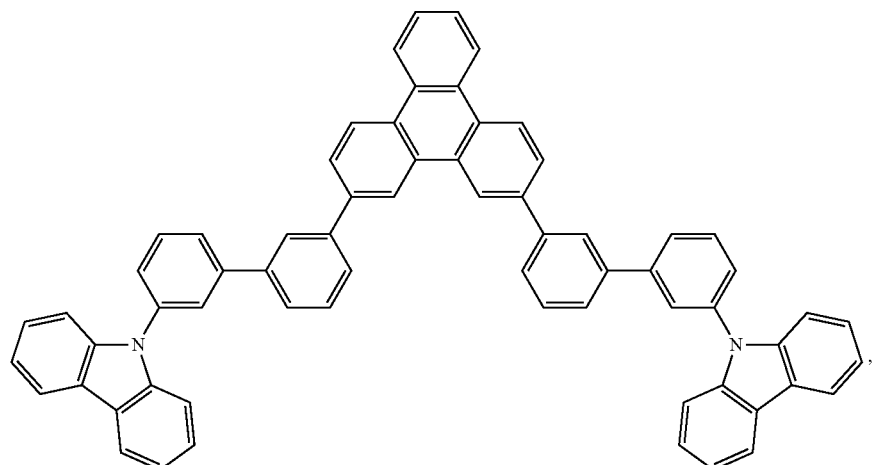
Compound 52
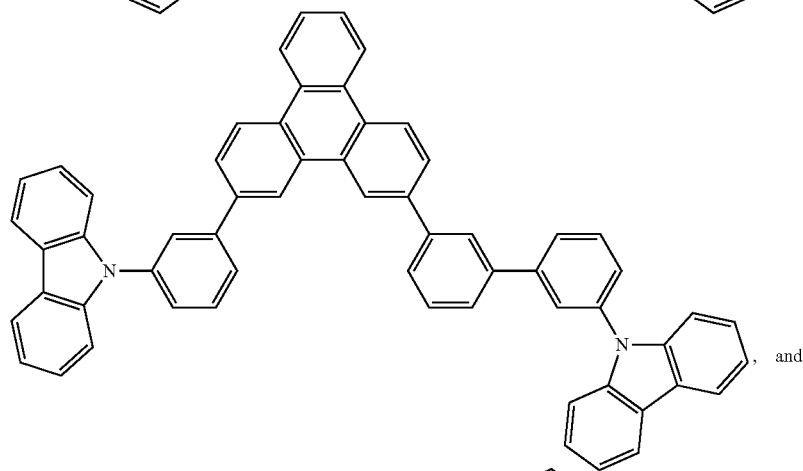
, and
Compound 53
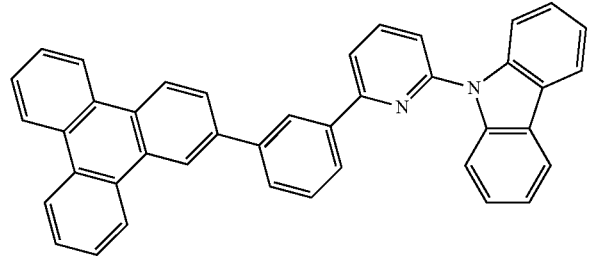
.
In one embodiment of the host composition, the second compound is selected from the group consisting of:
-continued
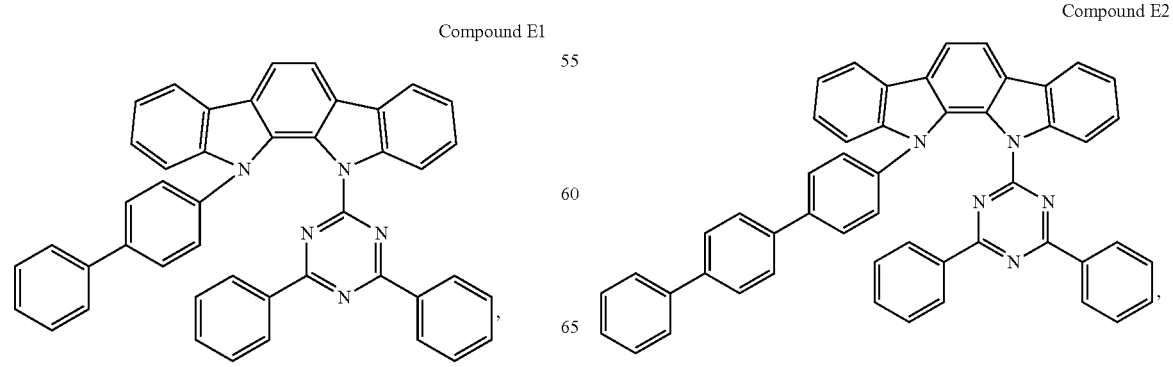

Compound E3
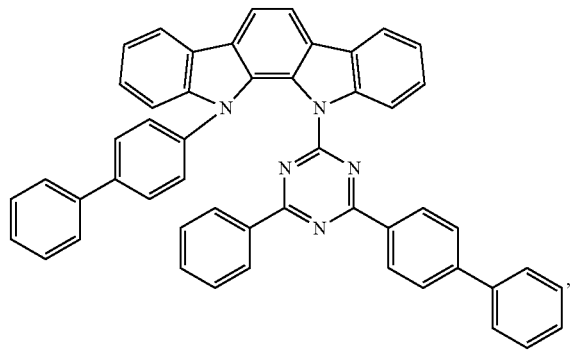
Compound E4
Compound E5
Compound E6
Compound E7
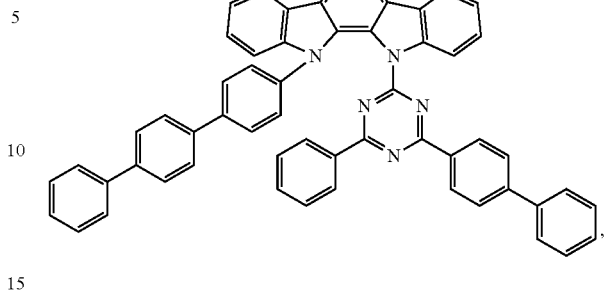
Compound E8
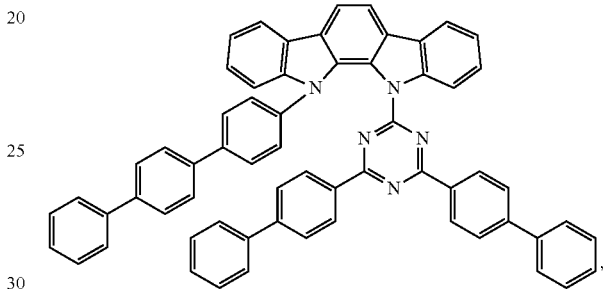
Compound E9
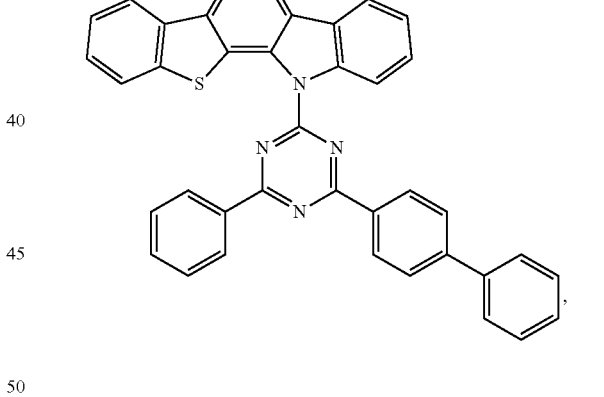
Compound E10
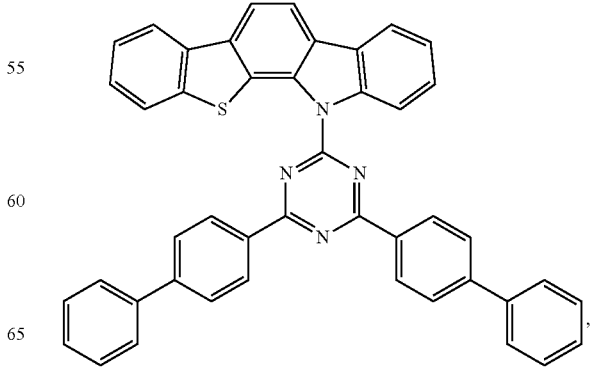

Compound E11
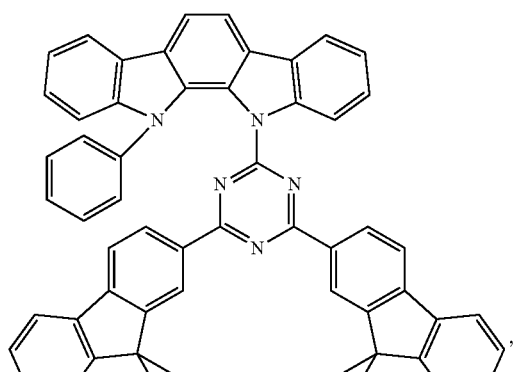
Compound E12
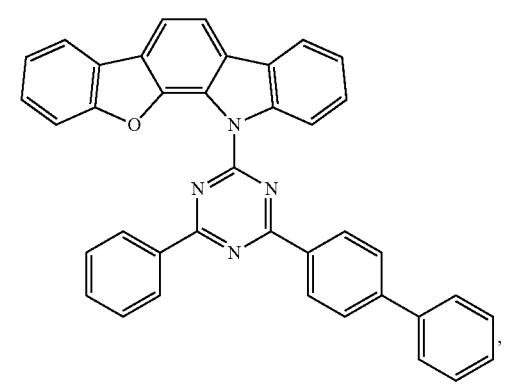
Compound E13
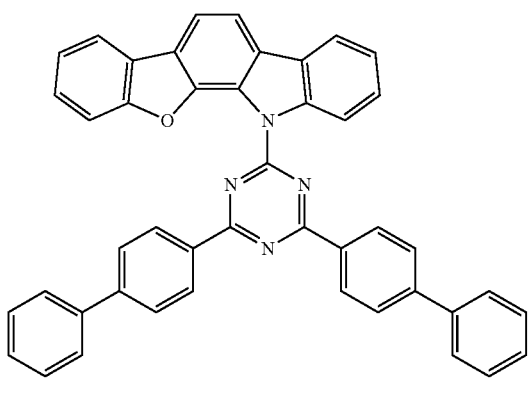
Compound E14
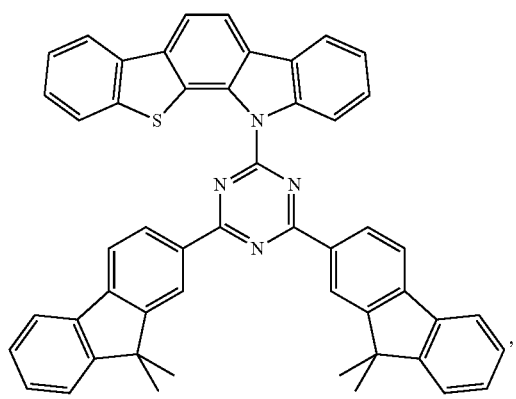
Compound E15
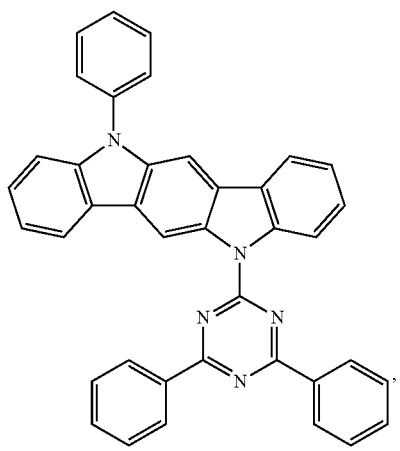
Compound E16
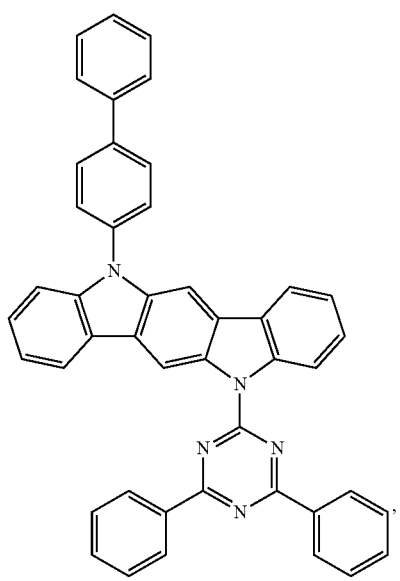
Compound E17
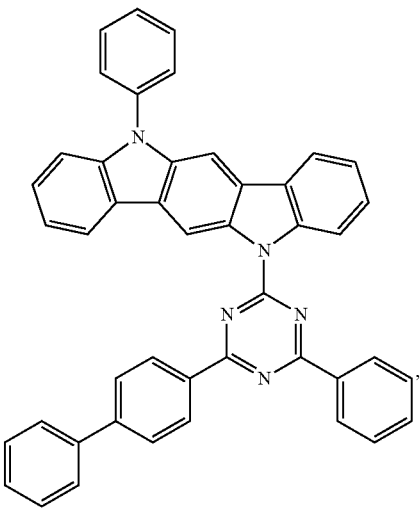

Compound E18
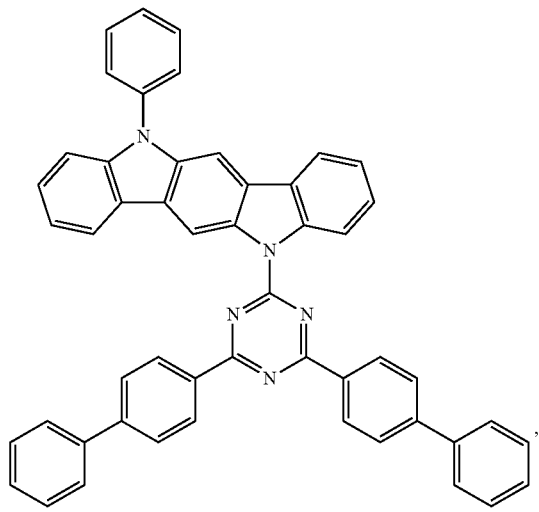
Compound E19
Compound E20
Compound E21
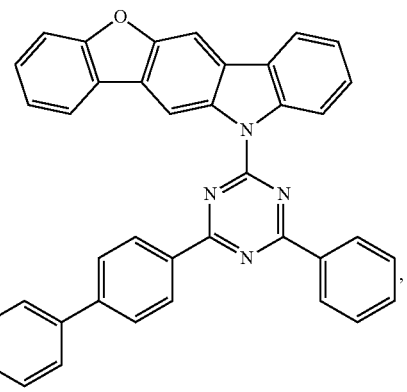
Compound E22
Compound E23
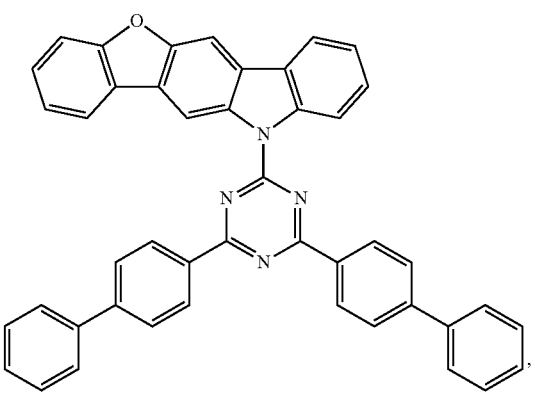
Compound E24
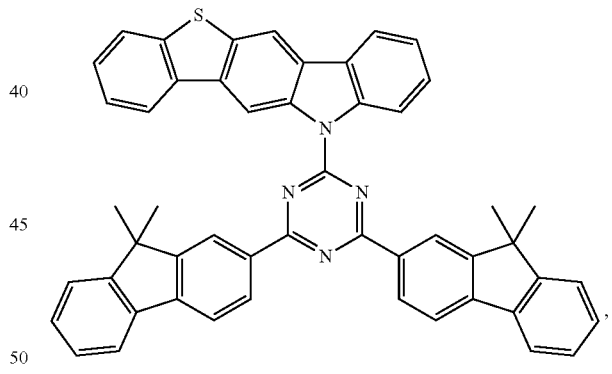
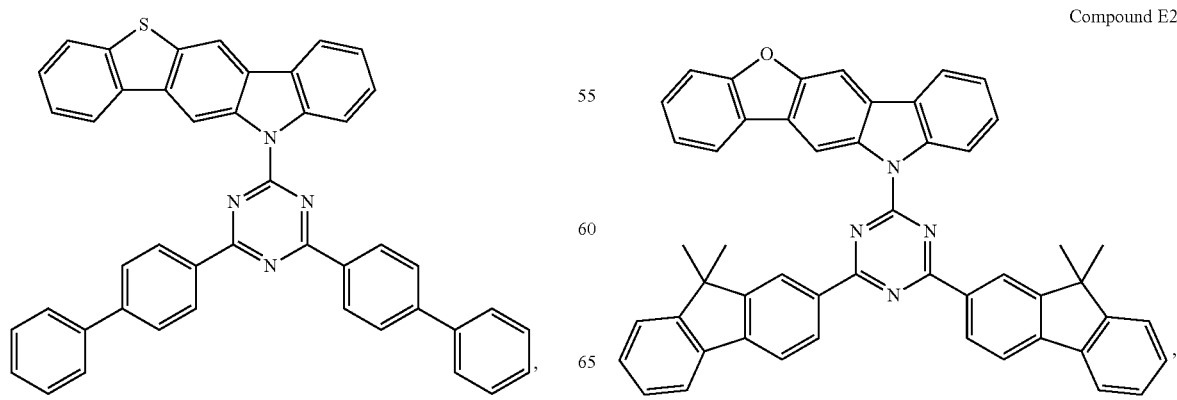

Compound E25
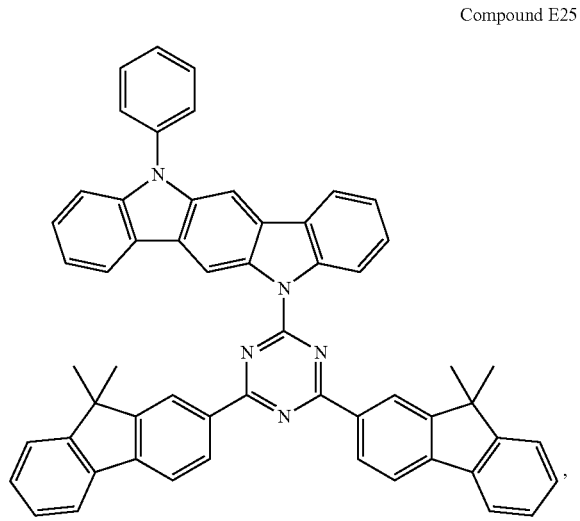
Compound E28
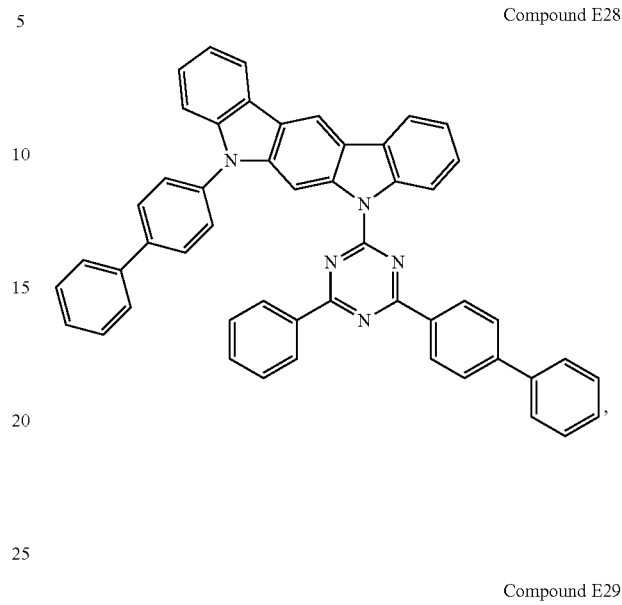
Compound E26
Compound E29
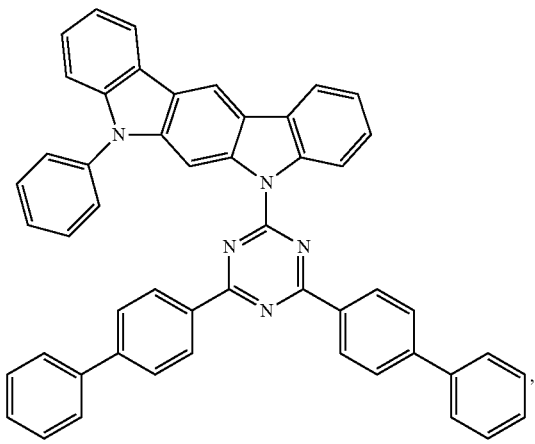
Compound E27
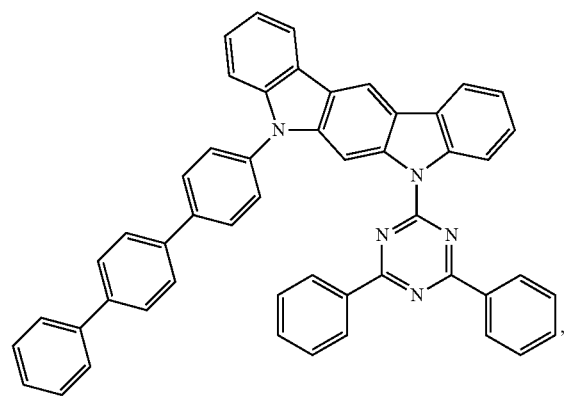
Compound E30
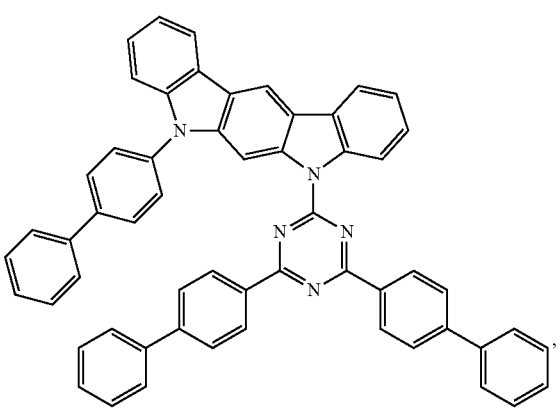

Compound E31
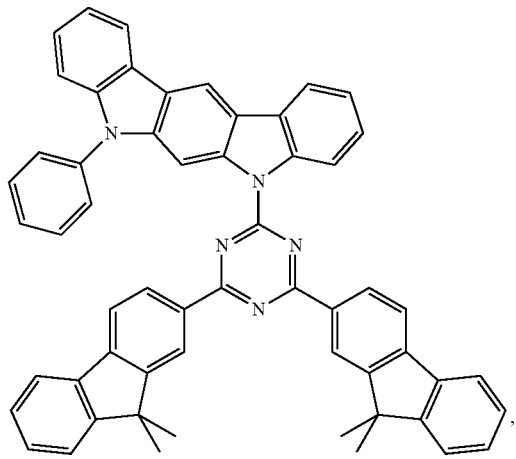
Compound E32
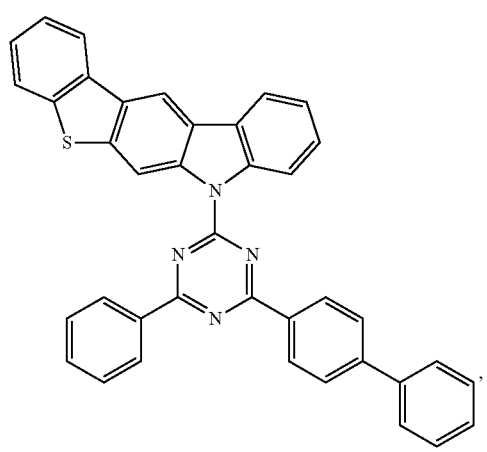
Compound E33
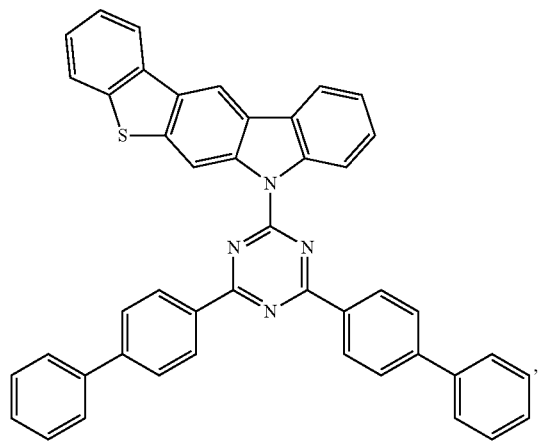
Compound E34
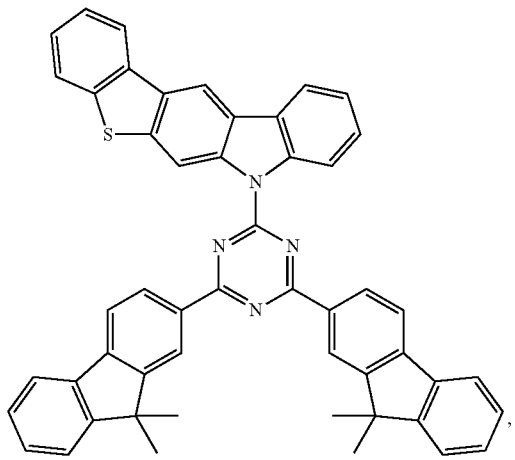
Compound E35
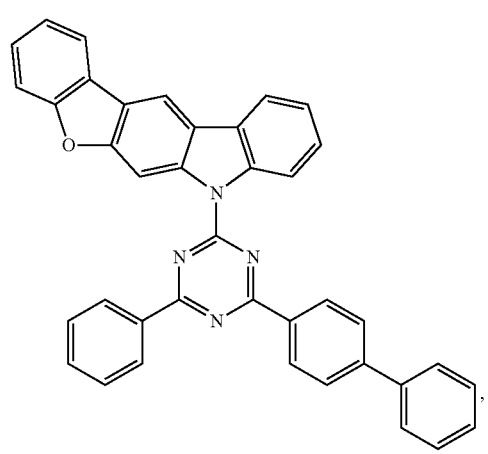
Compound E36

Compound E37
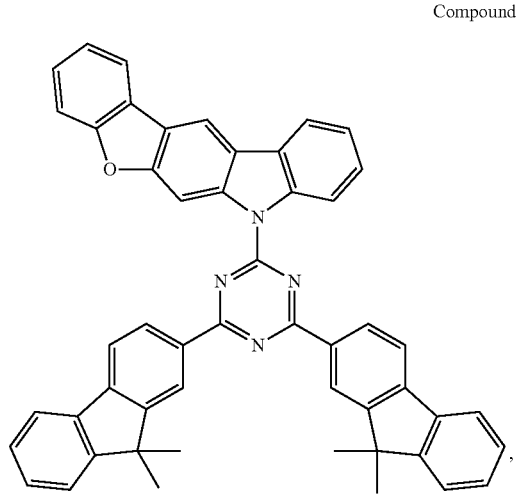
Compound E38
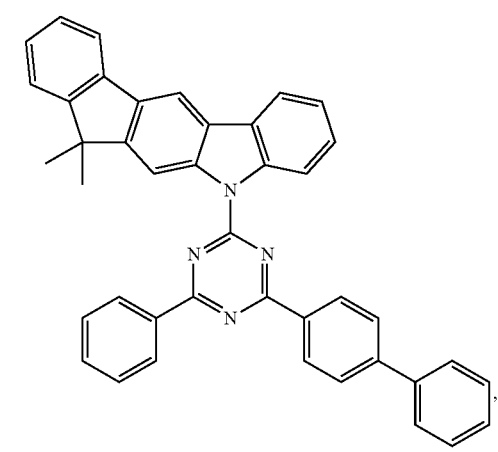
Compound E39
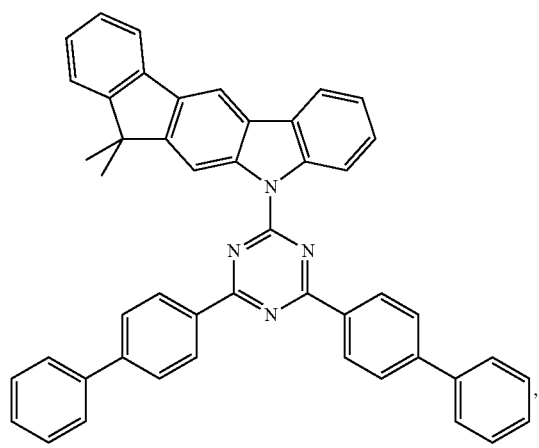
Compound E40
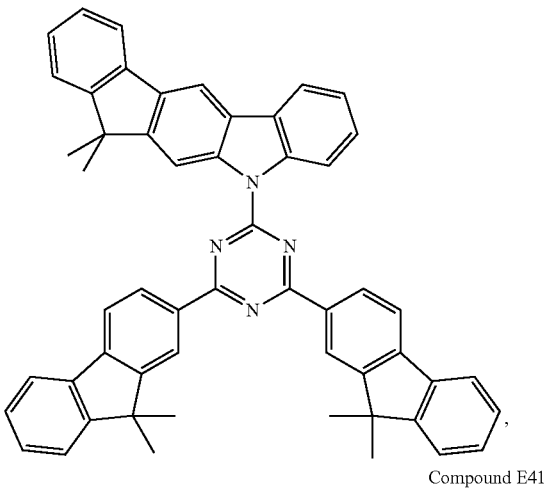
Compound E41
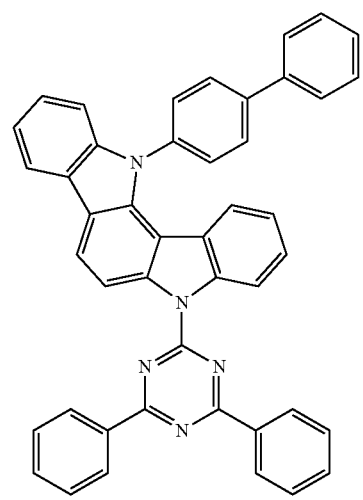
Compound E42

Compound E43
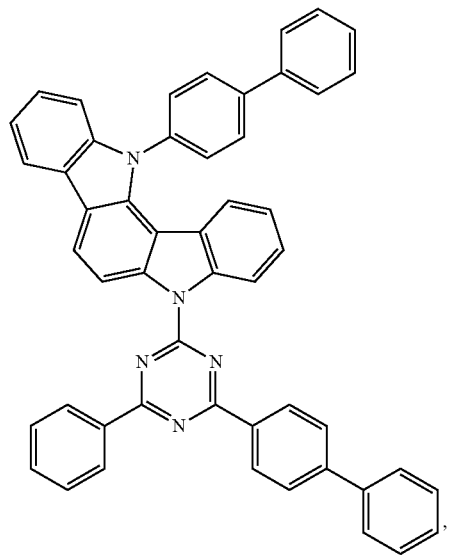
Compound E44
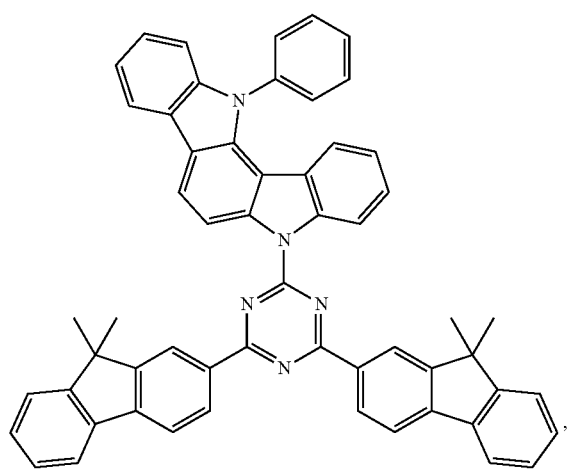
Compound E45
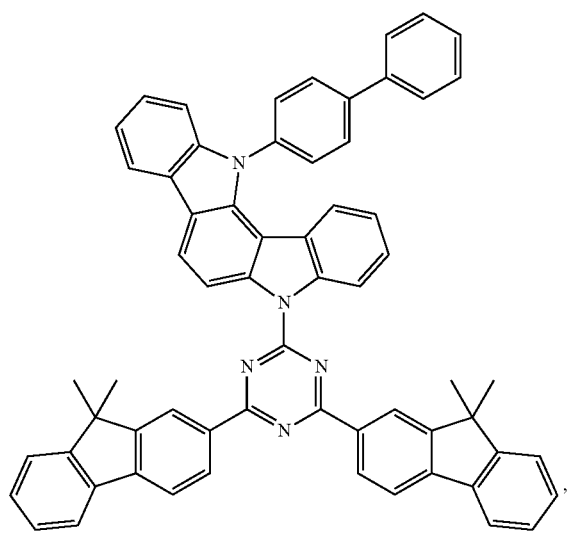
Compound E46
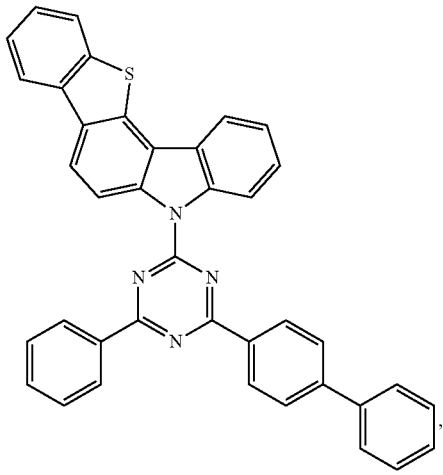
Compound E47
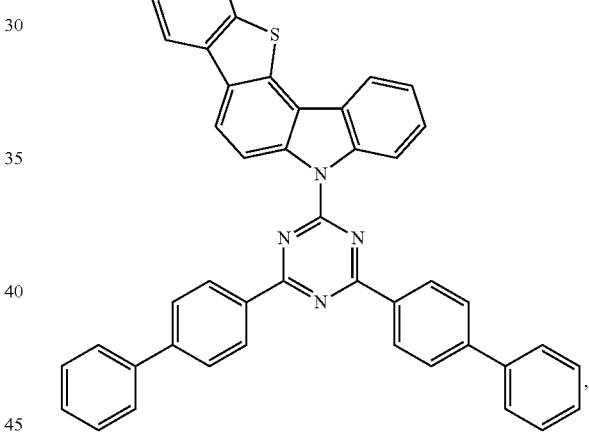
Compound E48
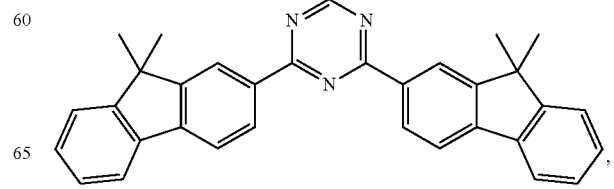

Compound E49
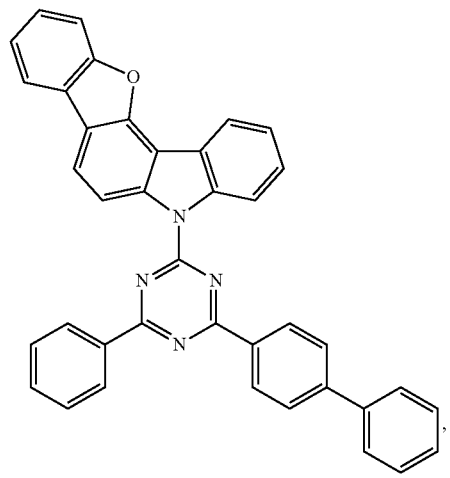
Compound E50
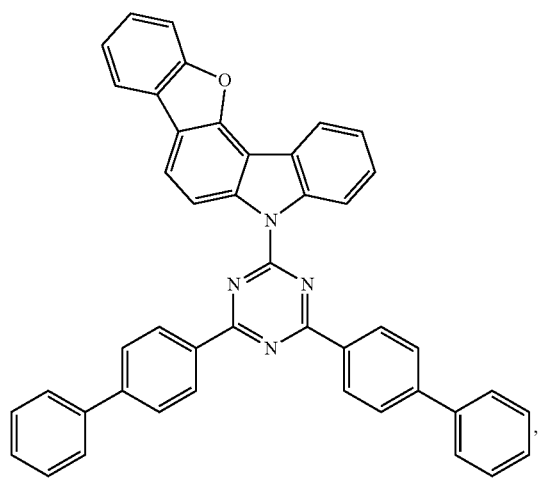
Compound E51
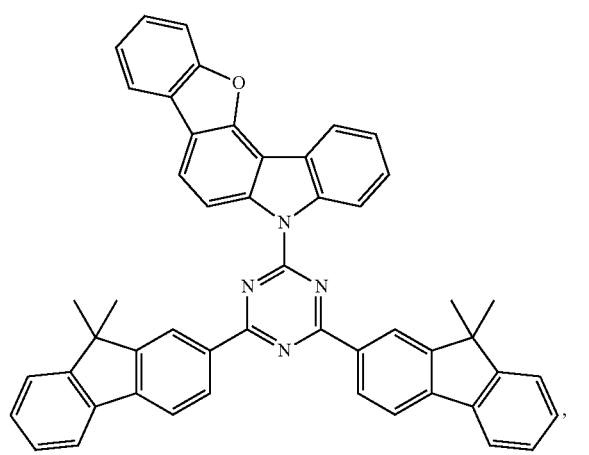
Compound E52
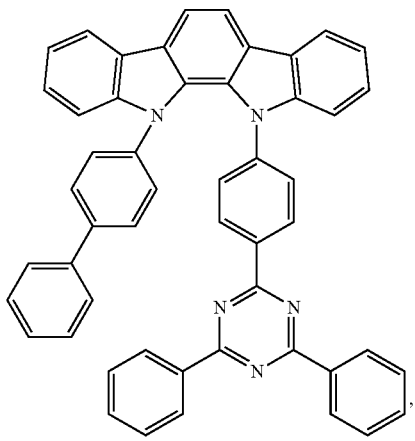
Compound E53
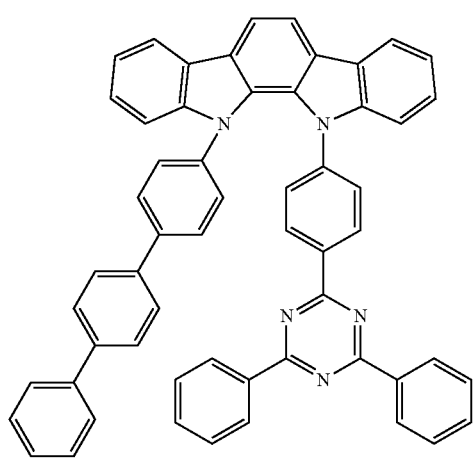
Compound E54
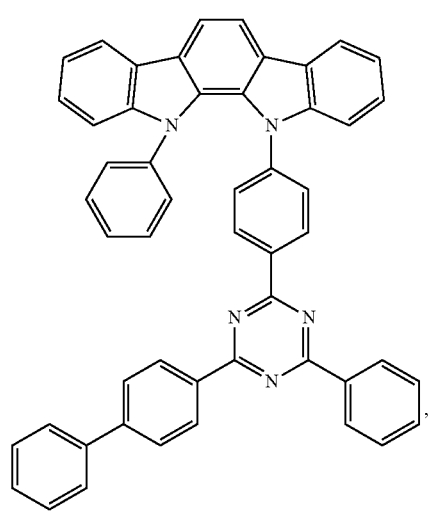

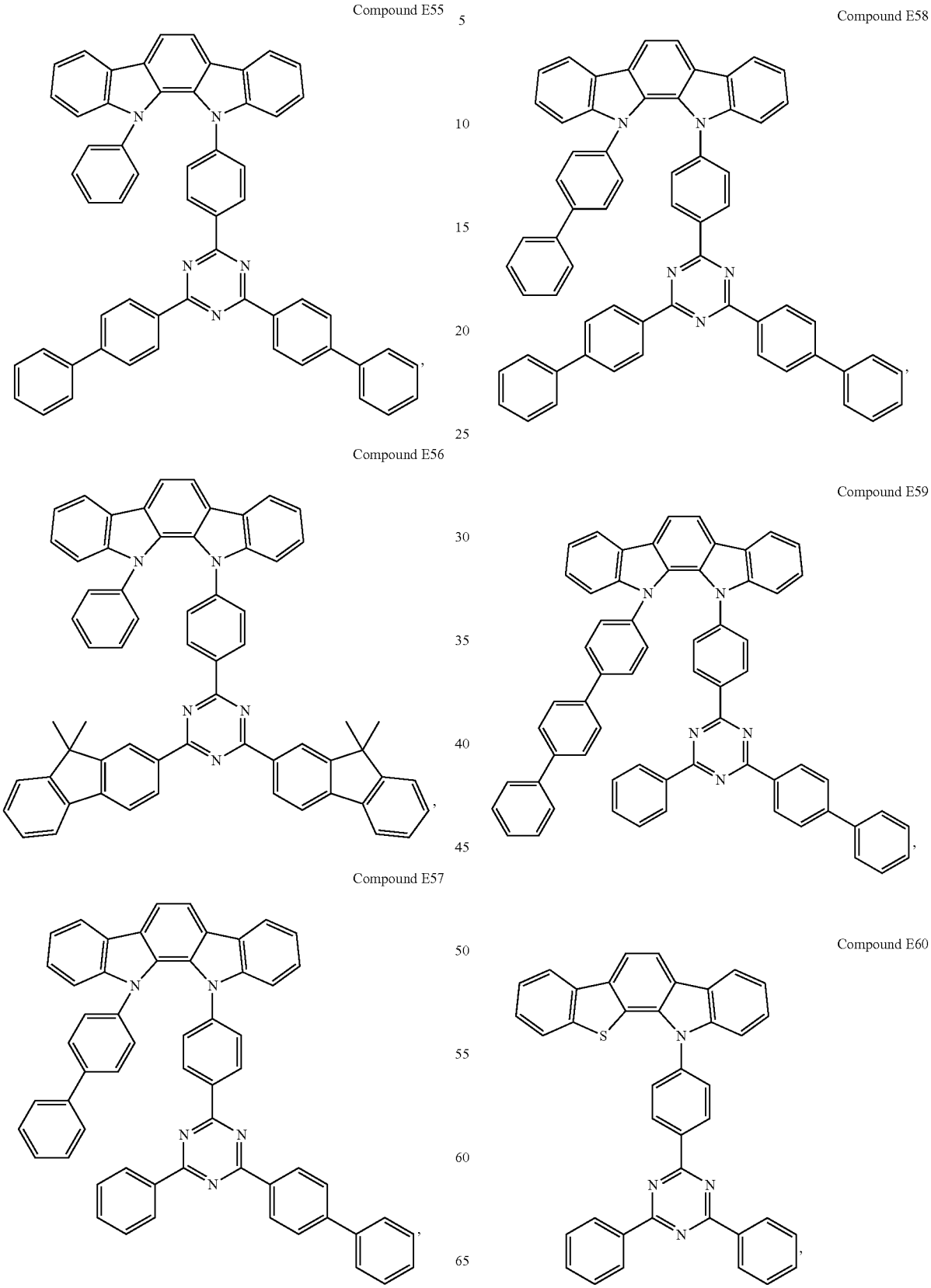

Compound E61
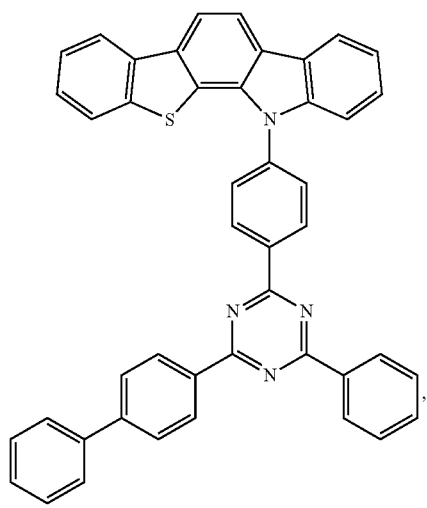
Compound E62
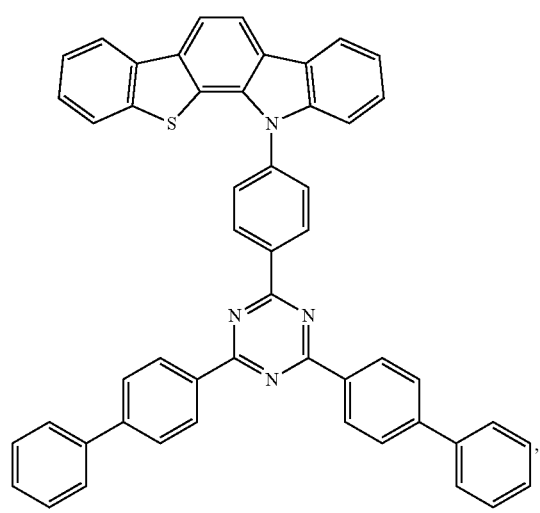
Compound E63
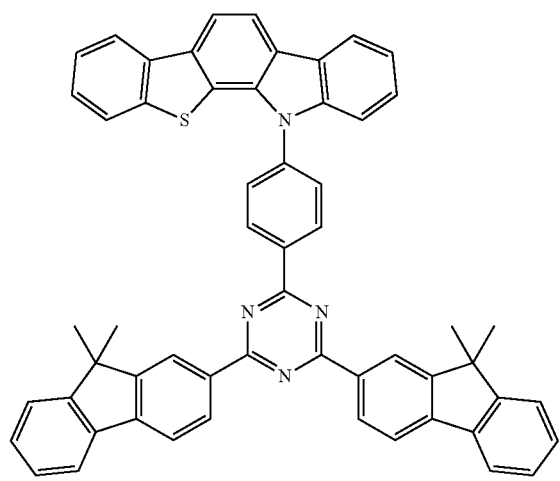
Compound E64
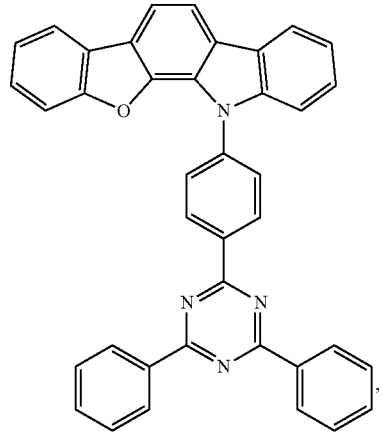
Compound E65
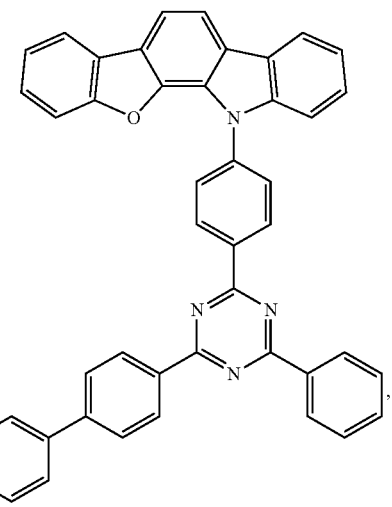
Compound E66
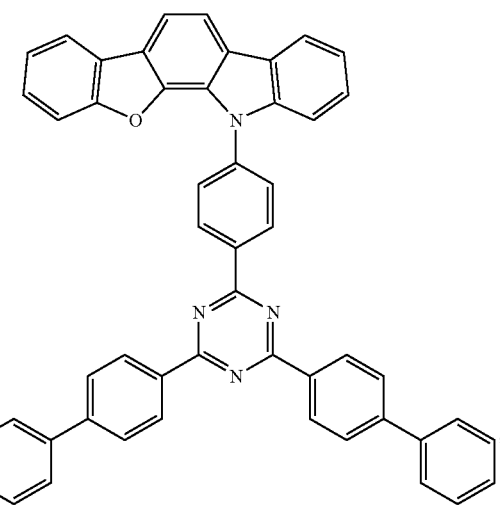

Compound E67
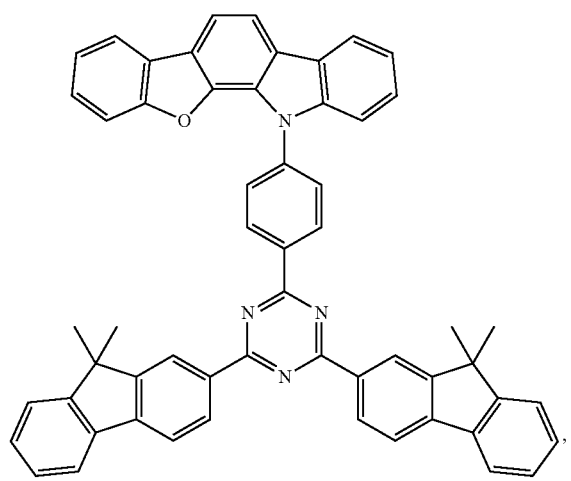
Compound E68
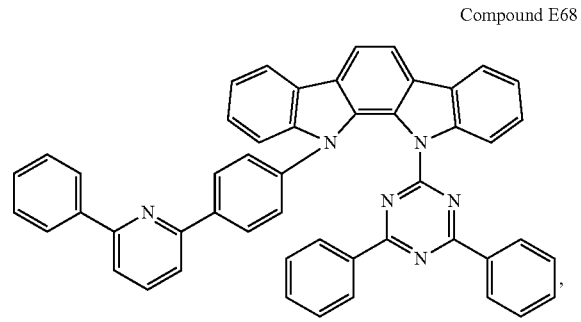
Compound E69
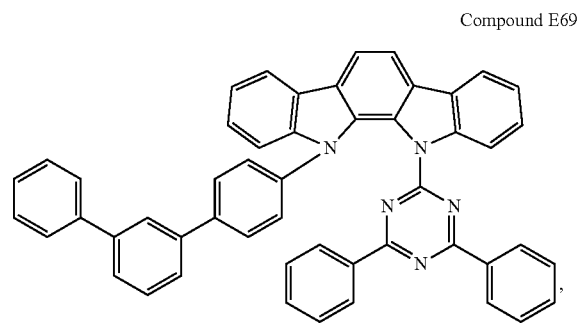
Compound E70
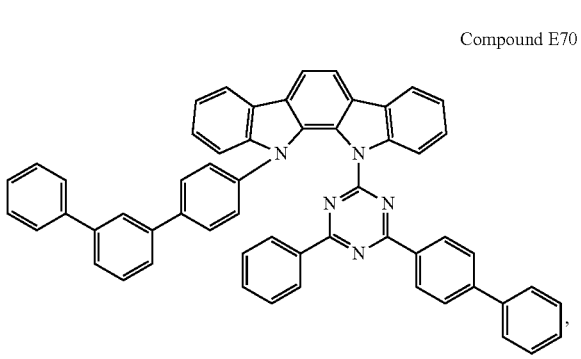
Compound E71
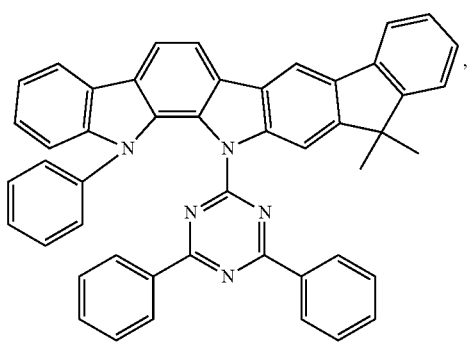
Compound E72
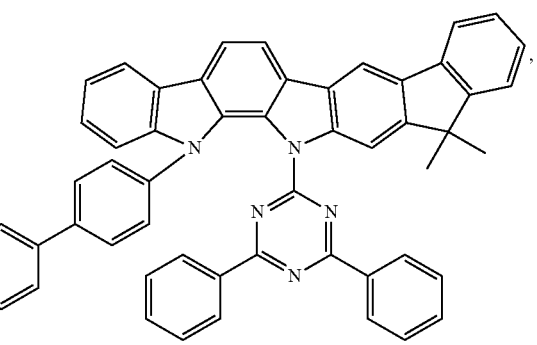
Compound E73
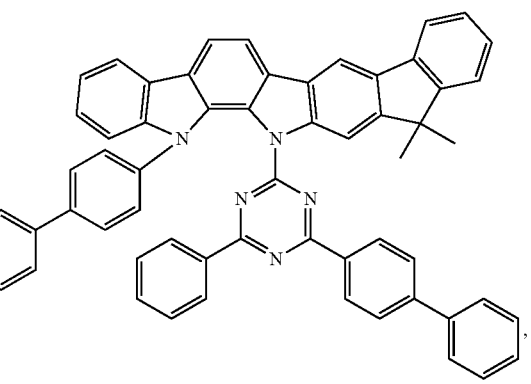
Compound E74
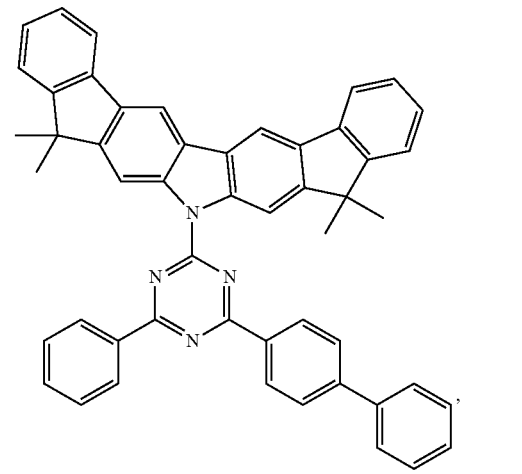

Compound E75
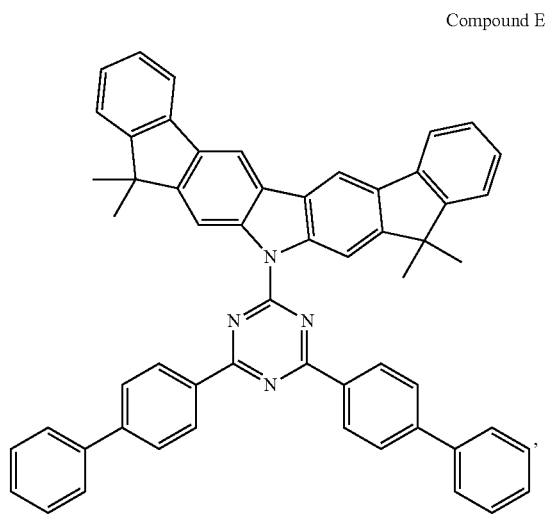
Compound E78
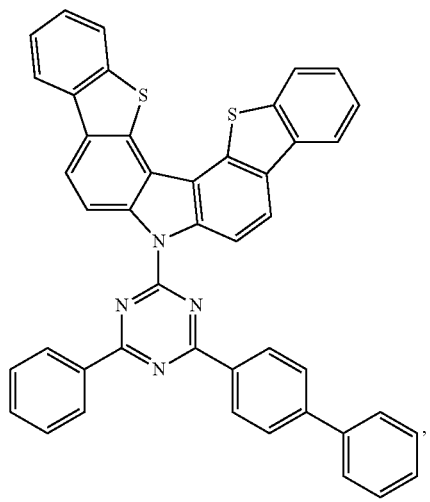
Compound E76
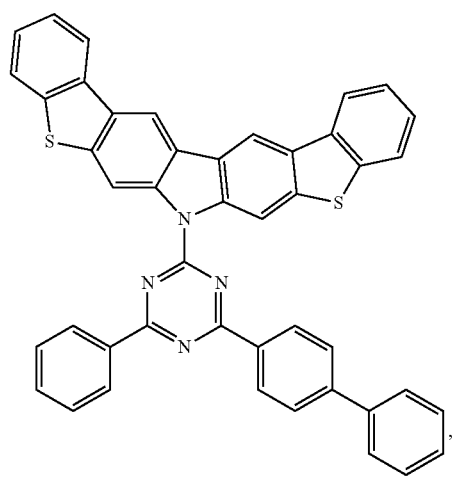
Compound E79
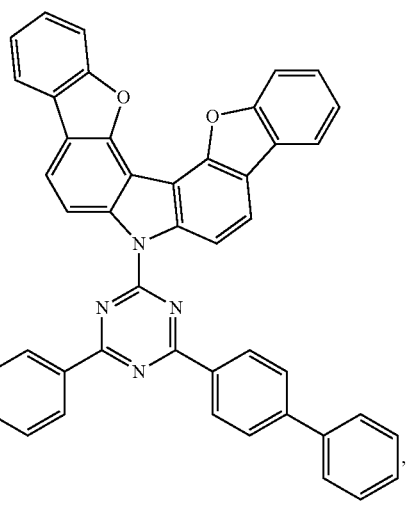
Compound E77
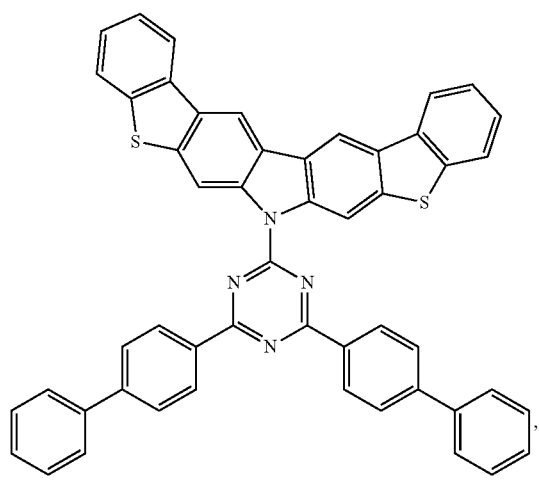
Compound E80
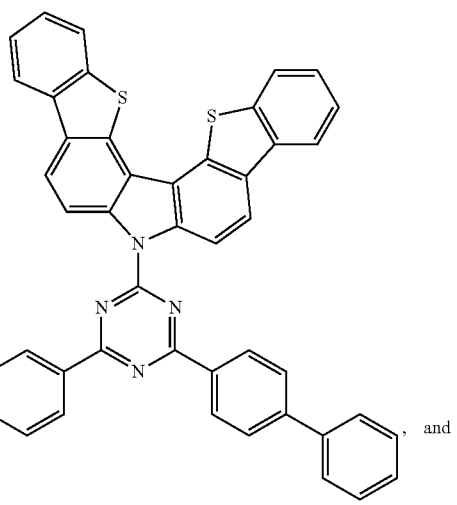
, and Compound E81

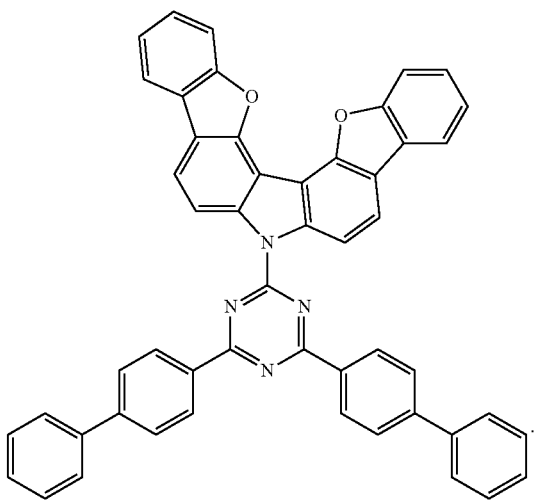

In one embodiment of the host composition, the mixture of the first compound and the second compound is selected from the group consisting of: (Compound 2 and Compound E2), (Compound 3 and Compound E4), (Compound 1 and Compound E5), (Compound 6 and Compound E7), (Compound 7 and Compound E7), (Compound 9 and Compound E8), (Compound 17 and Compound E8), and (Compound 15 and Compound E18).

According to another aspect of the present disclosure, a first device comprising a phosphorescent organic light-emitting device is disclosed. The phosphorescent organic light-emitting device comprises: an anode; a cathode; and an organic layer, disposed between the anode and the cathode, comprising a first organic composition comprising a mixture of a first compound and a second compound, wherein the first compound has different chemical structure than the second compound;

wherein the first compound is capable of functioning as a hole transporting material in an organic light emitting device at room temperature;

wherein the first compound comprises at least one carbazole group;

wherein the first compound has an evaporation temperature T1 of 150 to 350° C.;

wherein the second compound has an evaporation temperature T2 of 150 to 350° C.;

wherein the absolute value of T1−T2 is less than 20° C.;

wherein the first compound has a concentration C1 in said mixture, and the first compound has a concentration C2 in a film formed by evaporating the mixture in a vacuum deposition tool at a constant pressure between $1 \times 10^{-6}$ Torr to $1 \times 10^{-9}$ Torr, at a 2 Å/sec deposition rate on a surface at a predefined distance away from the evaporation source of the mixture being evaporated; and wherein the absolute value of (C1−C2)/C1 is less than 5%.

In one embodiment of the first device, the first compound has a structure according to the formula (I):

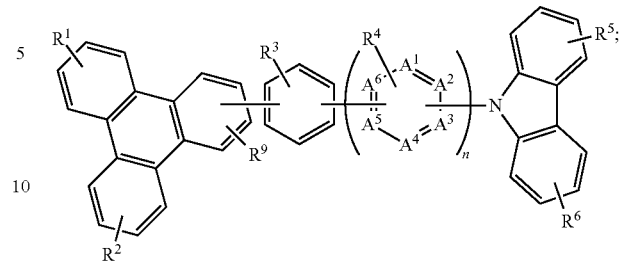

wherein $R^1$, $R^2$, $R^3$, $R^4$, $R^5$, and $R^6$ each represent mono, di, tri, tetra substitutions, or no substitution;

$R^9$ represents mono, di, tri substitutions, or no substitution;

$R^1$, $R^2$, $R^3$, $R^4$, $R^5$, $R^6$, and $R^9$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof;

$A^1, A^2, A^3, A^4, A^5$, and $A^6$ are each independently selected from N or C; and n is an integer from 1 to 20;

wherein the second compound has the formula (II):

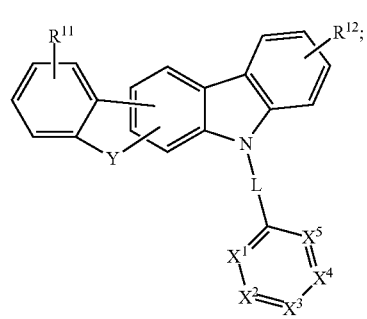

wherein $R^{11}$ and $R^{12}$ each represent mono, di, tri, tetra substitutions, or no substitution;

Y is selected from the group consisting of O, S, Se, NR', and CR"R'";

L is a single bond or comprises an aryl or heteroaryl group having from 5-24 carbon atoms, which is optionally further substituted;

$X^1$, $X^2$, $X^3$, $X^4$, and $X^5$ are each independently selected from group consisting of CR and N;

at least one of $X^1$, $X^2$, $X^3$, $X^4$, and $X^5$ is N; and

R, R', R", and R'" are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof.

In one embodiment of the first device, in the formula (II) for the second compound, $X^1$, $X^3$, and $X^5$ are N; and wherein $X^2$ and $X^4$ are CR.

In one embodiment of the first device, the organic layer is an emissive layer and the first composition is a host. In one embodiment, the organic layer is a hole transporting layer.

In one embodiment of the first device, the organic layer can further comprise a phosphorescent emissive dopant. The phosphorescent emissive dopant can be a transition metal complex having at least one ligand or part of the ligand, if the ligand is more than bidentate, selected from the group consisting of:
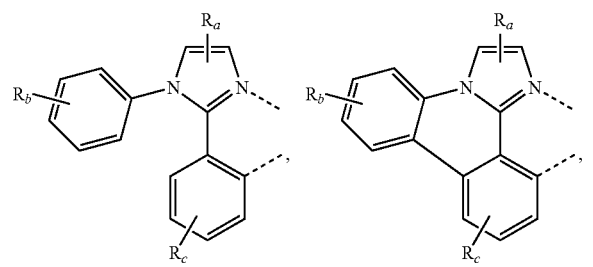
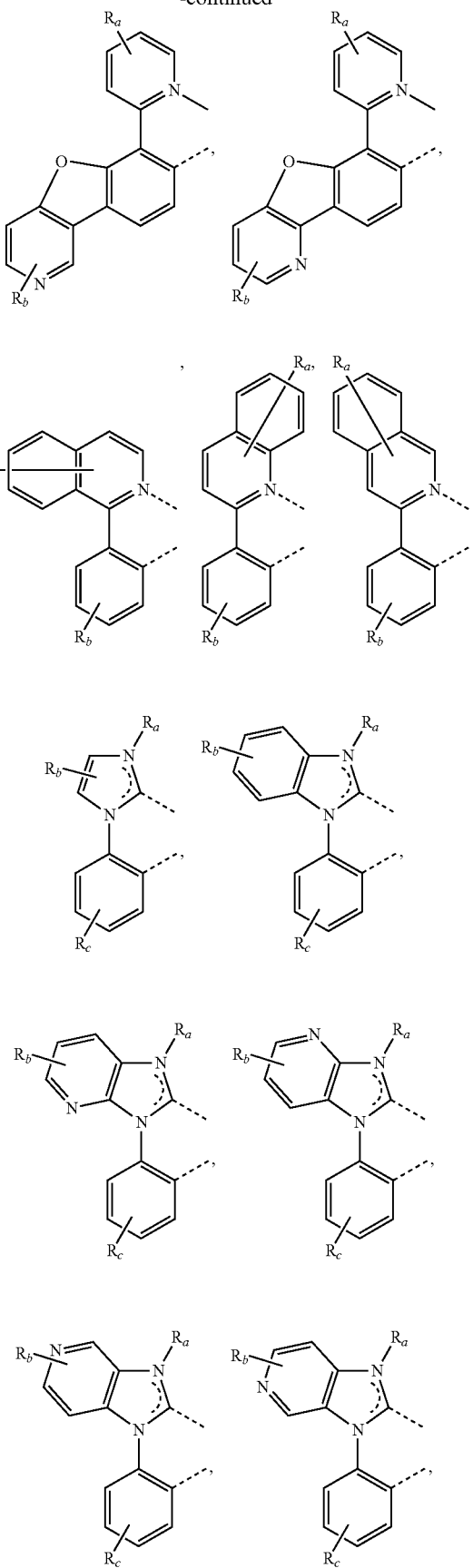
-continued -continued

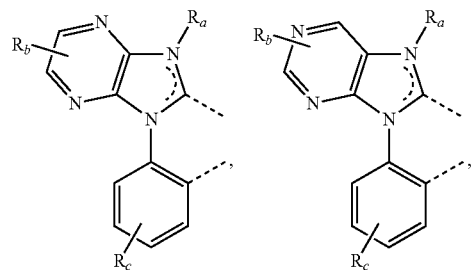

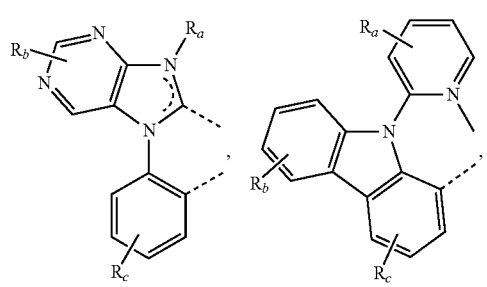

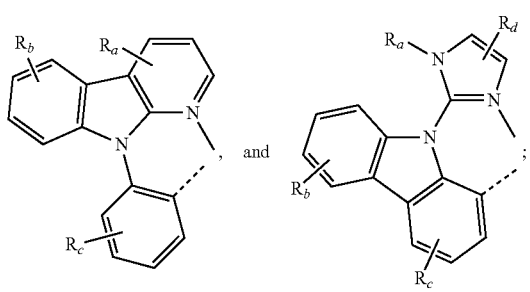

wherein $R_a$, $R_b$, $R_c$, and $R_d$ may represent mono, di, tri, or tetra substitution, or no substitution;
wherein $R_a$, $R_b$, $R_c$, and $R_d$ are independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; and wherein two adjacent substituents of $R_a$, $R_b$, $R_c$, and $R_d$ are optionally joined to form a fused ring or form a multidentate ligand.

According to another aspect of the present disclosure, a method of fabricating an organic light emitting device comprising a first electrode, a second electrode, and a first organic layer disposed between the first electrode and the second electrode, wherein the first organic layer comprises a first organic composition further comprising a mixture of a first compound and a second compound, is disclosed. The method comprises:

providing a substrate having the first electrode disposed thereon;

depositing the first organic composition over the first electrode; and depositing the second electrode over the first organic layer, wherein the first compound has different chemical structure than the second compound;

wherein the first compound is capable of functioning as a hole transporting material in an organic light emitting device at room temperature;

wherein the first compound comprises at least one carbazole group;

wherein the first compound has evaporation temperature T1 of 150 to 350° C.;

wherein the second compound has evaporation temperature T2 of 150 to 350° C.;

wherein the absolute value of T1–T2 is less than 20° C.;

wherein the first compound has a concentration C1 in said mixture, and the first compound has a concentration C2 in a film formed by evaporating the mixture in a vacuum deposition tool at a constant pressure between $1 \times 10^{-6}$ Torr to $1 \times 10^{-9}$ Torr, at a 2 Å/sec deposition rate on a surface positioned at a predefined distance away from the evaporation source of the mixture being evaporated; and wherein the absolute value of (C1–C2)/C1 is less than 5%.

In one embodiment of the method, the first organic composition is deposited in a vacuum thermal evaporation system having a pressure level in the range of $1 \times 10^{-8}$ Torr to $1 \times 10^{-12}$ Torr. In one embodiment, the first organic composition leaves a residue corresponding to less than 5 wt % of the first organic composition's original charge in the vacuum thermal evaporation system's sublimation crucible after the first organic composition is depleted during the deposition of the first organic composition over the first electrode.

In one embodiment of the method, the first compound has the formula (I):

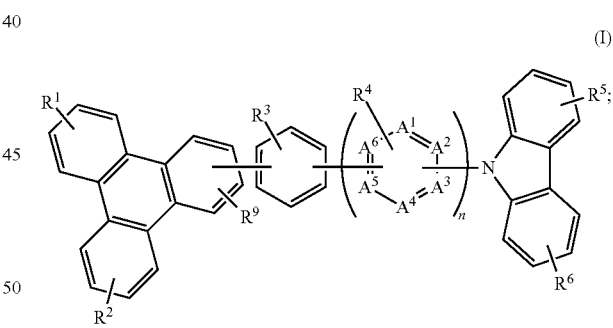

(I)

wherein $R^1$, $R^2$, $R^3$, $R^4$, $R^5$, and $R^6$ each represent mono, di, tri, tetra substitutions, or no substitution;

$R^9$ represents mono, di, tri substitutions, or no substitution;

$R^1$, $R^2$, $R^3$, $R^4$, $R^5$, $R^6$, and $R^9$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof;

$A^1$, $A^2$, $A^3$, $A^4$, $A^5$, and $A^6$ are each independently selected from N or C; and n is an integer from 1 to 20;

wherein the second compound has the formula (II):

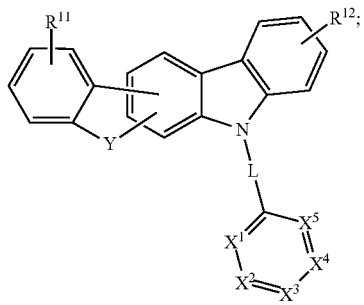

wherein $R^{11}$ and $R^{12}$ each represent mono, di, tri, tetra substitutions, or no substitution;
Y is selected from the group consisting of O, S, Se, NR', and CR"R'";
L is a single bond or comprises an aryl or heteroaryl group having from 5-24 carbon atoms, which is optionally further substituted;
$X^1$, $X^2$, $X^3$, $X^4$, and $X^5$ are each independently selected from group consisting of CR and N;
at least one of $X^1$, $X^2$, $X^3$, $X^4$, and $X^5$ is N; and
R, R', R", and R'" are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof.

In one embodiment of the first device, the organic layer is an emissive layer and the first organic composition is a host material. The organic layer can further comprise a phosphorescent emissive dopant.

In one embodiment of the first device, the phosphorescent emissive dopant is a transition metal complex having at least one ligand selected from the group consisting of:

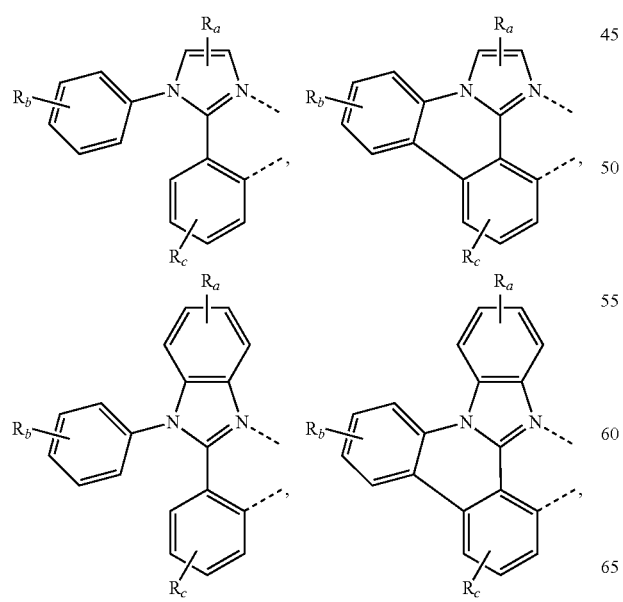

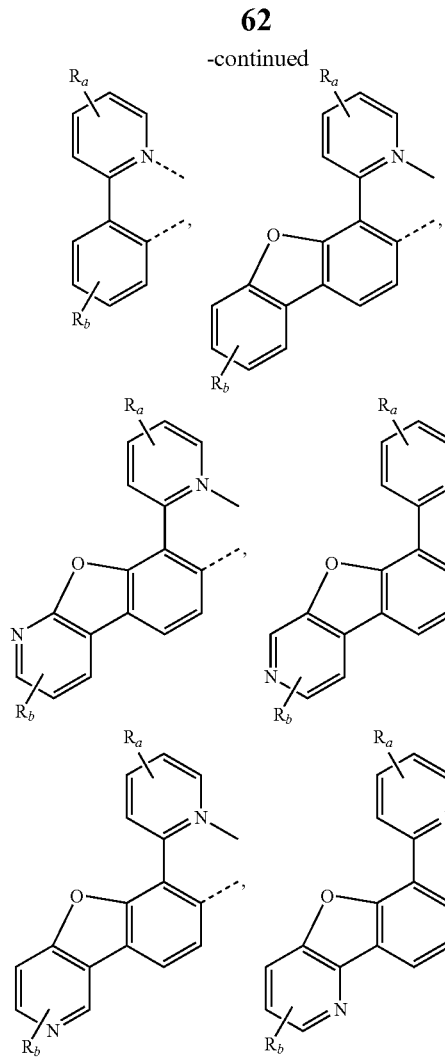

-continued

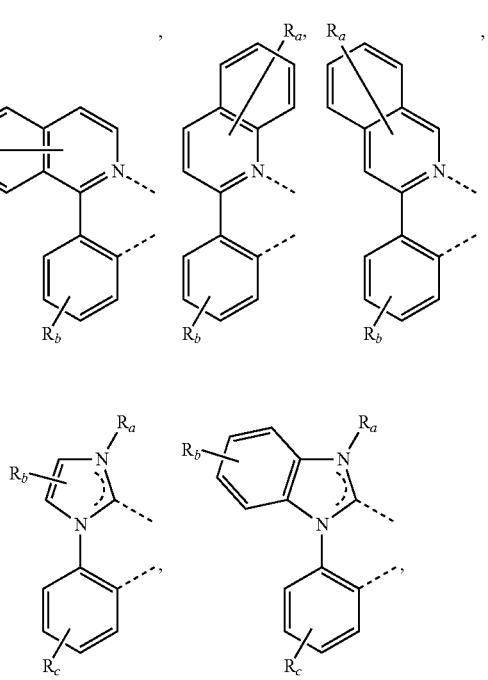

-continued

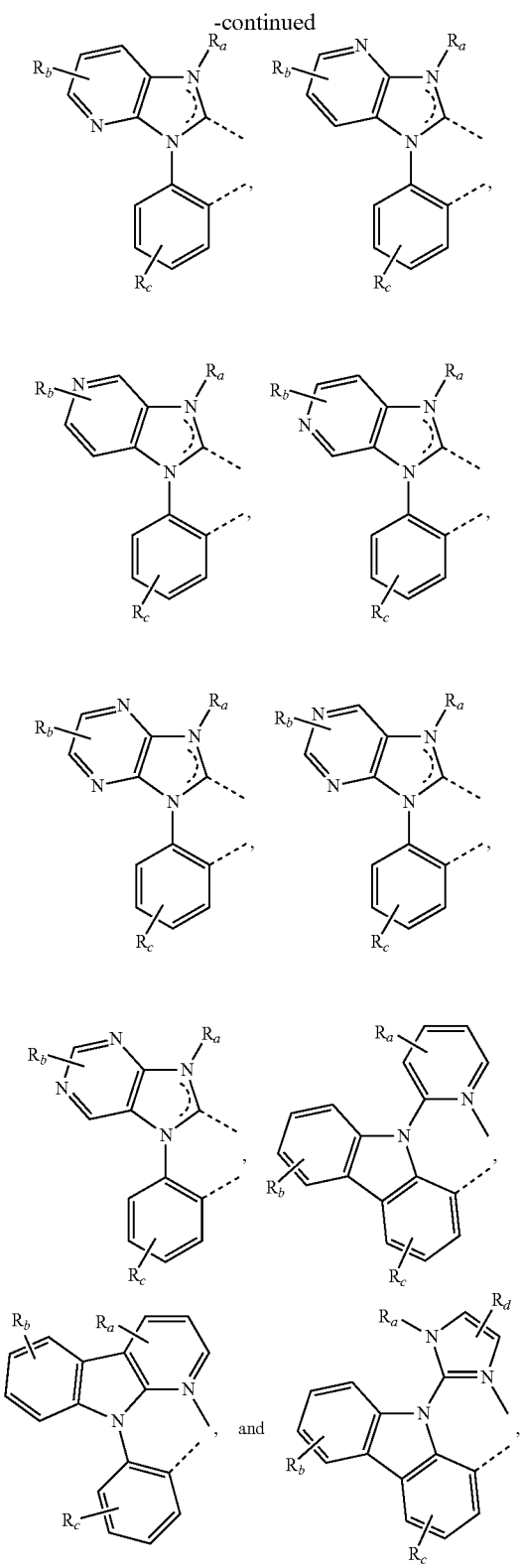

wherein $R_a$, $R_b$, $R_c$, and $R_d$ may represent mono, di, tri, or tetra substitution, or no substitution;
wherein $R_a$, $R_b$, $R_c$, and $R_d$ are independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; and wherein two adjacent substituents of $R_a$, $R_b$, $R_c$, and $R_d$ are optionally joined to form a fused ring or form a multidentate ligand.

In one embodiment of the first device, the organic layer is a blocking layer and the organic composition is a blocking material in the organic layer. In another embodiment, the organic layer is an electron transporting layer and the organic composition is an electron transporting material in the organic layer.

In one embodiment of the first device, the first device is a consumer product. In another embodiment, the first device is an organic light-emitting device. In another embodiment, the first device can comprise a lighting panel.

Synthesis of the Novel Compounds

Synthesis of Compound E2

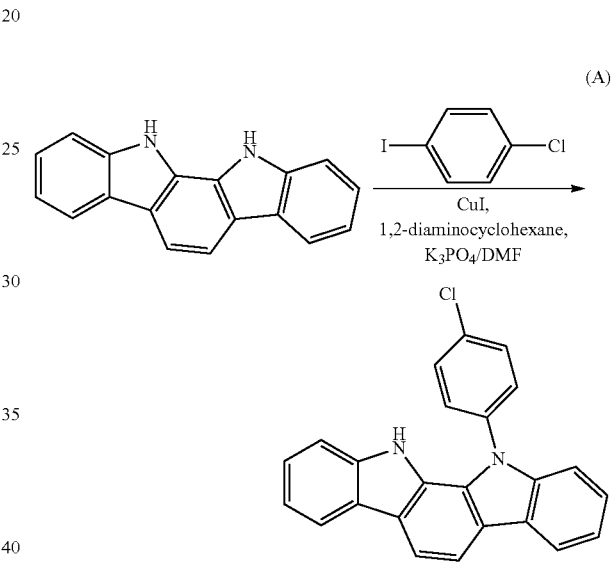

A solution of 11,12-dihydroindolo[2,3-a]carbazole (7.44 g, 29.0 mmol), 1-chloro-4-iodobenzene (20.77 g, 87 mmol), CuI (0.829 g, 4.35 mmol), cyclohexane-1,2-diamine (1.058 ml, 8.71 mmol), and $K_3PO_4$ (15.40 g, 72.6 mmol) in DMF (200 Ml) was heated under nitrogen at 145° C. overnight. After cooling to room temperature, the reaction mixture was diluted with EtOAc and water. The organic layer was isolated, washed with brine and water, dried over $MgSO_4$ and evaporated. The residue was purified by column chromatography on silica gel with hexane/EtOAc (95/5, v/v) as eluent to yield 11-(4-chlorophenyl)-11,12-dihydroindolo[2,3-a]carbazole (7.3 g, 68%) as a solid.

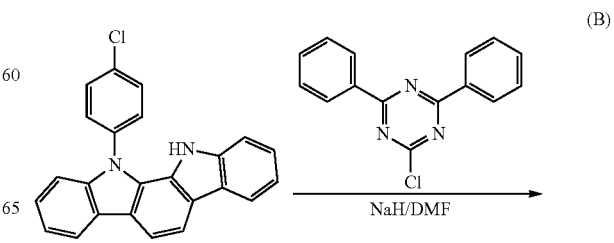

-continued

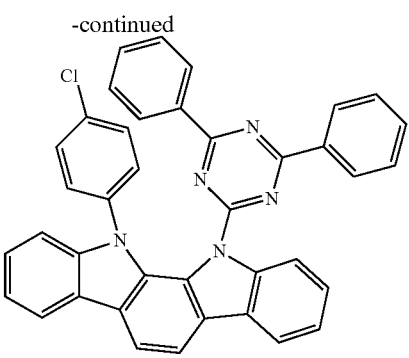

NaH (1.178 g, 29.4 mmol) in one portion was added to a solution of 11-(4-chlorophenyl)-11,12-dihydroindolo[2,3-a]carbazole (7.2 g, 19.63 mmol) in DMF (120 ml), at room temperature. The reaction mixture was stirred at room temperature for 2 hours. Then, 2-chloro-4,6-diphenyl-1,3,5-triazine (6.83 g, 25.5 mmol) was added to the reaction mixture. The reaction mixture was stirred overnight and the resulting solid was collected by filtration. The solid was dissolved in boiling toluene and the insoluble portion was removed by filtration. The filtrate was concentrated and the precipitation was collected by filtration to yield 11-(4-chlorophenyl)-12-(4,6-diphenyl-1,3,5-triazin-2-yl)-11,12-dihydroindolo[2,3-a]carbazole (8.6 g, 73.3% yield) as a yellow powder.

A solution of 11-(4-chlorophenyl)-12-(4,6-diphenyl-1,3,5-triazin-2-yl)-11,12-dihydroindolo[2,3-a]carbazole (4 g, 6.69 mmol), [1,1'-biphenyl]-4-ylboronic acid (3.97 g, 20.06 mmol), Pd$_2$(dba)$_3$ (0.61 g, 0.67 mmol), SPhos (0.55 g, 1.34 mmol), and K$_3$PO$_4$ (8.52 g, 40.1 mmol) in toluene (400 ml), DME (100 ml), and water (20 ml) was refluxed at 110° C. under nitrogen for 6 days. The hot reaction mixture was then filtered through a filter paper. The filtrate was evaporated; the residue was redissolved in boiling toluene, and filtered through a short plug of silica gel. Upon evaporation of the solvent, the solid was triturated with boiling EtOAc, toluene and xylene to yield Compound E2 (2.3 g, 48%) as a yellow solid.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

HIL/HTL:

A hole injecting/transporting material to be used in the present invention is not particularly limited, and any compound may be used as long as the compound is typically (C)

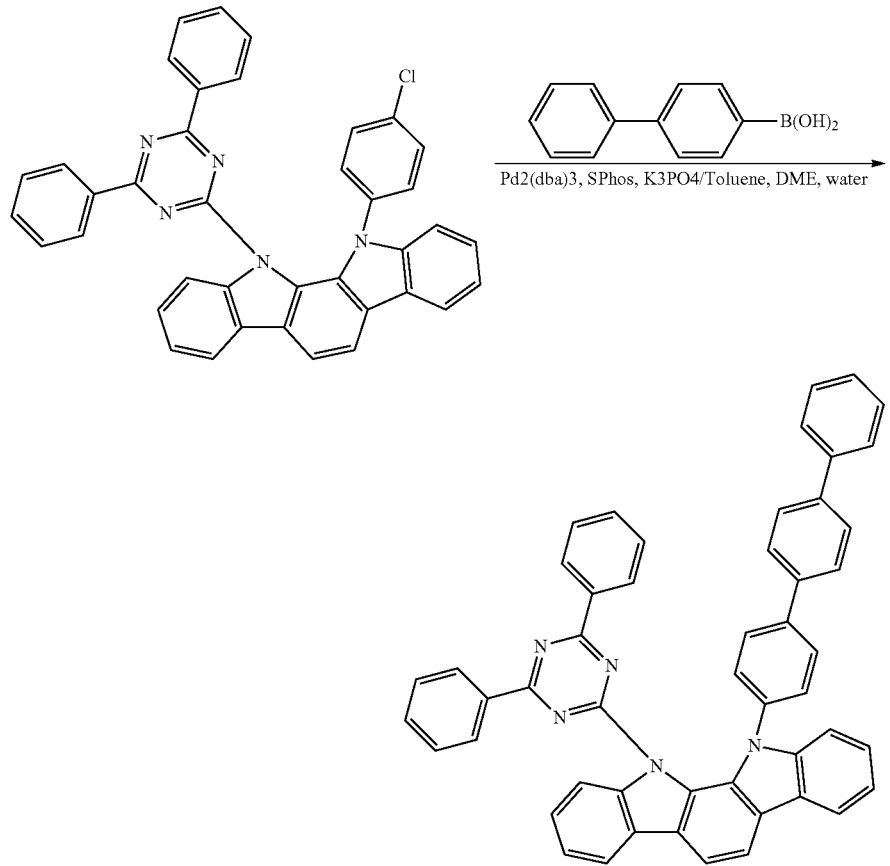

used as a hole injecting/transporting material. Examples of the material include, but not limit to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

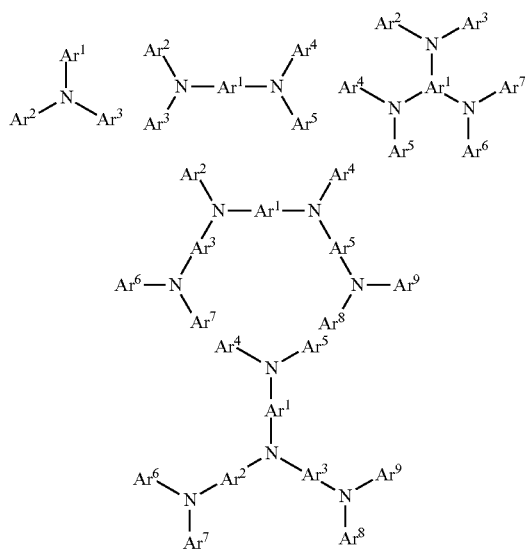

Each of $Ar^1$ to $Ar^9$ is selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Wherein each Ar is further substituted by a substituent selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, $Ar^1$ to $Ar^9$ is independently selected from the group consisting of:

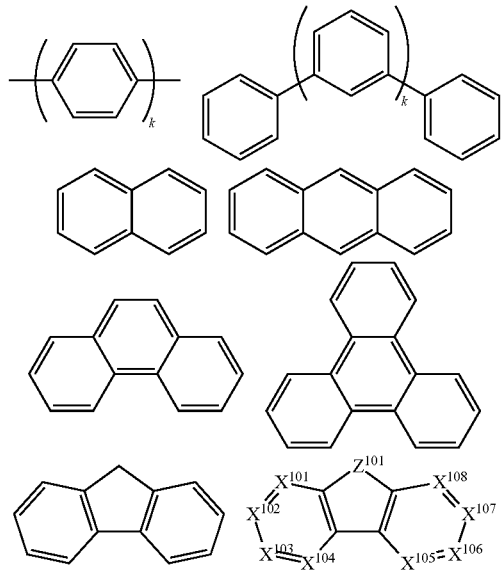

wherein k is an integer from 1 to 20; $X^{101}$ to $X^{108}$ is C (including CH) or N; $Z^{101}$ is $NAr^1$, O, or S; $Ar^1$ has the same group defined above.

Examples of metal complexes used in HIL or HTL include, but not limit to the following general formula:

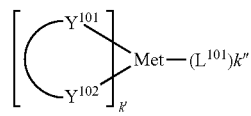

wherein Met is a metal, which can have an atomic weight greater than 40; $(Y^{101}-Y^{102})$ is a bidentate ligand, $Y^{101}$ and $Y^{102}$ are independently selected from C, N, O, P, and S; $L^{101}$ is an ancillary ligand; k' is an integer value from 1 to the maximum number of ligands that may be attached to the metal; and k'+k" is the maximum number of ligands that may be attached to the metal.

In one aspect, $(Y^{101}-Y^{102})$ is a 2-phenylpyridine derivative. In another aspect, $(Y^{101}-Y^{102})$ is a carbene ligand. In another aspect, Met is selected from Ir, Pt, Os, and Zn. In a further aspect, the metal complex has a smallest oxidation potential in solution vs. Fc/Fc couple less than about 0.6 V.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. While the Table below categorizes host materials as preferred for devices that emit various colors, any host material may be used with any dopant so long as the triplet criteria is satisfied.

Examples of metal complexes used as host are preferred to have the following general formula:

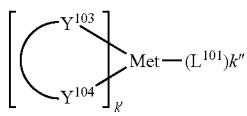

wherein Met is a metal; ($Y^{103}$-$Y^{104}$) is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In one aspect, the metal complexes are:

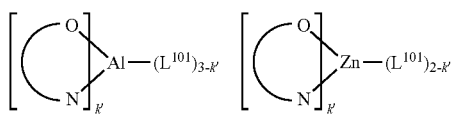

wherein (O—N) is a bidentate ligand, having metal coordinated to atoms O and N.

In another aspect, Met is selected from Ir and Pt. In a further aspect, ($Y^{103}$-$Y^{104}$) is a carbene ligand.

Examples of organic compounds used as host are selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Wherein each group is further substituted by a substituent selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, host compound contains at least one of the following groups in the molecule:

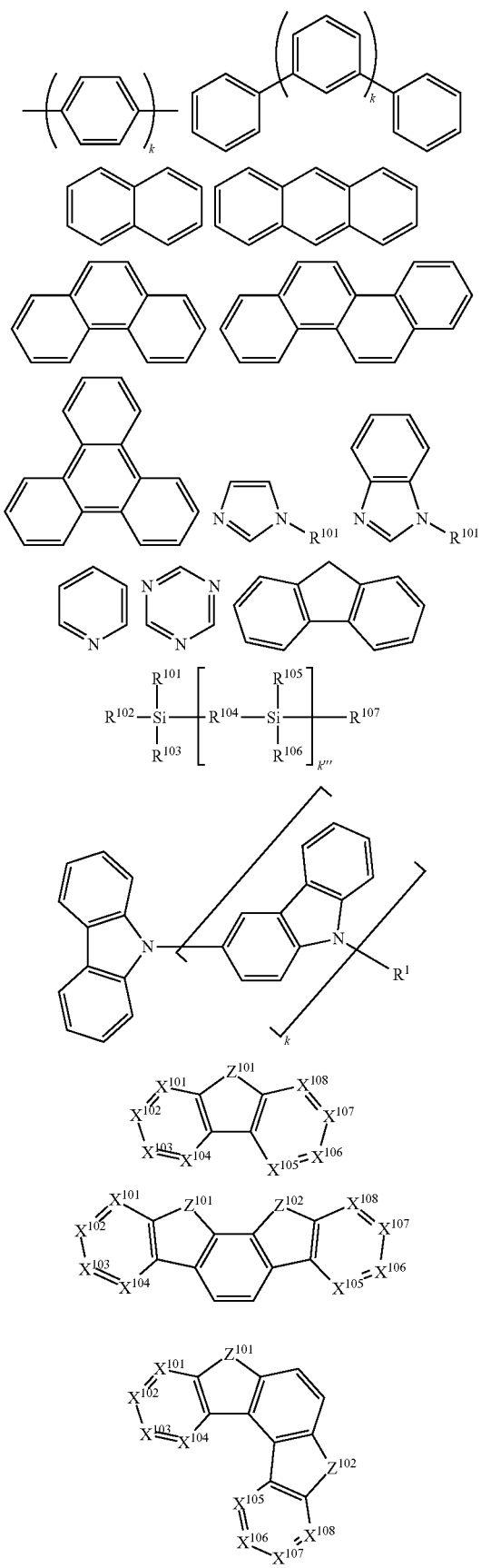

-continued

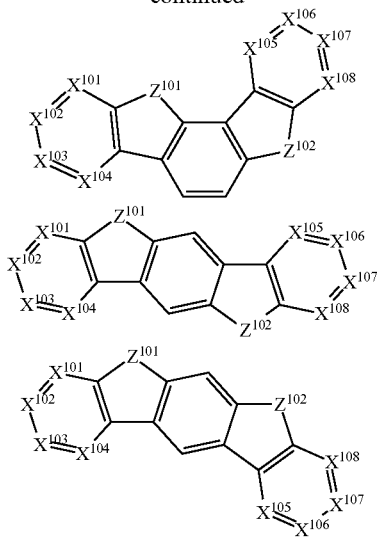

wherein R$^{101}$ to R$^{107}$ is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above. k is an integer from 0 to 20 or 1 to 20; k''' is an integer from 0 to 20. X$^{101}$ to X$^{108}$ is selected from C (including CH) or N.

Z$^{101}$ and Z$^{102}$ is selected from NR$^{101}$, O, or S.

HBL:

A hole blocking layer (HBL) may be used to reduce the number of holes and/or excitons that leave the emissive layer. The presence of such a blocking layer in a device may result in substantially higher efficiencies as compared to a similar device lacking a blocking layer. Also, a blocking layer may be used to confine emission to a desired region of an OLED.

In one aspect, compound used in HBL contains the same molecule or the same functional groups used as host described above.

In another aspect, compound used in HBL contains at least one of the following groups in the molecule:

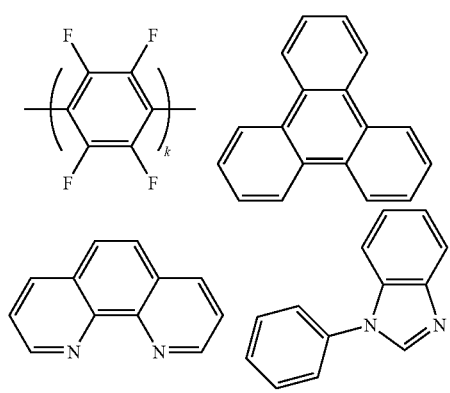

-continued

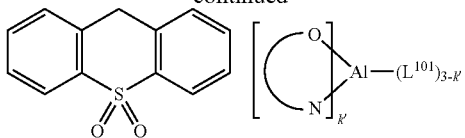

wherein k is an integer from 1 to 20; L$^{101}$ is an another ligand, k' is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

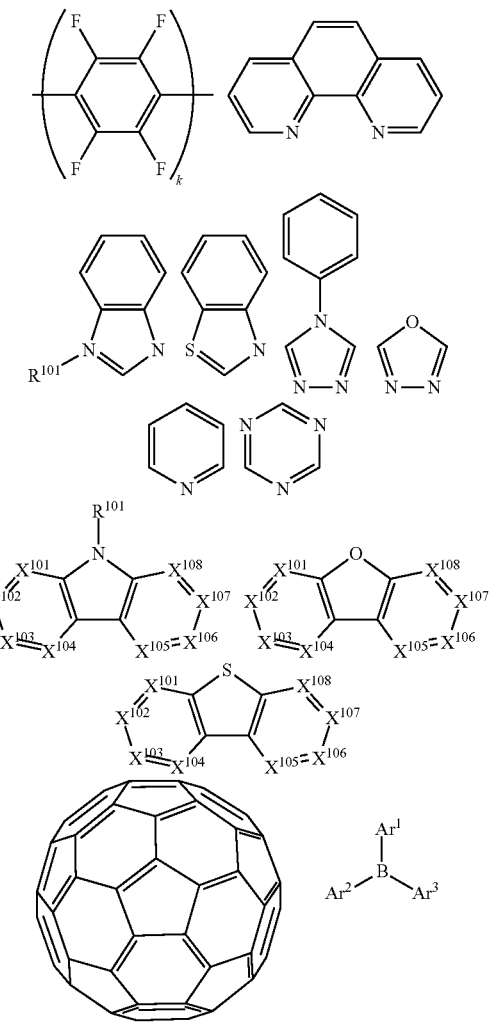

wherein R$^{101}$ is selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above. Ar¹ to Ar³ has the similar definition as Ar's mentioned above. k is an integer from 1 to 20. $X^{101}$ to $X^{108}$ is selected from C (including CH) or N.

In another aspect, the metal complexes used in ETL contains, but not limit to the following general formula:

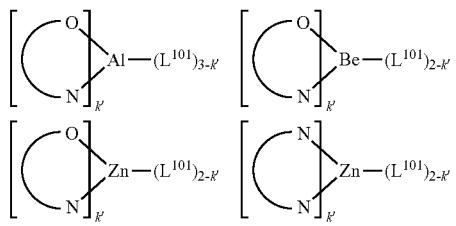

wherein (O—N) or (N—N) is a bidentate ligand, having metal coordinated to atoms O, N or N, N; $L^{101}$ is another ligand; k' is an integer value from 1 to the maximum number of ligands that may be attached to the metal.

In any above-mentioned compounds used in each layer of the OLED device, the hydrogen atoms can be partially or fully deuterated. Thus, any specifically listed substituent, such as, without limitation, methyl, phenyl, pyridyl, etc. encompasses undeuterated, partially deuterated, and fully deuterated versions thereof. Similarly, classes of substituents such as, without limitation, alkyl, aryl, cycloalkyl, heteroaryl, etc. also encompass undeuterated, partially deuterated, and fully deuterated versions thereof.

In addition to and/or in combination with the materials disclosed herein, many hole injection materials, hole transporting materials, host materials, dopant materials, exiton/hole blocking layer materials, electron transporting and electron injecting materials may be used in an OLED. Non-limiting examples of the materials that may be used in an OLED in combination with materials disclosed herein are listed in Table 4 below. Table 4 lists non-limiting classes of materials, non-limiting examples of compounds for each class, and references that disclose the materials.

TABLE 4

| MATERIAL | EXAMPLES OF MATERIAL | PUBLICATIONS |
|---|---|---|
| Hole injection materials | | |
| Phthalocyanine and porphryin compounds | | Appl. Phys. Lett. 69, 2160 (1996) |
| Starburst triarylamines | | J. Lumin. 72-74, 985 (1997) |
| CF$_x$ Fluorohydrocarbon polymer | ─(CH$_x$F$_y$)$_n$─ | Appl. Phys. Lett. 78, 673 (2001) |

TABLE 4-continued
| MATERIAL | EXAMPLES OF MATERIAL | PUBLICATIONS |
|---|---|---|
| Conducting polymers (e.g., PEDOT:PSS, polyaniline, polypthiophene) | 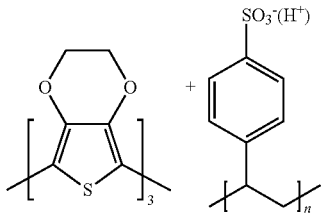 | Synth. Met. 87, 171 (1997) WO2007002683 |
| Phosphonic acid and sliane SAMS | 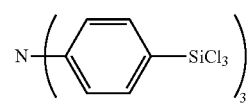 | US20030162053 |
| Triarylamine or polythiophene polymers with conductivity dopants | 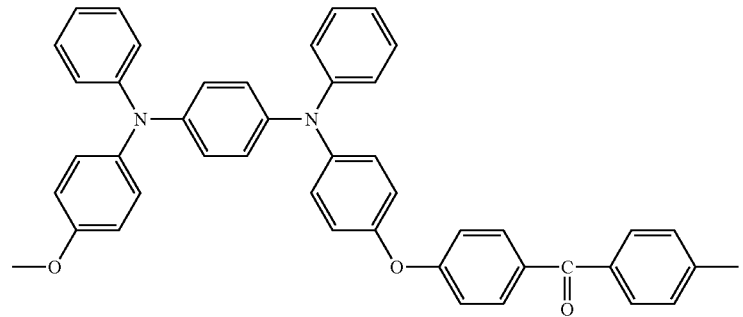 and 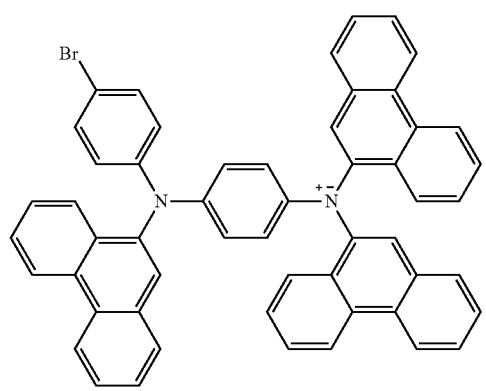 [SMILES: Brc1ccc(N(c2ccc(N(c3cc4ccccc4c4ccccc34)c3cc4ccccc4c4ccccc34)cc2)c2cc3ccccc3c3ccccc23)cc1] 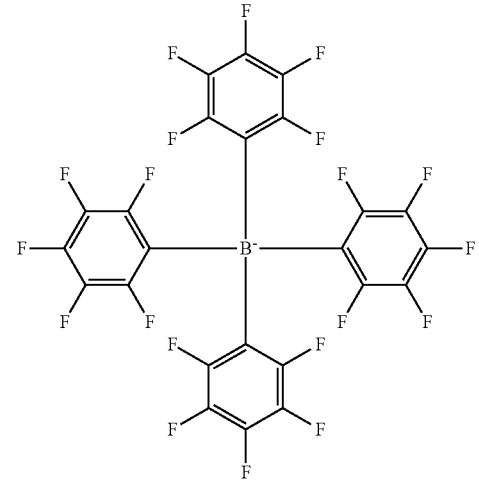 [SMILES: Fc1c(F)c(F)c([B-](c2c(F)c(F)c(F)c(F)c2F)(c2c(F)c(F)c(F)c(F)c2F)c2c(F)c(F)c(F)c(F)c2F)c(F)c1F] | EP1725079A1 |

TABLE 4-continued
| MATERIAL | EXAMPLES OF MATERIAL | PUBLICATIONS |
| --- | --- | --- |
| Organic compounds with conductive inorganic compounds, such as molybdenum and tungsten oxides | 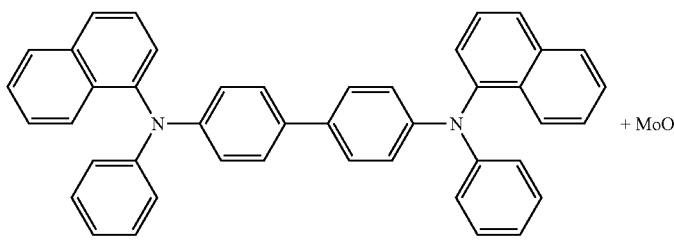 | US20050123751<br>SID Symposium Digest, 37, 923 (2006)<br>WO2009018009 |
| n-type semiconducting organic complexes | 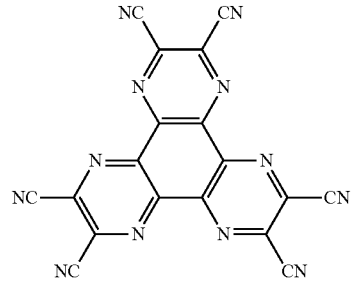 [SMILES: N#Cc1nc2c3nc(C#N)c(C#N)nc3c3nc(C#N)c(C#N)nc3c2nc1C#N] | US20020158242 |
| Metal organometallic complexes | 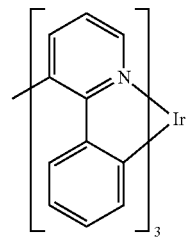 | US20060240279 |
| Cross-linkable compounds | 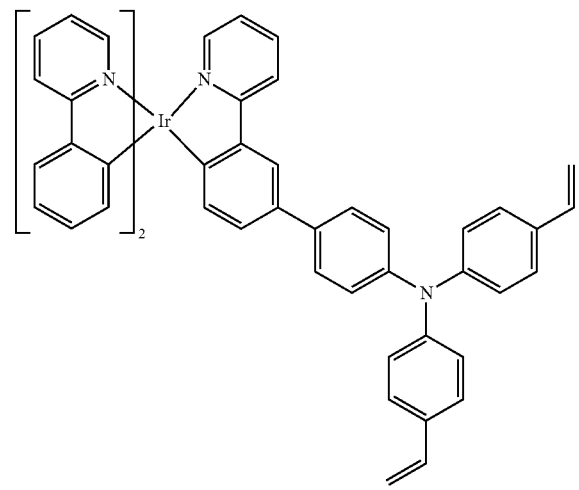 | US20080220265 |

TABLE 4-continued
| MATERIAL | EXAMPLES OF MATERIAL | PUBLICATIONS |
|---|---|---|
| Polythiophene based polymers and copolymers | 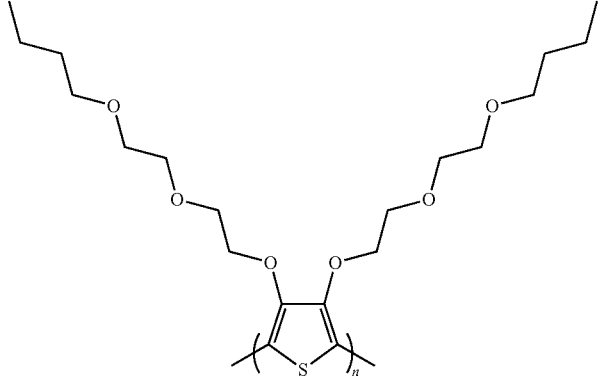 | WO2011075644<br>EP2350216 |
| Hole transporting materials | | |
| Triarylamines (e.g., TPD, α-NPD) | 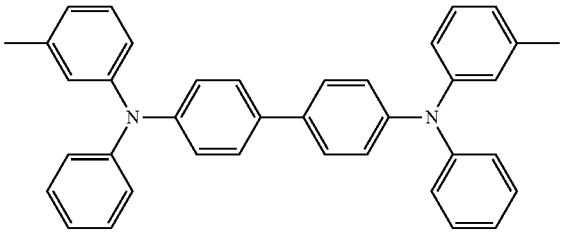 | Appl. Phys. Lett. 51, 913 (1987) |
| | 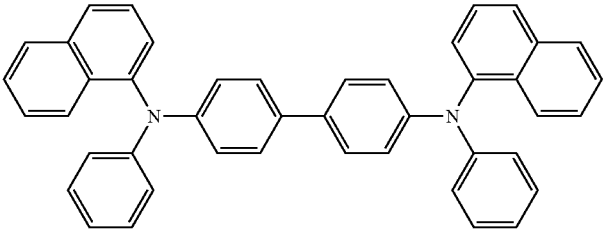 [SMILES: c1ccc(N(c2ccc(-c3ccc(N(c4ccccc4)c4cccc5ccccc45)cc3)cc2)c2cccc3ccccc23)cc1] | U.S. Pat. No. 5,061,569 |
| | 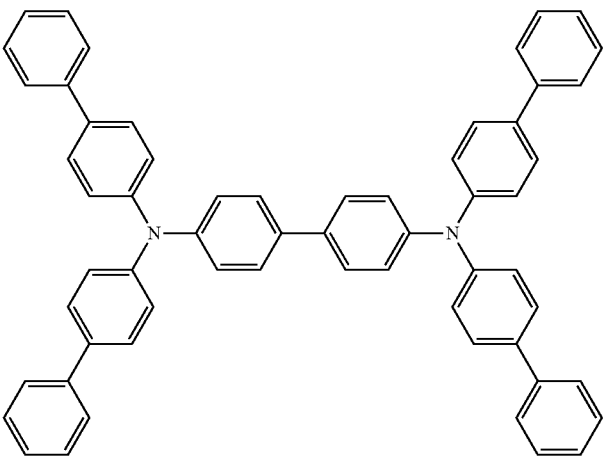 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1] | EP650955 |

TABLE 4-continued
| MATERIAL | EXAMPLES OF MATERIAL | PUBLICATIONS |
|---|---|---|
| | 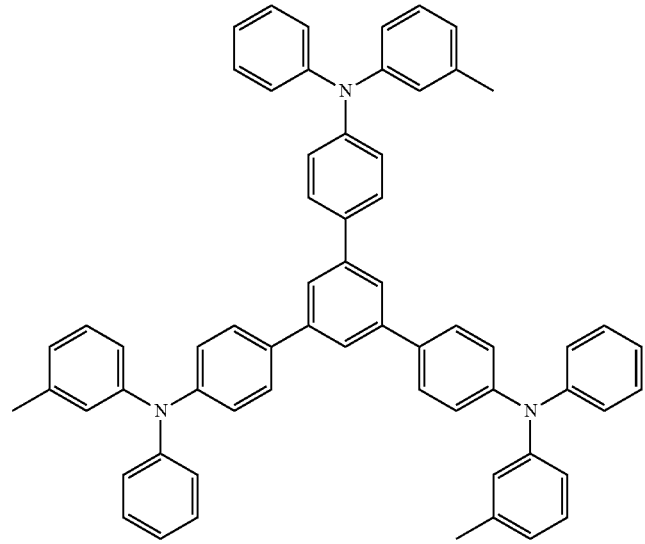 [SMILES: Cc1cccc(N(c2ccccc2)c2ccc(-c3cc(-c4ccc(N(c5ccccc5)c5cccc(C)c5)cc4)cc(-c4ccc(N(c5ccccc5)c5cccc(C)c5)cc4)c3)cc2)c1] | J. Mater. Chem. 3, 319 (1993) |
| | 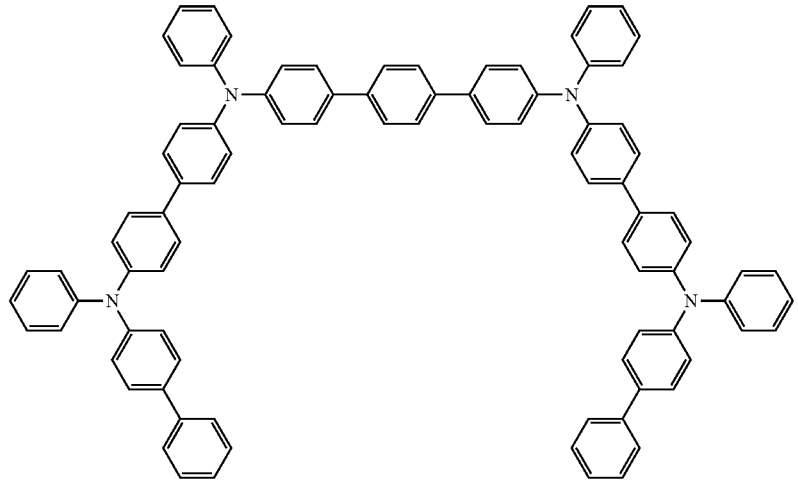 [SMILES: c1ccc(-c2ccc(N(c3ccccc3)c3ccc(-c4ccc(N(c5ccccc5)c5ccc(-c6ccc(-c7ccc(N(c8ccccc8)c8ccc(-c9ccc(N(c%10ccccc%10)c%10ccc(-c%11ccccc%11)cc%10)cc9)cc8)cc7)cc6)cc5)cc4)cc3)cc2)cc1] | Appl. Phys. Lett. 90, 183503 (2007) |
| | 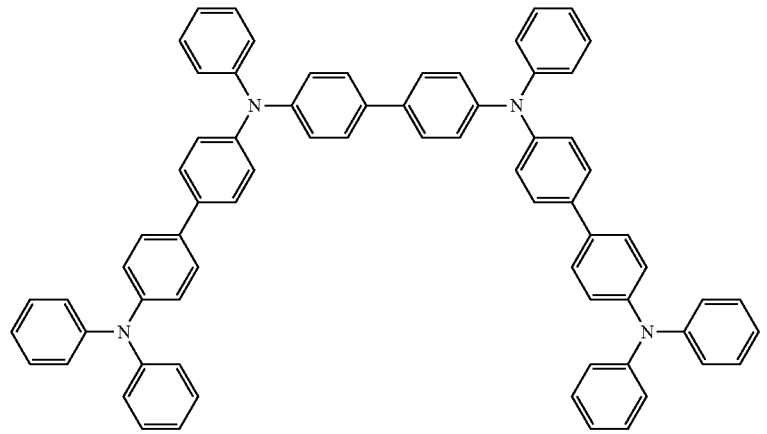 [SMILES: c1ccc(N(c2ccccc2)c2ccc(-c3ccc(N(c4ccccc4)c4ccc(-c5ccc(N(c6ccccc6)c6ccc(-c7ccc(N(c8ccccc8)c8ccccc8)cc7)cc6)cc5)cc4)cc3)cc2)cc1] | Appl. Phys. Lett. 90, 183503 (2007) |

TABLE 4-continued

| MATERIAL | EXAMPLES OF MATERIAL | PUBLICATIONS |
| --- | --- | --- |
| Triaylamine on spirofluorene core | | Synth. Met. 91, 209 (1997) |
| Arylamine carbazole compounds | | Adv. Mater. 6, 677 (1994), US20080124572 |
| Triarylamine with (di)benzothiophene/ (di)benzofuran | | US20070278938, US20080106190 US20110163302 |
| Indolocarbazoles | | Synth. Met, 111, 421 (2000) |

TABLE 4-continued
| MATERIAL | EXAMPLES OF MATERIAL | PUBLICATIONS |
|---|---|---|
| Isoindole compounds | 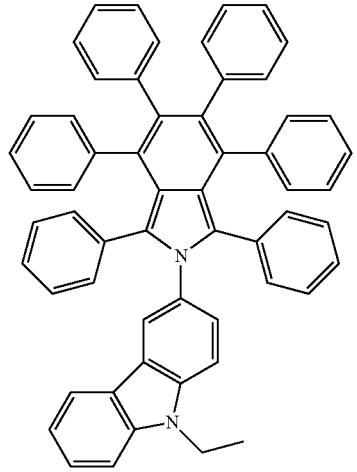 [SMILES: CCn1c2ccccc2c2cc(-n3c(-c4ccccc4)c4c(-c5ccccc5)c(-c5ccccc5)c(-c5ccccc5)c(-c5ccccc5)c4c3-c3ccccc3)ccc21] | Chem. Mater. 15, 3148 (2003) |
| Metal carbene complexes | 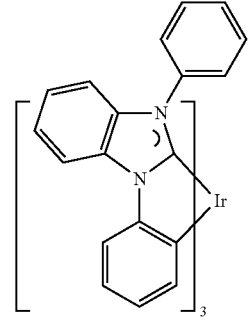 | US20080018221 |
Phosphorescent OLED host materials
Red hosts
| | | |
|---|---|---|
| Arylcarbazoles | 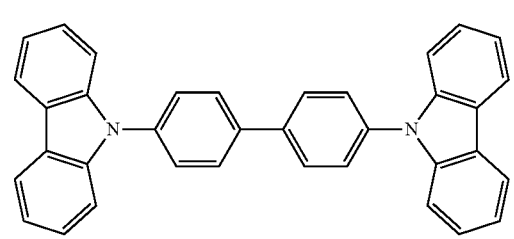 [SMILES: c1ccc2c(c1)c1ccccc1n2-c1ccc(-c2ccc(-n3c4ccccc4c4ccccc43)cc2)cc1] | Appl. Phys. Lett. 78, 1622 (2001) |
| Metal 8-hydroxyquinolates (e.g., Alq$_3$, BAlq) | 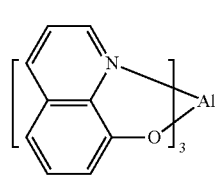 | Nature 395, 151 (1998) |
| | 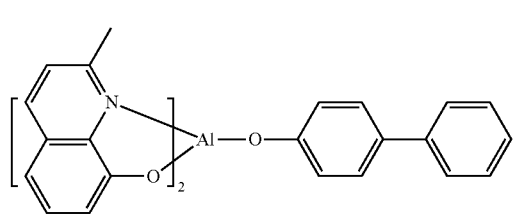 | US20060202194 |

TABLE 4-continued

| MATERIAL | EXAMPLES OF MATERIAL | PUBLICATIONS |
|---|---|---|
| | | WO2005014551 |
| | | WO2006072002 |
| Metal phenoxy-benzothiazole compounds | | Appl. Phys. Lett. 90, 123509 (2007) |
| Conjugated oligomers and polymers (e.g., polyfluorene) | | Org. Electron. 1, 15 (2000) |
| Aromatic fused rings | | WO2009066779, WO2009066778, WO2009063833, US20090045731, US20090045730, WO2009008311, US20090008605, US20090009065 |
| Zinc complexes | | WO2010056066 |

TABLE 4-continued
| MATERIAL | EXAMPLES OF MATERIAL | PUBLICATIONS |
|---|---|---|
| Chrysene based compounds | 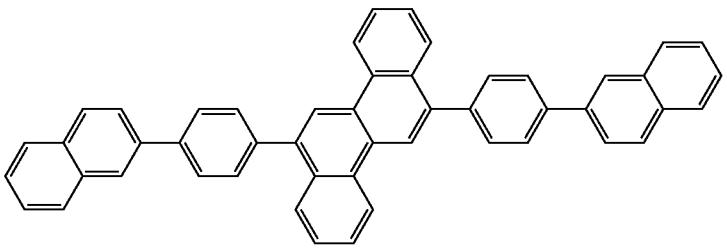 [SMILES: c1ccc2cc(-c3ccc(-c4cc5c6ccccc6c(-c6ccc(-c7ccc8ccccc8c7)cc6)cc5c5ccccc45)cc3)ccc2c1] | WO2011086863 |
| Green hosts | | |
| Arylcarbazoles | 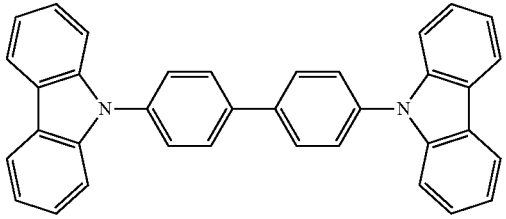 [SMILES: c1ccc2c(c1)c1ccccc1n2-c1ccc(-c2ccc(-n3c4ccccc4c4ccccc43)cc2)cc1] | Appl. Phys, Lett. 78, 1622 (2001) |
| | 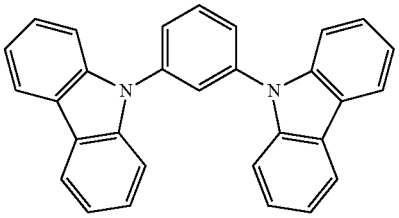 [SMILES: c1cc(-n2c3ccccc3c3ccccc32)cc(-n2c3ccccc3c3ccccc32)c1] | US20030175553 |
| | 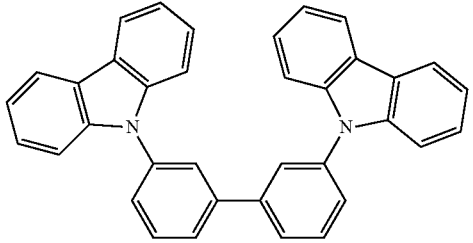 [SMILES: c1cc(-c2cccc(-n3c4ccccc4c4ccccc43)c2)cc(-n2c3ccccc3c3ccccc32)c1] | WO2001039234 |
| Aryltriphenylene compounds | 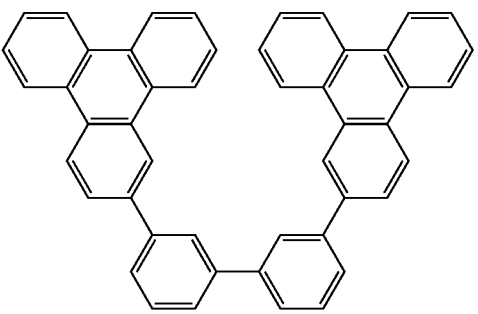 [SMILES: c1cc(-c2cccc(-c3ccc4c5ccccc5c5ccccc5c4c3)c2)cc(-c2ccc3c4ccccc4c4ccccc4c3c2)c1] | US20060280965 |

TABLE 4-continued
| MATERIAL | EXAMPLES OF MATERIAL | PUBLICATIONS |
|---|---|---|
| | 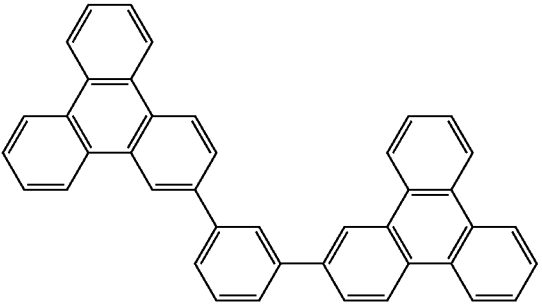 [SMILES: c1cc(-c2ccc3c4ccccc4c4ccccc4c3c2)cc(-c2ccc3c4ccccc4c4ccccc4c3c2)c1] | US20060280965 |
| | 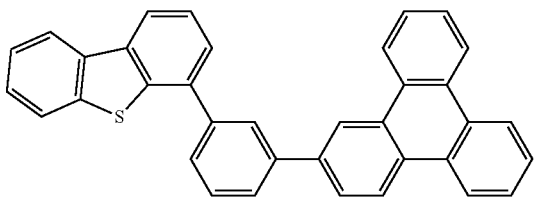 [SMILES: c1cc(-c2ccc3c4ccccc4c4ccccc4c3c2)cc(-c2cccc3c2sc2ccccc23)c1] | WO2009021126 |
| Poly-fused heteroaryl compounds | 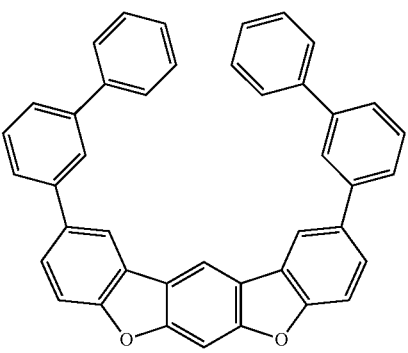 [SMILES: c1ccc(-c2cccc(-c3ccc4oc5cc6oc7ccc(-c8cccc(-c9ccccc9)c8)cc7c6cc5c4c3)c2)cc1] | US20090309488<br>US20090302743<br>US20100012931 |
| Donor acceptor type molecules | 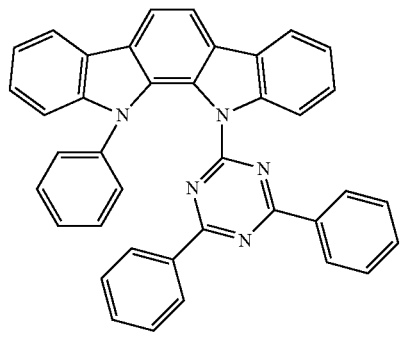 [SMILES: c1ccc(-c2nc(-c3ccccc3)nc(-n3c4ccccc4c4ccc5c6ccccc6n(-c6ccccc6)c5c43)n2)cc1] | WO2008056746 |
| | 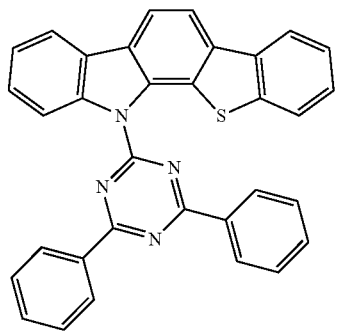 [SMILES: c1ccc(-c2nc(-c3ccccc3)nc(-n3c4ccccc4c4ccc5c6ccccc6sc5c43)n2)cc1] | WO2010107244 |

TABLE 4-continued

| MATERIAL | EXAMPLES OF MATERIAL | PUBLICATIONS |
| --- | --- | --- |
| Aza-carbazole/ DBT/DBF | | JP2008074939 |
| | | US20100187984 |
| Polymers (e.g., PVK) | | Appl. Phys. Lett. 77, 2280 (2000) |
| Spirofluorene compounds | | WO2004093207 |
| Metal phenoxy-benzooxazole compounds | | WO2005089025 |

TABLE 4-continued

| MATERIAL | EXAMPLES OF MATERIAL | PUBLICATIONS |
|---|---|---|
| | | WO2006132173 |
| | | JP200511610 |
| Spirofluorene-carbazole compounds | | JP2007254297 |
| | | JP2007254297 |
| Indolocabazoles | | WO2007063796 |

TABLE 4-continued

| MATERIAL | EXAMPLES OF MATERIAL | PUBLICATIONS |
|---|---|---|
| | | WO2007063754 |
| 5-member ring electron deficient heterocycles (e.g., triazole, oxadiazole) | | J. Appl. Phys. 90, 5048 (2001) |
| | | WO2004107822 |
| Tetraphenylene complexes | | US20050112407 |
| Metal phenoxypyridine compounds | | WO2005030900 |

TABLE 4-continued

| MATERIAL | EXAMPLES OF MATERIAL | PUBLICATIONS |
|---|---|---|
| Metal coordination complexes (e.g., Zn, Al with N^N ligands) | | US20040137268, US20040137267 |

Blue hosts

| | | |
|---|---|---|
| Arylcarbazoles | | Appl. Phys, Lett, 82, 2422 (2003) |
| | | US20070190359 |
| Dibenzothiophene/ Dibenzofuran-carbazole compounds | | WO2006114966, US20090167162 |
| | | US20090167162 |
| | | WO2009086028 |

TABLE 4-continued
| MATERIAL | EXAMPLES OF MATERIAL | PUBLICATIONS |
|---|---|---|
| | 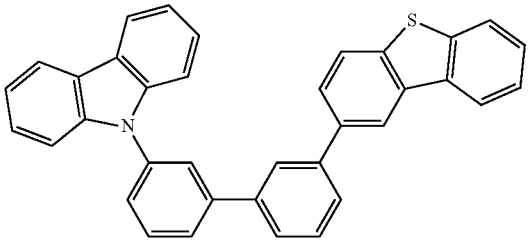 [SMILES: c1cc(-c2cccc(-n3c4ccccc4c4ccccc43)c2)cc(-c2ccc3sc4ccccc4c3c2)c1] | US20090030202, US20090017330 |
| | 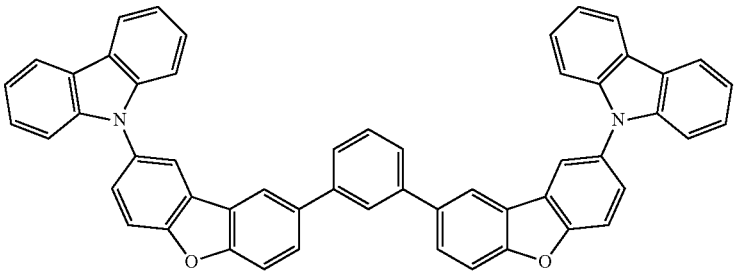 [SMILES: c1cc(-c2ccc3oc4ccc(-n5c6ccccc6c6ccccc65)cc4c3c2)cc(-c2ccc3oc4ccc(-n5c6ccccc6c6ccccc65)cc4c3c2)c1] | US20100084966 |
| Silicon aryl compounds | 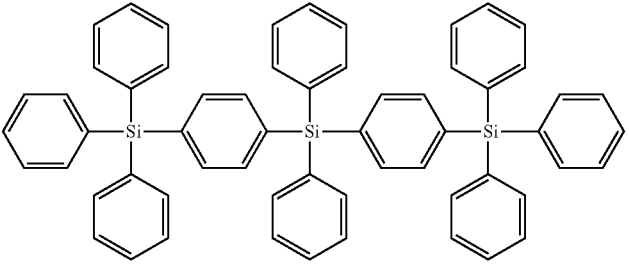 [SMILES: c1ccc([Si](c2ccccc2)(c2ccccc2)c2ccc([Si](c3ccccc3)(c3ccccc3)c3ccc([Si](c4ccccc4)(c4ccccc4)c4ccccc4)cc3)cc2)cc1] | US20050238919 |
| | 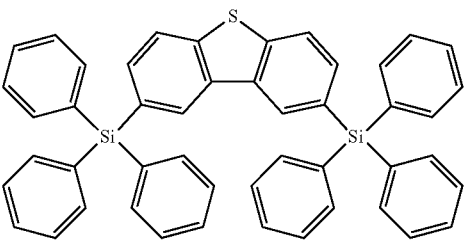 [SMILES: c1ccc([Si](c2ccccc2)(c2ccccc2)c2ccc3sc4ccc([Si](c5ccccc5)(c5ccccc5)c5ccccc5)cc4c3c2)cc1] | WO2009003898 |
| Silicon/Germanium aryl compounds | 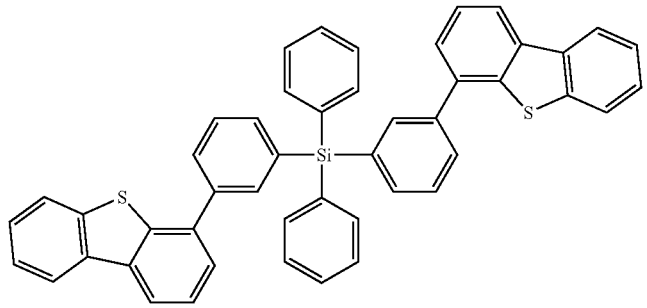 [SMILES: c1ccc([Si](c2ccccc2)(c2cccc(-c3cccc4c3sc3ccccc34)c2)c2cccc(-c3cccc4c3sc3ccccc34)c2)cc1] | EP2034538A |
| Aryl benzoyl ester | 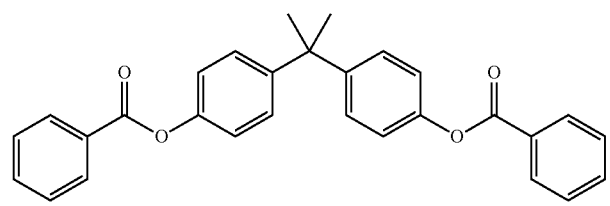 [SMILES: CC(C)(c1ccc(OC(=O)c2ccccc2)cc1)c1ccc(OC(=O)c2ccccc2)cc1] | WO2006100298 |

TABLE 4-continued
| MATERIAL | EXAMPLES OF MATERIAL | PUBLICATIONS |
|---|---|---|
| Carbazole linked by non-conjugated groups | 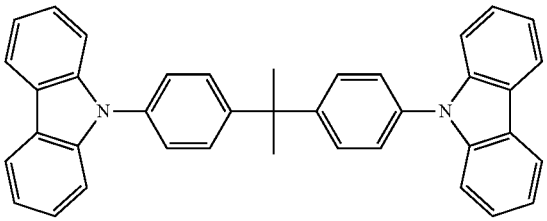 [SMILES: CC(C)(c1ccc(-n2c3ccccc3c3ccccc32)cc1)c1ccc(-n2c3ccccc3c3ccccc32)cc1] | US20040115476 |
| Aza-carbazoles | 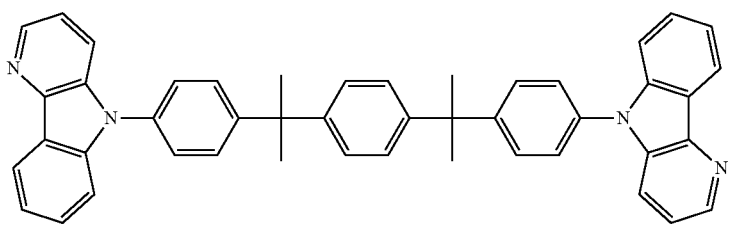 [SMILES: CC(C)(c1ccc(-n2c3ccccc3c3ncccc32)cc1)c1ccc(C(C)(C)c2ccc(-n3c4ccccc4c4ncccc43)cc2)cc1] | US20060121308 |
| High triplet metal organometallic complex | 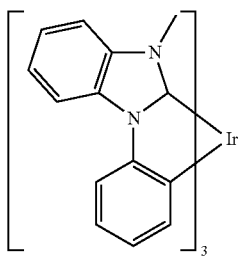 | U.S. Pat. No. 7,154,114 |
| Phosphorescent dopants | | |
| Red dopants | | |
| Heavy metal porphyrins (e.g., PtOEP) | 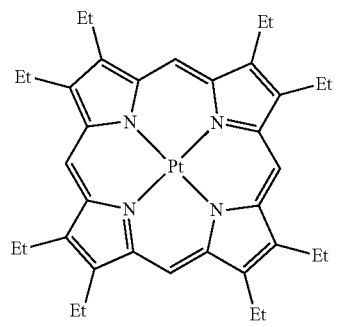 | Nature 395, 151 (1998) |
| Iridium(III) organometallic complexes | 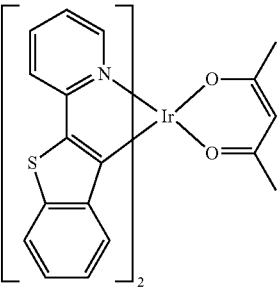 | Appl. Phys. Lett. 78, 1622 (2001) |

TABLE 4-continued

| MATERIAL | EXAMPLES OF MATERIAL | PUBLICATIONS |
|---|---|---|
| | | US20030072964 |
| | | US20030072964 |
| | | US20060202194 |
| | | US20060202194 |
| | | US20070087321 |

TABLE 4-continued

| MATERIAL | EXAMPLES OF MATERIAL | PUBLICATIONS |
|---|---|---|
| | | US20080261076
US20100090591 |
| | | US20070087321 |
| | | Adv. Mater.
19, 739 (2007) |
| | | WO2009100991 |
| | | WO2008101842 |

TABLE 4-continued
| MATERIAL | EXAMPLES OF MATERIAL | PUBLICATIONS |
|---|---|---|
| | 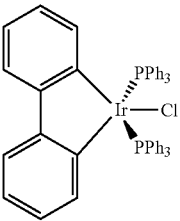 | U.S. Pat. No. 7,232,618 |
| Platinum(II) organometallic complexes | 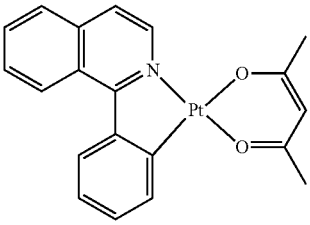 | WO2003040257 |
| | 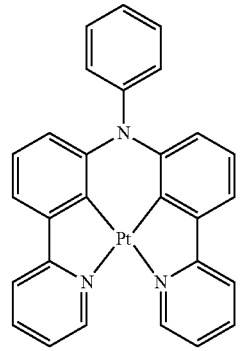 | US20070103060 |
| Osminum(III) complexes | 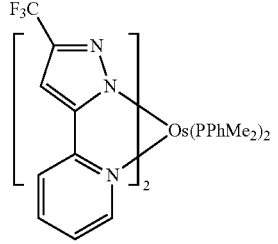 | Chem. Mater. 17, 3532 (2005) |
| Ruthenium(II) complexes | 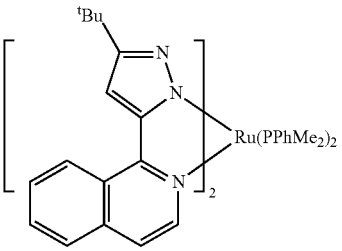 | Adv. Mater. 17, 1059 (2005) |
| Rhenium (I), (II), and (III) complexes | 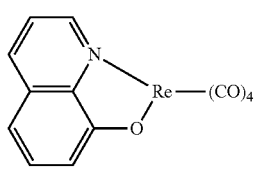 | US20050244673 |

TABLE 4-continued
| MATERIAL | EXAMPLES OF MATERIAL | PUBLICATIONS |
|---|---|---|
| | Green dopants | |
| Iridium(III) organometallic complexes | 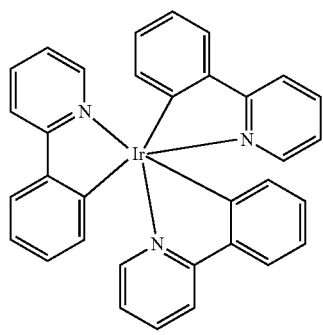 and its derivatives | Inorg. Chem. 40, 1704 (2001) |
| | 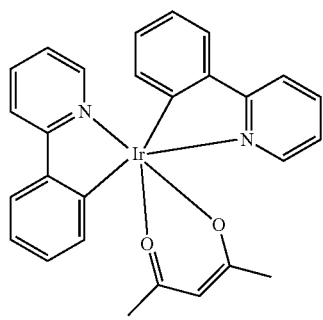 | US20020034656<br><br>U.S. Pat. No. 7,332,232 |
| | 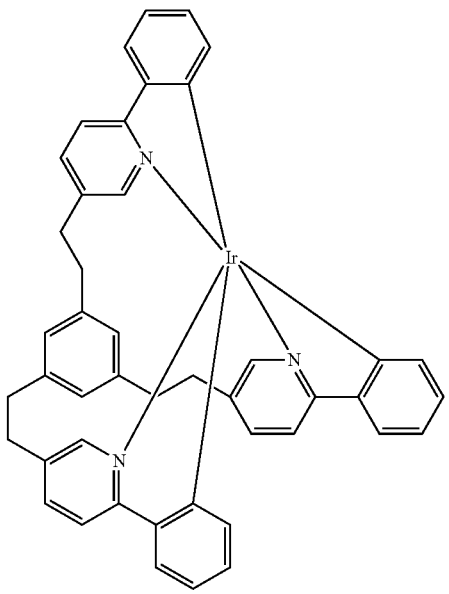 | |

TABLE 4-continued

| MATERIAL | EXAMPLES OF MATERIAL | PUBLICATIONS |
|---|---|---|
| | | US20090108737 |
| | | WO2010028151 |
| | | EP1841834B |
| | | US20060127696 |
| | | US20090039776 |

TABLE 4-continued
| MATERIAL | EXAMPLES OF MATERIAL | PUBLICATIONS |
|---|---|---|
| | 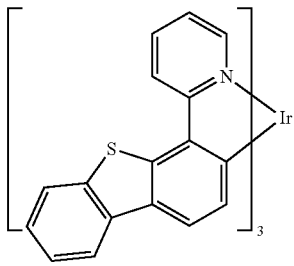 | U.S. Pat. No. 6,921,915 |
| | 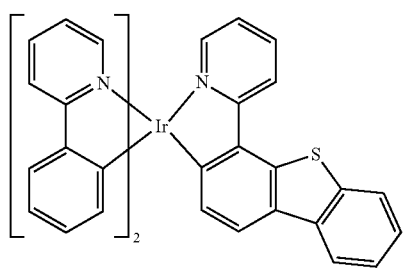 | US20100244004 |
| | 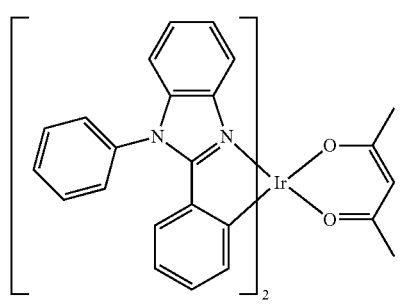 | U.S. Pat. No. 6,687,266 |
| | 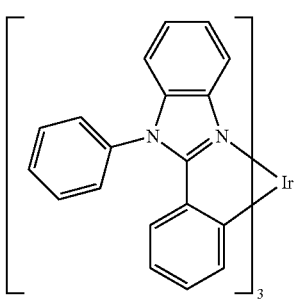 | Chem. Mater. 16, 2480 (2004) |
| | 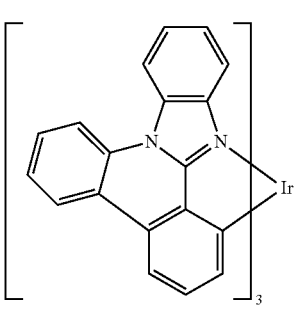 | US20070190359 |

TABLE 4-continued

| MATERIAL | EXAMPLES OF MATERIAL | PUBLICATIONS |
|---|---|---|
| | | US20060008670 JP2007123392 |
| | | WO2010086089, WO2011044988 |
| | | Adv. Mater. 16, 2003 (2004) |
| | | Angew. Chem. Int. Ed. 2006, 45, 7800 |
| | | WO2009050290 |
| | | US20090165846 |

TABLE 4-continued
| MATERIAL | EXAMPLES OF MATERIAL | PUBLICATIONS |
|---|---|---|
| | 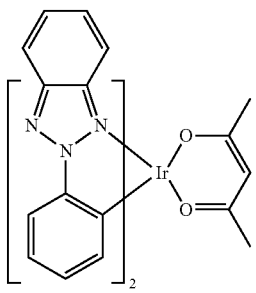 | US20080015355 |
| | 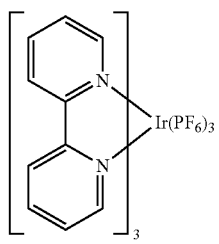 | US20010015432 |
| | 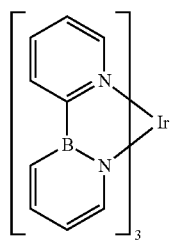 | US20100295032 |
| Monomer for polymeric metal organometallic compounds | 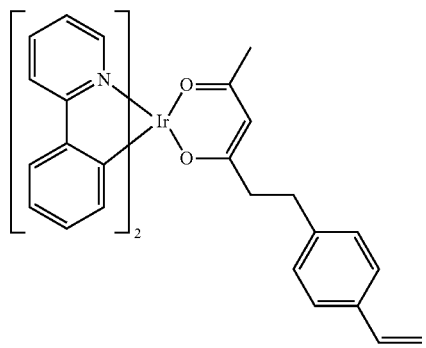 | U.S. Pat. No. 7,250,226, U.S. Pat. No. 7,396,598 |
| Pt(II) organometallic complexes, including polydentated ligands | 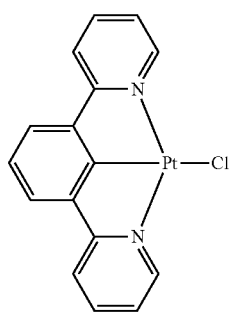 | Appl. Phys. Lett. 86, 153505 (2005) |

TABLE 4-continued
| MATERIAL | EXAMPLES OF MATERIAL | PUBLICATIONS |
|---|---|---|
| | 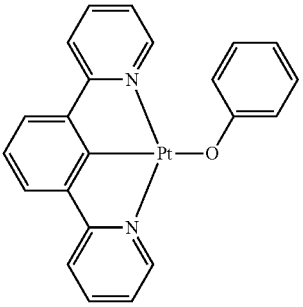 | Appl. Phys. Lett. 86, 153505 (2005) |
| | 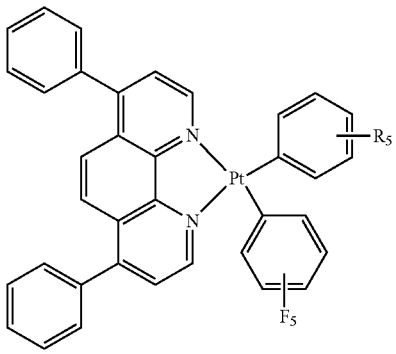 | Chem. Lett. 34, 592 (2005) |
| | 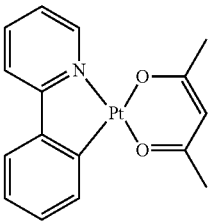 | WO2002015645 |
| | 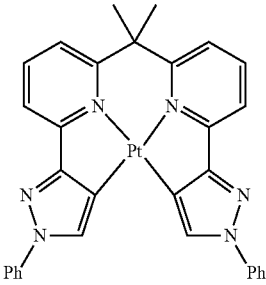 | US20060263635 |
| | 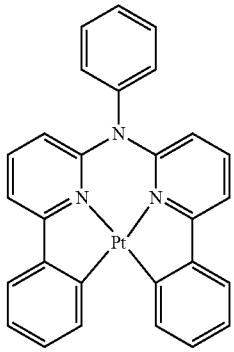 | US20060182992 US20070103060 |

TABLE 4-continued

| MATERIAL | EXAMPLES OF MATERIAL | PUBLICATIONS |
|---|---|---|
| Cu complexes | | WO2009000673 |
| | | US20070111026 |
| Gold complexes | | Chem. Commun. 2906 (2005) |
| Rhenium(III) complexes | | Inorg. Chem. 42, 1248 (2003) |

TABLE 4-continued

| MATERIAL | EXAMPLES OF MATERIAL | PUBLICATIONS |
|---|---|---|
| Osmium(II) complexes | | U.S. Pat. No. 7,279,704 |
| Deuterated organometallic complexes | | US20030138657 |
| Organometallic complexes with two or more metal centers | | US20030152802 |
| | | U.S. Pat. No. 7,090,928 |

TABLE 4-continued

| MATERIAL | EXAMPLES OF MATERIAL | PUBLICATIONS |
| --- | --- | --- |
| Blue dopants | | |
| Iridium(III) organometallic complexes | | WO2002002714 |
| | | WO2006009024 |
| | | US20060251923<br>US20110057559<br>US20110204333 |
| | | U.S. Pat. No. 7,393,599,<br>WO2006056418,<br>US20050260441,<br>WO2005019373 |
| | | U.S. Pat. No. 7,534,505 |
| | | WO2011051404 |

TABLE 4-continued
| MATERIAL | EXAMPLES OF MATERIAL | PUBLICATIONS |
|---|---|---|
| | 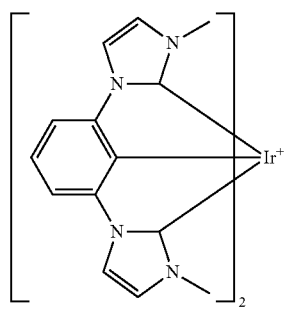 | U.S. Pat. No. 7,445,855 |
| | 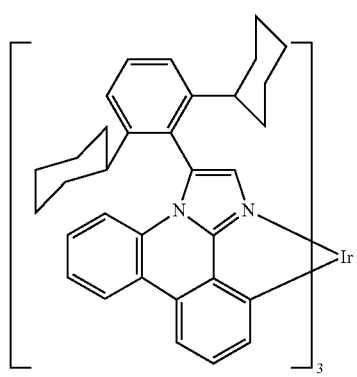 | US20070190359, US20080297033 US20100148663 |
| | 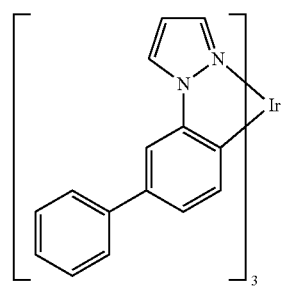 | U.S. Pat. No. 7,338,722 |
| | 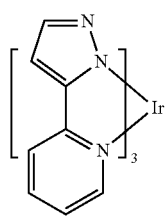 | US20020134984 |
| | 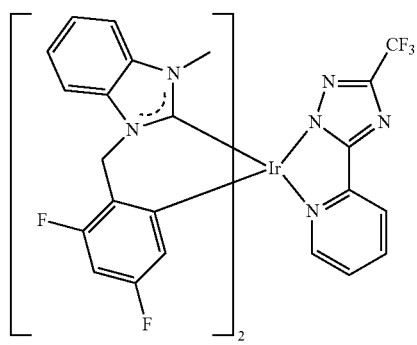 | Angew. Chem. Int. Ed. 47, 4542 (2008) |

TABLE 4-continued

| MATERIAL | EXAMPLES OF MATERIAL | PUBLICATIONS |
|---|---|---|
| | | Chem. Mater. 18, 5119 (2006) |
| | | Inorg. Chem, 46, 4308 (2007) |
| | | WO2005123873 |
| | | WO2005123873 |
| | | WO2007004380 |

TABLE 4-continued

| MATERIAL | EXAMPLES OF MATERIAL | PUBLICATIONS |
|---|---|---|
| | (Ir complex structure) | WO2006082742 |
| Osmium(II) complexes | (Os benzimidazole complex structure) | U.S. Pat. No. 7,279,704 |
| | $[Os(PPh_3)(\text{pyrazolyl-pyridine})_2]$ | Organometallics 23, 3745 (2004) |
| Gold complexes | $Ph_2P\text{-}CH_2\text{-}PPh_2$ bridged $Au\text{-}Cl / Au\text{-}Cl$ | Appl. Phys. Lett. 74, 1361 (1999) |
| Platinum(II) complexes | (Pt complex with thiophene, pyrimidine and pyrazolylborate) | WO2006098120, WO2006103874 |

TABLE 4-continued

| MATERIAL | EXAMPLES OF MATERIAL | PUBLICATIONS |
|---|---|---|
| Pt tetradentate complexes with at least one metal-carbene bond | 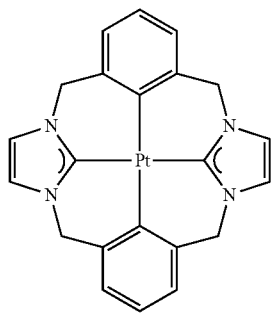 | U.S. Pat. No. 7,655,323 |
| Exciton/hole blocking layer materials | | |
| Bathocuprine compounds (e.g., BCP, BPhen) | 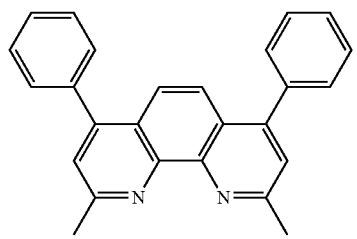 [SMILES: Cc1cc(-c2ccccc2)c2ccc3c(-c4ccccc4)cc(C)nc3c2n1] | Appl. Phys. Lett. 75, 4 (1999) |
| | 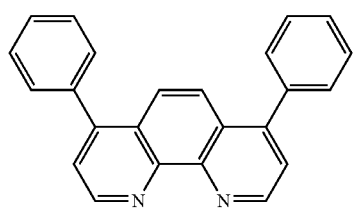 [SMILES: c1ccc(-c2ccnc3c2ccc2c(-c4ccccc4)ccnc23)cc1] | Appl. Phys. Lett. 79, 449 (2001) |
| Metal 8-hydroxyquinolates (e.g., BAlq) | 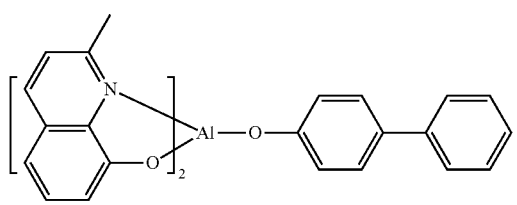 | Appl. Phys. Lett. 81, 162 (2002) |
| 5-member ring electron deficient heterocycles such as triazole, oxadiazole, imidazole, benzoimidazole | 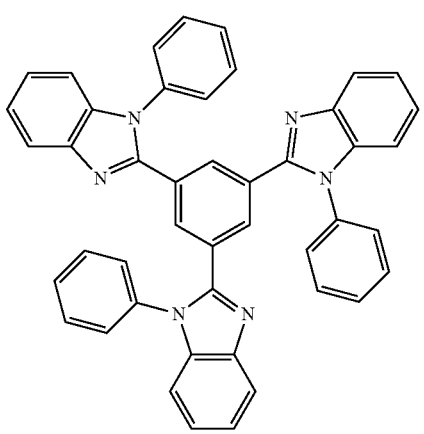 [SMILES: c1ccc(-n2c(-c3cc(-c4nc5ccccc5n4-c4ccccc4)cc(-c4nc5ccccc5n4-c4ccccc4)c3)nc3ccccc32)cc1] | Appl. Phys. Lett. 81, 162 (2002) |

TABLE 4-continued

| MATERIAL | EXAMPLES OF MATERIAL | PUBLICATIONS |
|---|---|---|
| Triphenylene compounds | | US20050025993 |
| Fluorinated aromatic compounds | | Appl. Phys. Lett. 79, 156 (2001) |
| Phenothiazine-S-oxide | | WO2008132085 |
| Silylated five-membered nitrogen, oxygen, sulfur or phosphorus dibenzo-heterocycles | | WO2010079051 |

TABLE 4-continued
| MATERIAL | EXAMPLES OF MATERIAL | PUBLICATIONS |
|---|---|---|
| Aza-carbazoles | 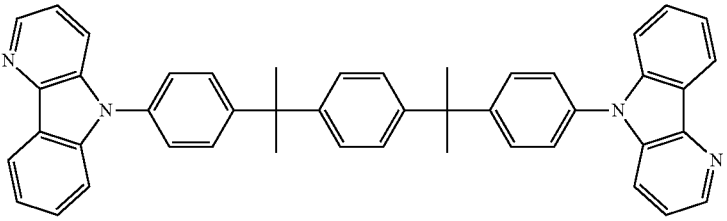 [SMILES: CC(C)(c1ccc(-n2c3ccccc3c3ncccc32)cc1)c1ccc(C(C)(C)c2ccc(-n3c4ccccc4c4ncccc43)cc2)cc1] | US20060121308 |
| Electron transporting materials | | |
| Anthracene-benzoimidazole compounds | 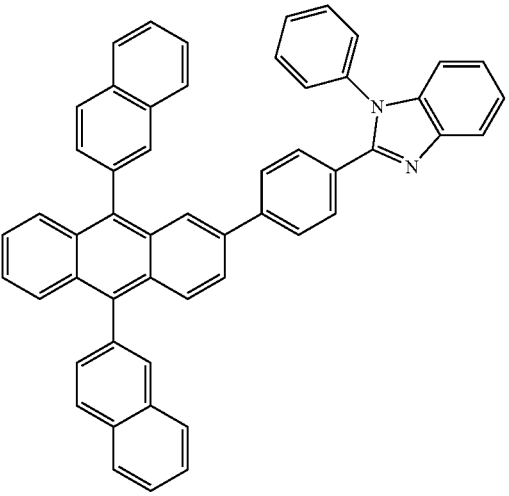 [SMILES: c1ccc(-n2c(-c3ccc(-c4ccc5c(-c6ccc7ccccc7c6)c6ccccc6c(-c6ccc7ccccc7c6)c5c4)cc3)nc3ccccc32)cc1] | WO2003060956 |
| | 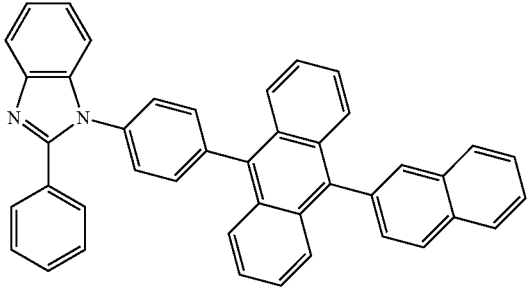 [SMILES: c1ccc(-c2nc3ccccc3n2-c2ccc(-c3c4ccccc4c(-c4ccc5ccccc5c4)c4ccccc34)cc2)cc1] | US20090179554 |
| Aza triphenylene derivatives | 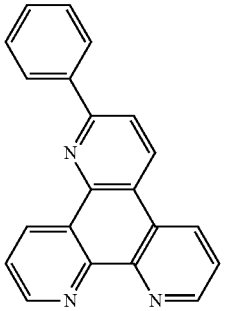 [SMILES: c1ccc(-c2ccc3c4cccnc4c4ncccc4c3n2)cc1] | US20090115316 |
| Anthracene-benzothiazole compounds | 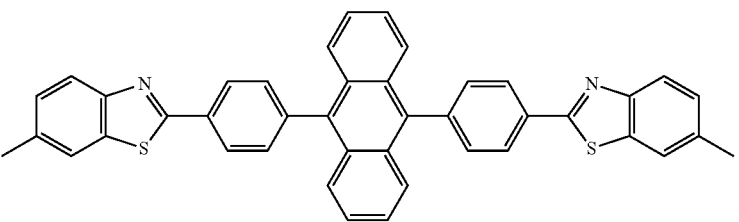 | Appl. Phys. Lett. 89, 063504 (2006) |

TABLE 4-continued

| MATERIAL | EXAMPLES OF MATERIAL | PUBLICATIONS |
| --- | --- | --- |
| Metal 8-hydroxy-quinolates (e.g., Alq$_3$, Zrq$_4$) | | Appl. Phys. Lett. 51, 913 (1987) U.S. Pat. No. 7,230,107 |
| Metal hydroxy-benoquinolates | | Chem. Lett. 5, 905 (1993) |
| Bathocuprine compounds such as BCP, BPhen, etc | | Appl. Phys. Lett. 91, 263503 (2007) |
| | | Appl. Phys. Lett. 79, 449 (2001) |
| 5-member ring electron deficient heterocycles (e.g., triazole, oxadiazole, imidazole, benzoimidazole) | | Appl, Phys, Lett. 74, 865 (1999) |
| | | Appl. Phys, Lett. 55, 1489 (1989) |

TABLE 4-continued

| MATERIAL | EXAMPLES OF MATERIAL | PUBLICATIONS |
| --- | --- | --- |
|  |  | Jpn. J. Apply. Phys. 32, L917 (1993) |
| Silole compounds |  | Org. Electron. 4, 113 (2003) |
| Arylborane compounds |  | J. Am. Chem. Soc. 120, 9714 (1998) |
| Fluorinated aromatic compounds |  | J. Am. Chem. Soc. 122, 1832 (2000) |
| Fullerene (e.g., C60) |  | US20090101870 |
| Triazine complexes |  | US20040036077 |

TABLE 4-continued

| MATERIAL | EXAMPLES OF MATERIAL | PUBLICATIONS |
|---|---|---|
| Zn (N^N) complexes | 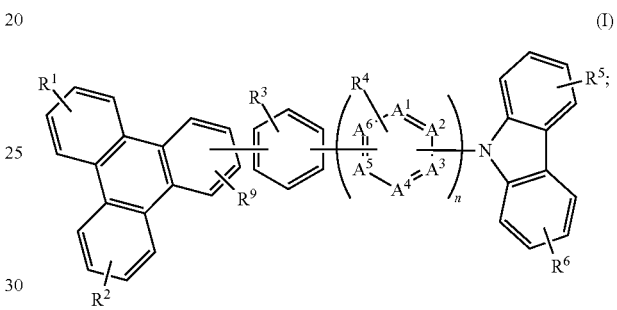 | U.S. Pat. No. 6,528,187 |

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

What is claimed is:

1. A composition comprising:

a mixture of a first host compound and a second host compound, wherein the first host compound has a different chemical structure than the second host compound;

wherein the first host compound is capable of functioning as a hole transporting material in an organic light emitting device at room temperature;

wherein the first host compound comprises at least one carbazole group;

wherein the first host compound has an evaporation temperature T1 of 150 to 350° C. and the second host compound has an evaporation temperature T2 of 150 to 350° C., wherein the evaporation temperature a compound is measured in a vacuum deposition tool at a constant pressure, between $1 \times 10^{-6}$ Torr to $1 \times 10^{-9}$ Torr, at a 2 Å/sec deposition rate on a surface positioned at a predefined distance away from the evaporating compound;

wherein the absolute value of T1−T2 is less than 20° C.;

wherein the first host compound has a concentration C1 in said mixture, and the first host compound has a concentration C2 in a film formed by evaporating the mixture in a vacuum deposition tool at a constant pressure between $1 \times 10^{-6}$ Torr to $1 \times 10^{-9}$ Torr, at a 2 Å/sec deposition rate on a surface positioned at a predefined distance away from the mixture being evaporated;

wherein the absolute value of (C1−C2)/C1 is less than 5%;

wherein the first host compound has a structure according to formula (I):

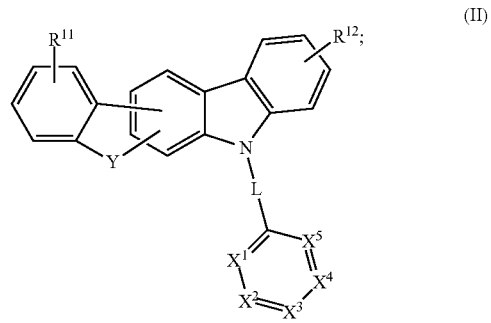

wherein
$R^1$, $R^2$, $R^3$, $R^4$, $R^5$, and $R^6$ each represent mono, di, tri, tetra substitutions, or no substitution;
$R^9$ represents mono, di, tri substitutions, or no substitution;
$R^1$, $R^2$, $R^3$, $R^4$, $R^5$, $R^6$, and $R^9$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof;
$A^1$, $A^2$, $A^3$, $A^4$, $A^5$, and $A^6$ are each independently selected from N or C;
n is an integer from 1 to 20;
wherein the second host compound has a structure according to a formula (II):

wherein $R^{11}$ and $R^{12}$ each represent mono, di, tri, tetra substitutions, or no substitution;

Y is selected from the group consisting of O, S, Se, NR',
and CR"R'";
L is a single bond or comprises an aryl or heteroaryl
group having from 5-24 carbon atoms, which is
optionally further substituted;
$X^1, X^2, X^3, X^4$, and $X^5$ are each independently selected
from group consisting of CR and N;
at least one of $X^1, X^2, X^3, X^4$, and $X^5$ is N; and
R, R', R", and R''' are each independently selected from
the group consisting of hydrogen, deuterium, halide,
alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof.

2. The composition of claim 1, wherein the first host compound has evaporation temperature T1 of 200 to 350° C. and the second host compound has evaporation temperature of T2 of 200 to 350° C.

3. The composition of claim 1, wherein the absolute value of (C1−C2)/C1 is less than 3%.

4. The composition of claim 1, wherein the first host compound has a vapor pressure of P1 at T1, the second host compound has vapor pressure of P2 at T2; and
wherein the ratio of P1/P2 is within the range of 0.90 to 1.10.

5. The composition of claim 1, wherein the first host compound has a first mass loss rate and the second host compound has a second mass loss rate, wherein the ratio between the first mass loss rate and the second mass loss rate is within the range of 0.90 to 1.10.

6. The composition of claim 1, wherein the first host compound further comprises at least one of the chemical groups selected from the group consisting of triphenylene, dibenzothiophene, dibenzofuran, and dibenzoselenophene.

7. The composition of claim 1, wherein the second host compound is capable of functioning as an electron transporting material in an organic light emitting device at room temperature.

8. The composition of claim 1, wherein the composition further comprises a third host compound, wherein the third host compound has a different chemical structure than the first host and second host compounds, wherein the third host compound has an evaporation temperature T3 of 150 to 350° C., and wherein absolute value of T1−T3 is less than 20° C.

9. The composition of claim 1, wherein the composition is in liquid form at a temperature lower than T1 and T2.

10. The composition of claim 1, wherein the first host compound has a formula selected from the group consisting of:

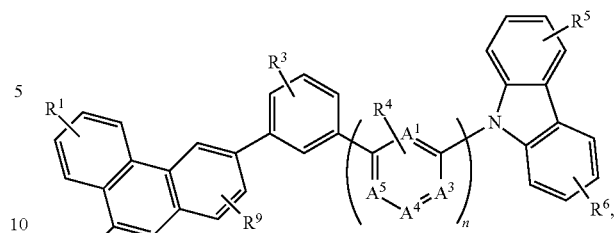

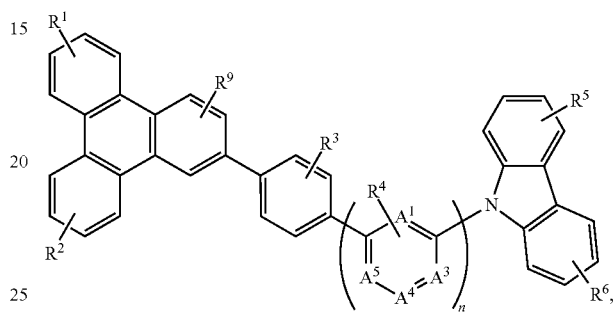

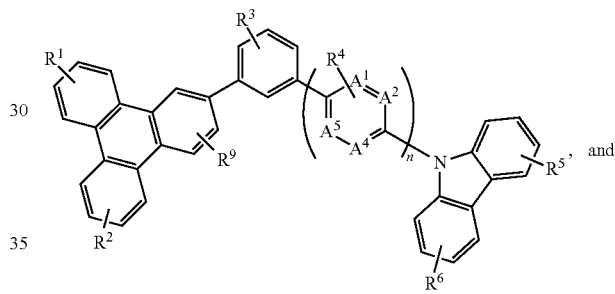

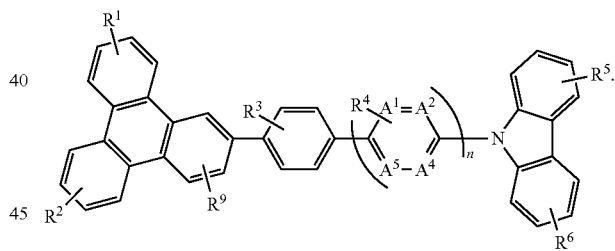

11. The composition of claim 1, wherein the first host compound has a formula selected from the group consisting of:

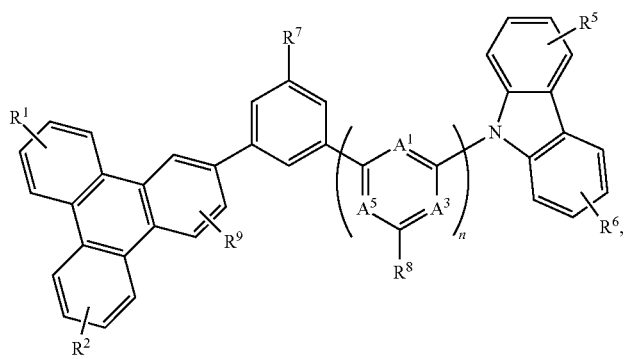

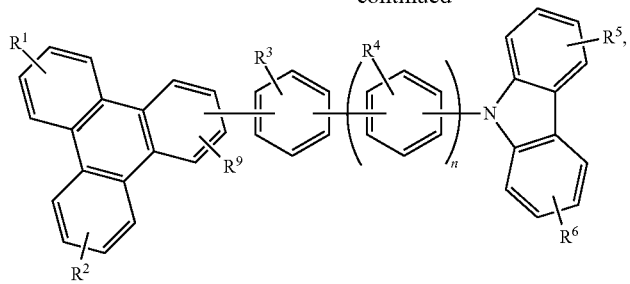

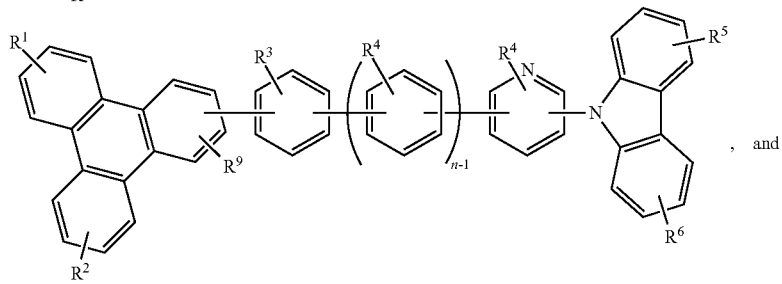, and

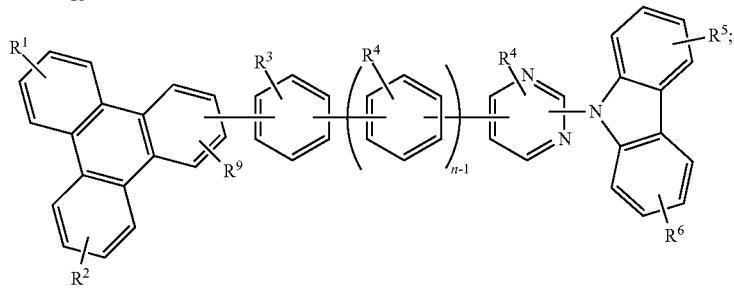

wherein $R^7$ and $R^8$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof.

12. The composition of claim 1, wherein the first host compound is selected from the group consisting of:

Compound 1

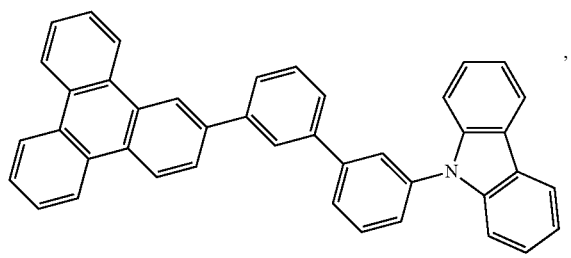

Compound 2

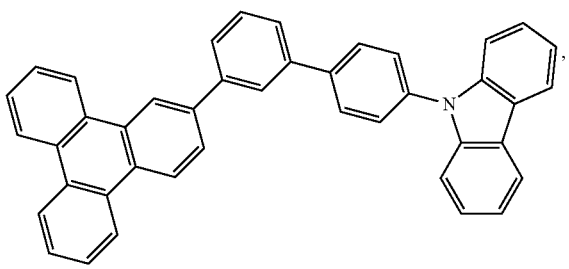

Compound 3

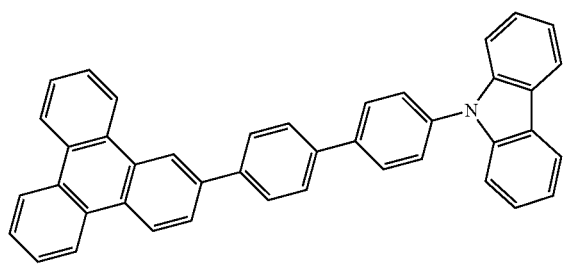

Compound 4

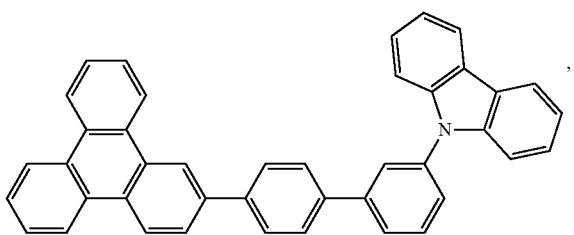

-continued
Compound 5
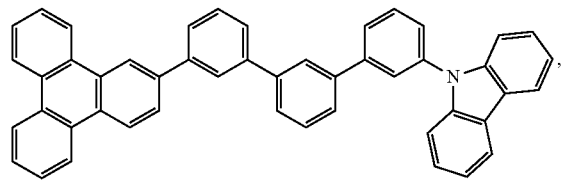
Compound 6
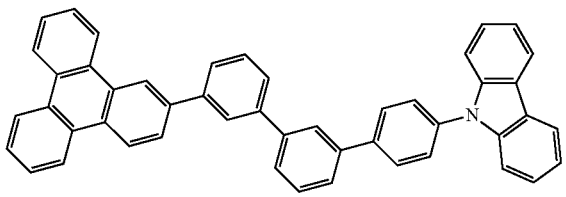
Compound 7
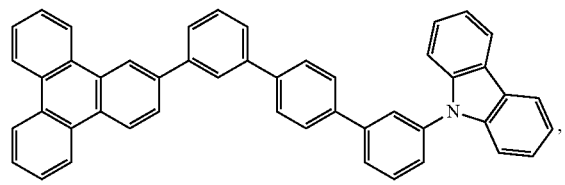
Compound 8
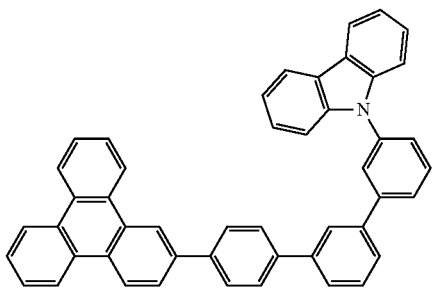
Compound 9
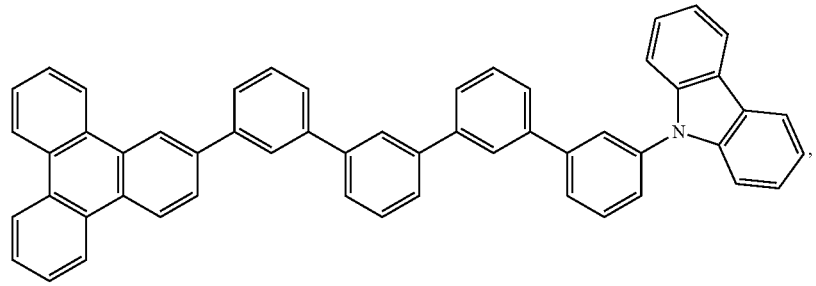
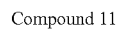
Compound 10
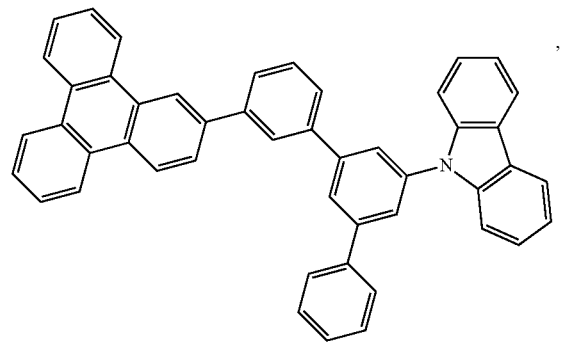
Compound 11
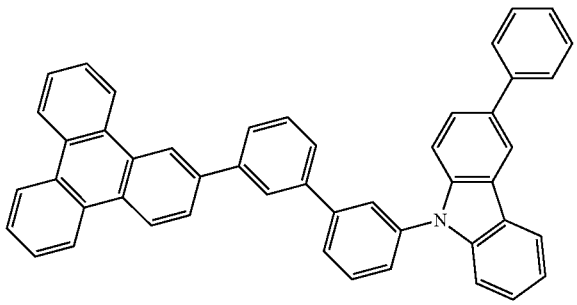
Compound 12
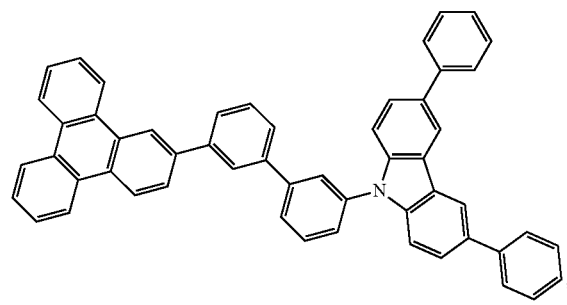
Compound 13
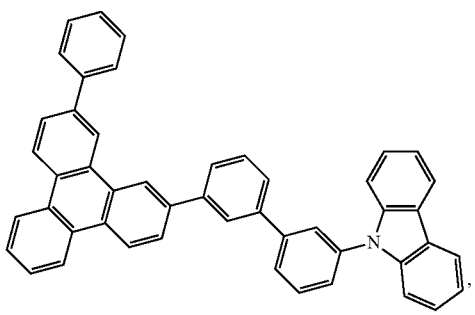

-continued
Compound 14
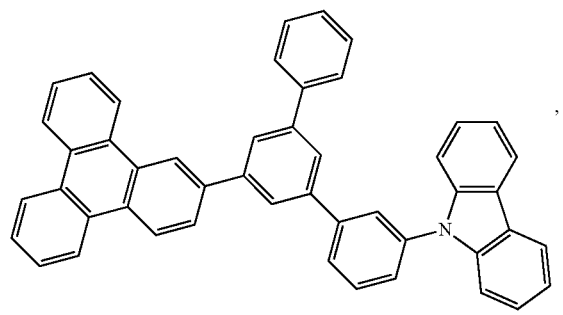
Compound 15
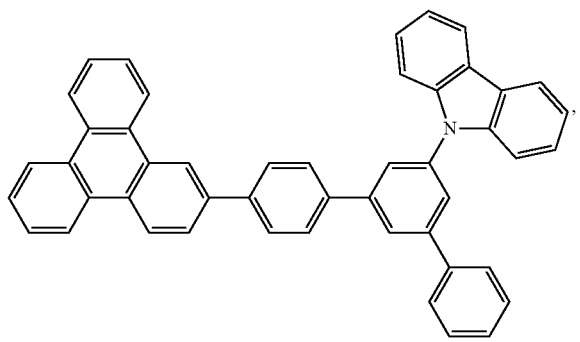
Compound 16
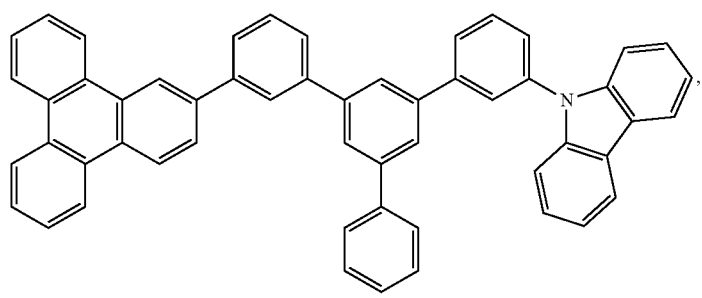
Compound 17
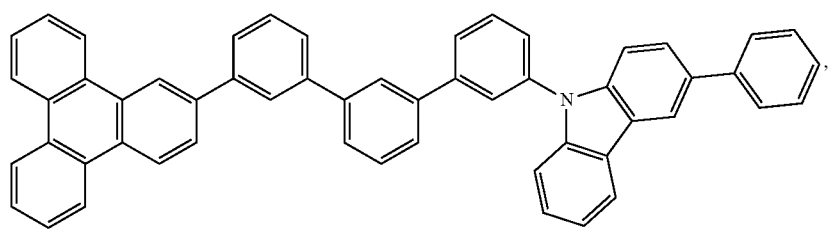
Compound 18
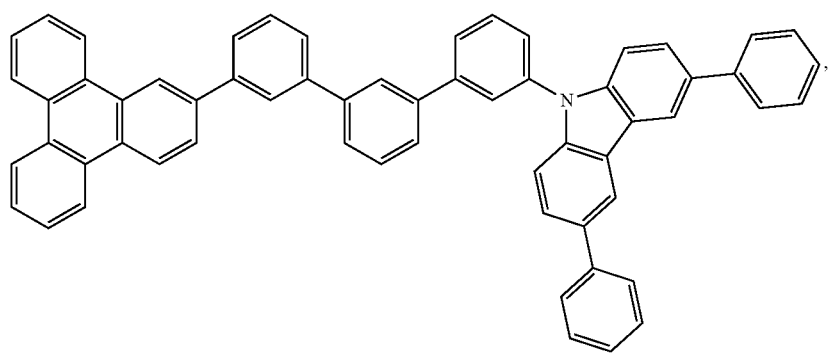
Compound 19
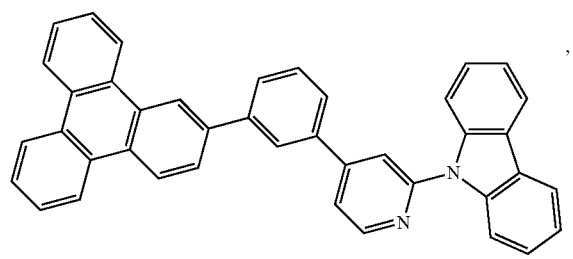
Compound 20
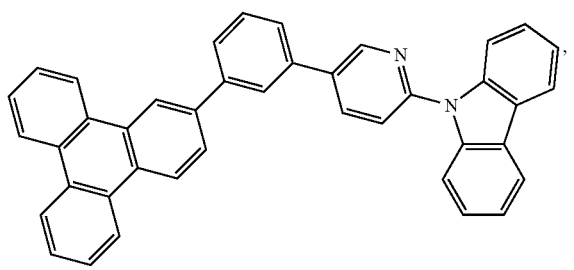

-continued
Compound 21
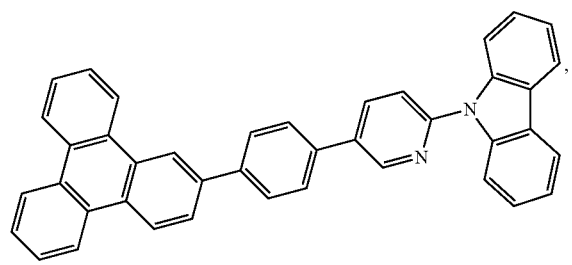
Compound 22
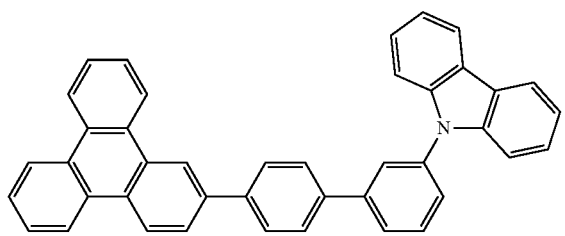
Compound 23
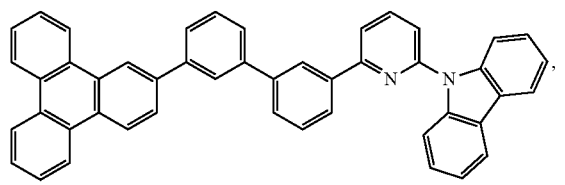
Compound 24
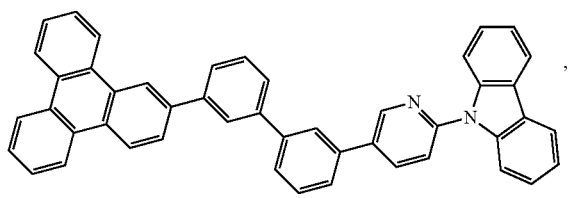
Compound 25
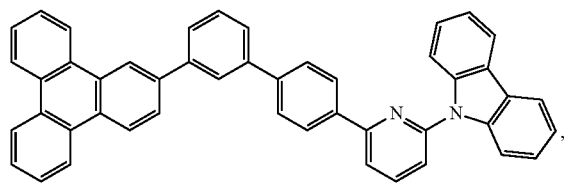
Compound 26
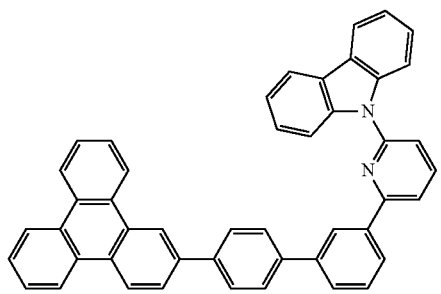
Compound 27
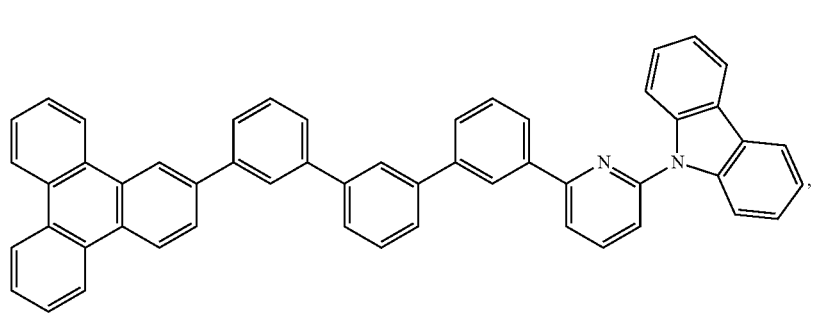
Compound 28
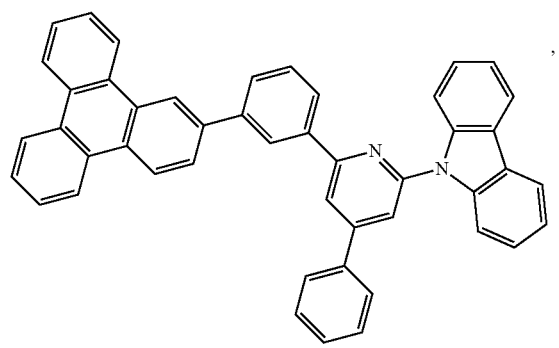
Compound 29
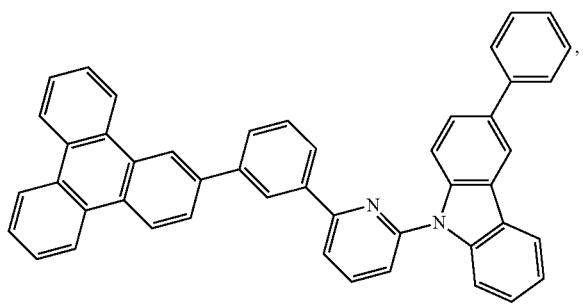

-continued
Compound 30
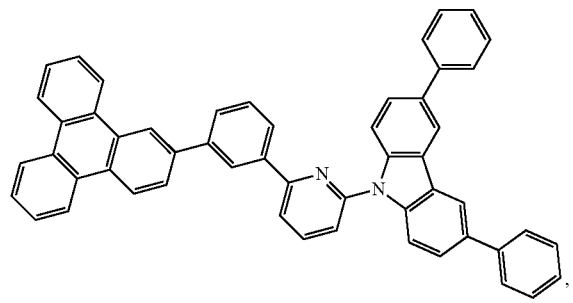
Compound 31
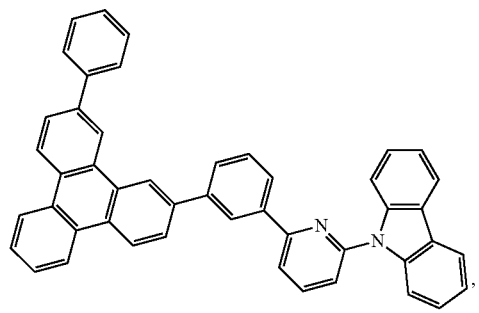
Compound 32
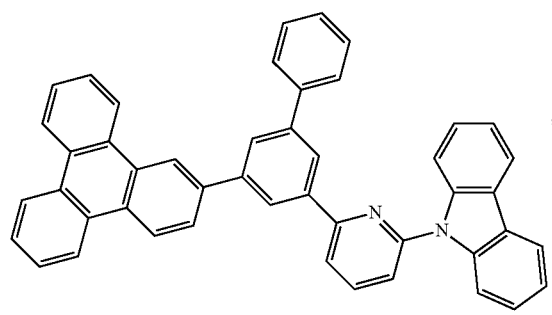
Compound 33
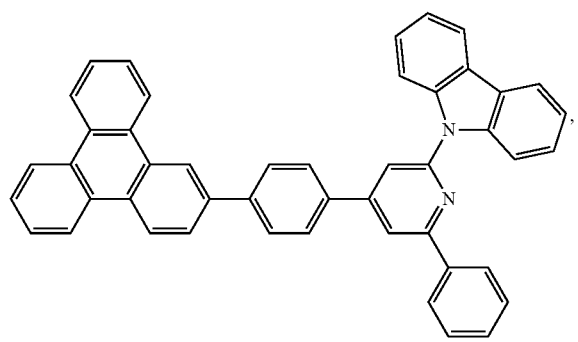
Compound 34
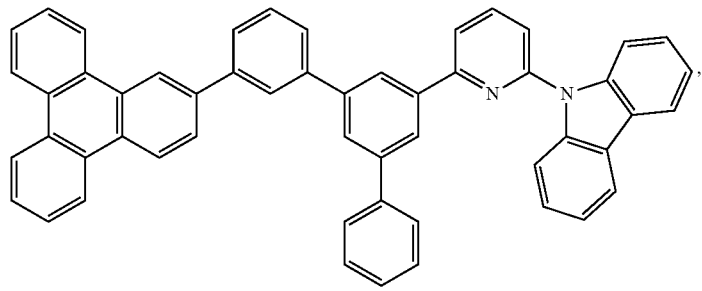
Compound 35
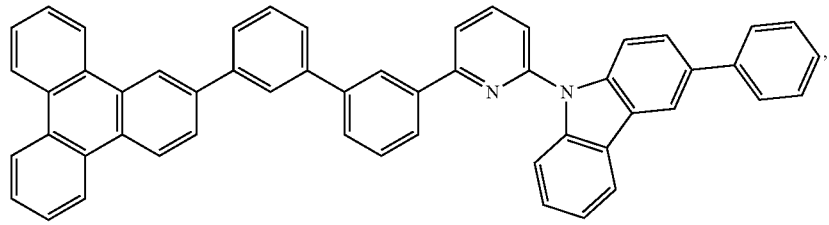
Compound 36
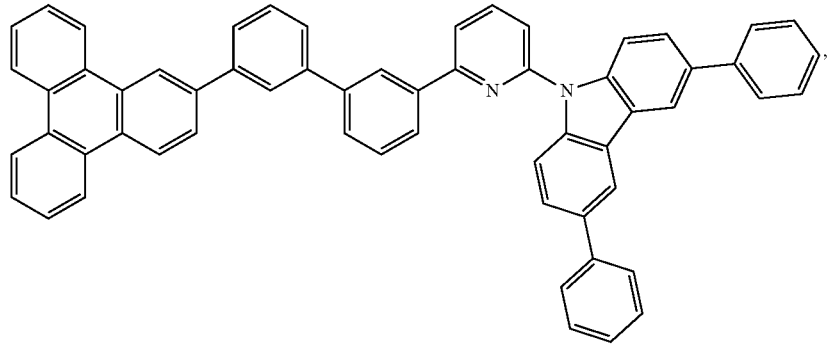

-continued
Compound 37
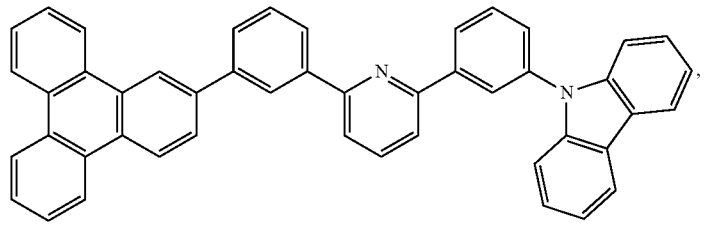
Compound 38
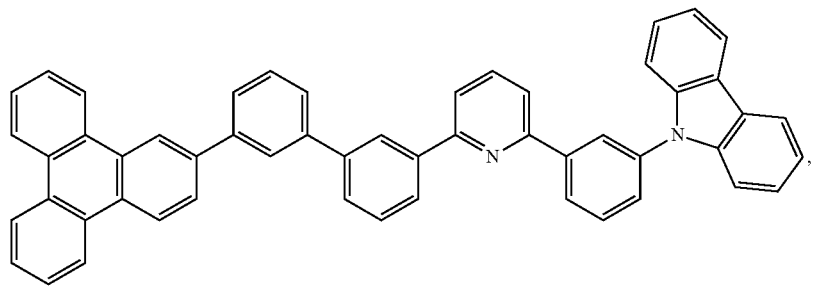
Compound 39
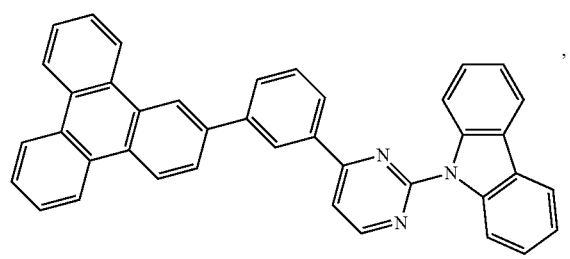
Compound 40
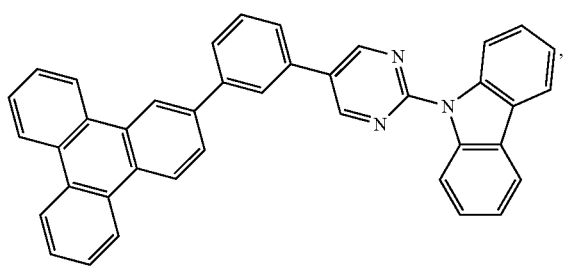
Compound 41
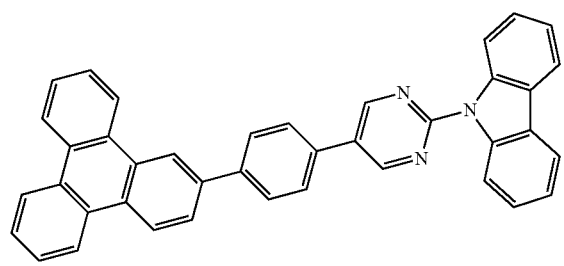
Compound 42
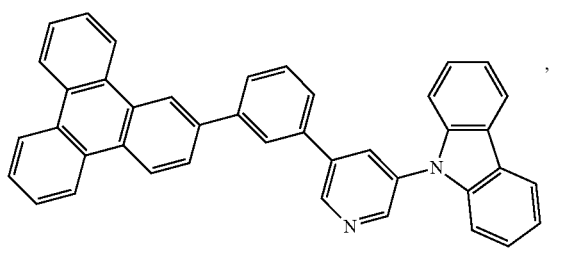
Compound 43
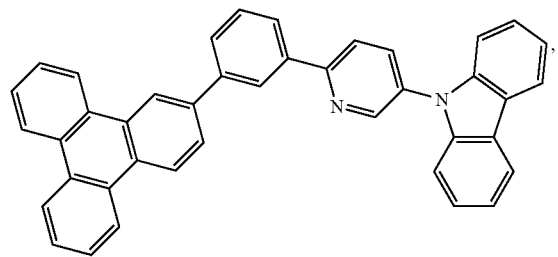
Compound 44
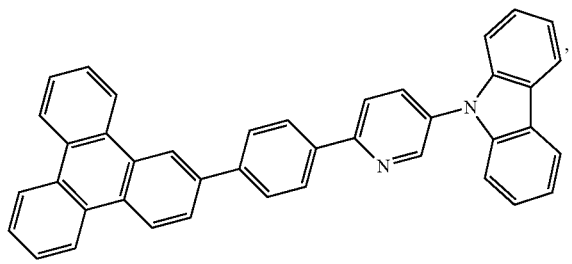
Compound 45
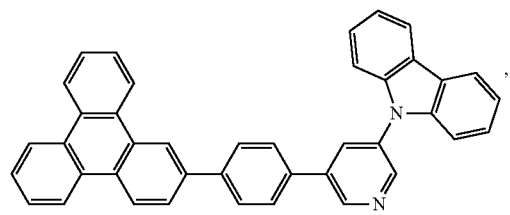
Compound 46
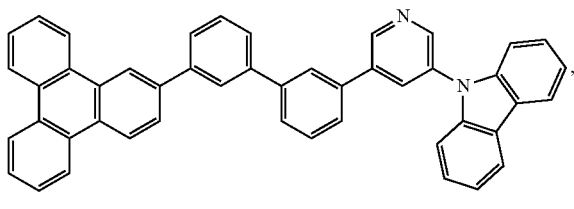

Compound 47

Compound 48

Compound 49

Compound 50

Compound 51

-continued
Compound 52
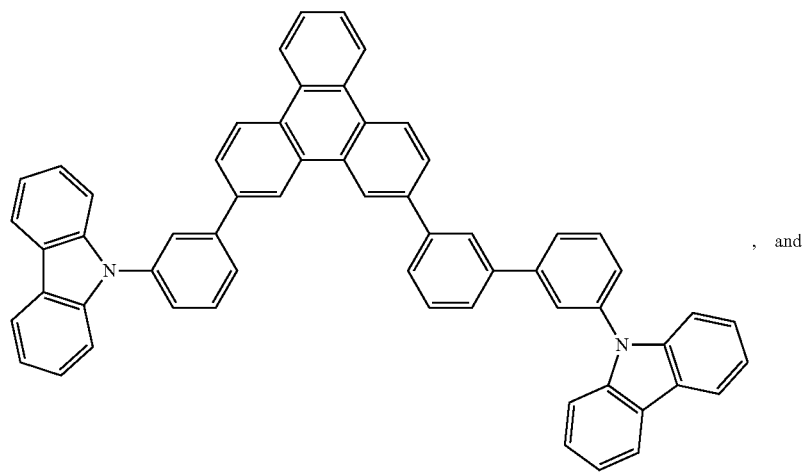
, and
Compound 53
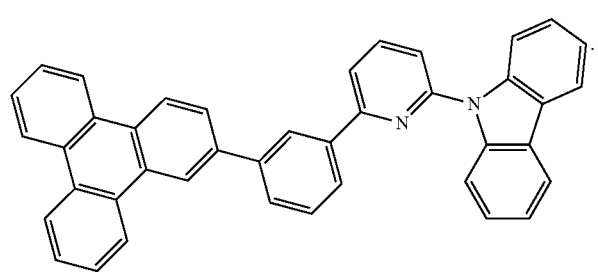
.
13. The composition of claim 1, wherein $X^1$, $X^3$, and $X^5$ are N;
and wherein $X^2$ and $X^4$ are CR.
14. The composition of claim 1, wherein the second host compound is selected from the group consisting of:
Compound E1
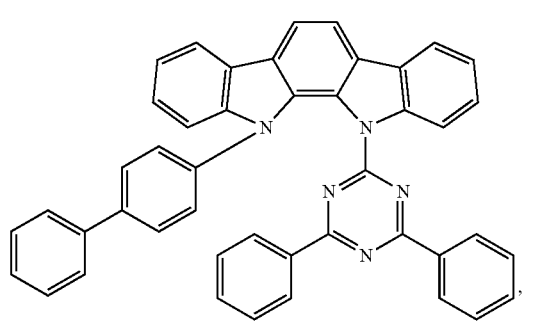
,
-continued
Compound E3
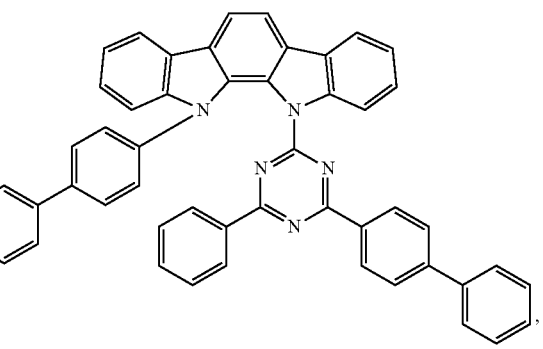
,
Compound E2
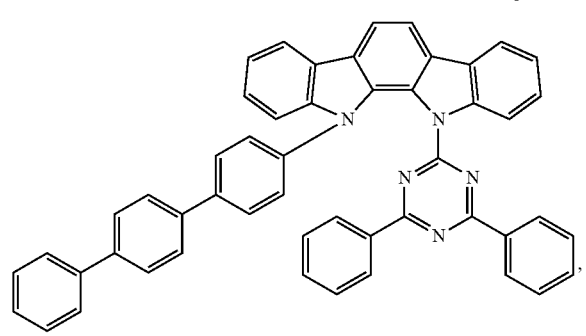
,
Compound E4
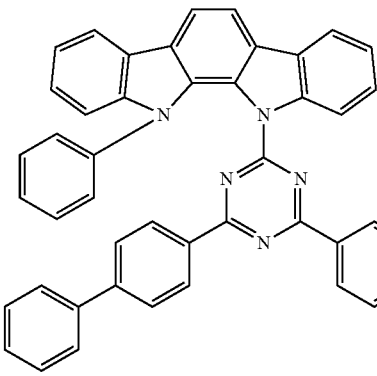
, Compound E5
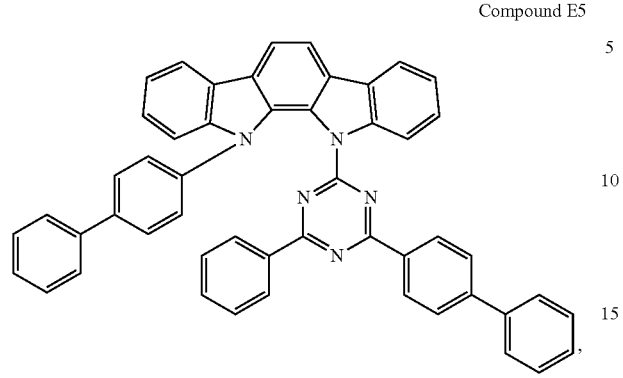
Compound E6
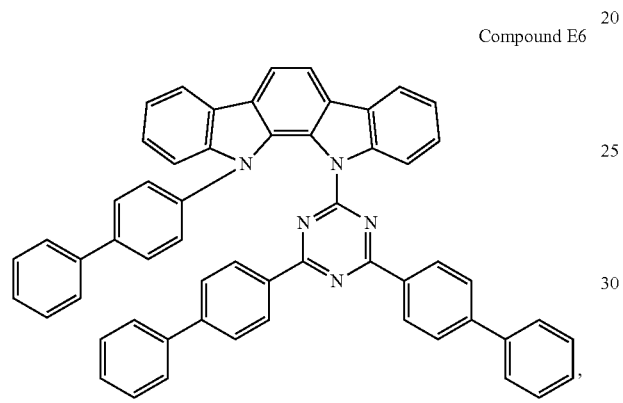
Compound E7
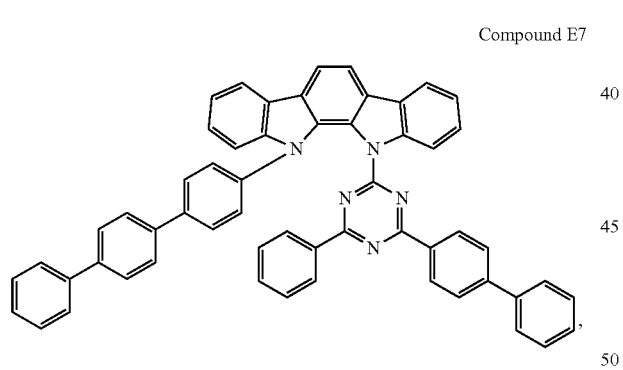
Compound E8
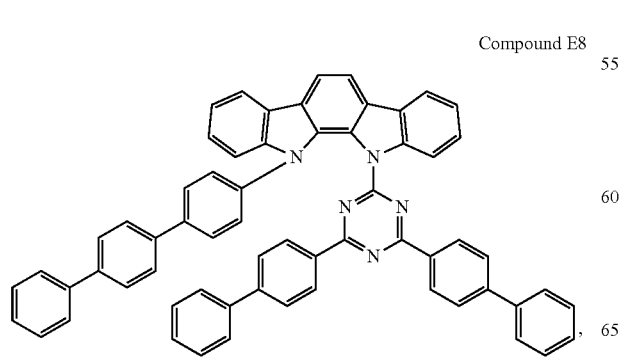
Compound E9
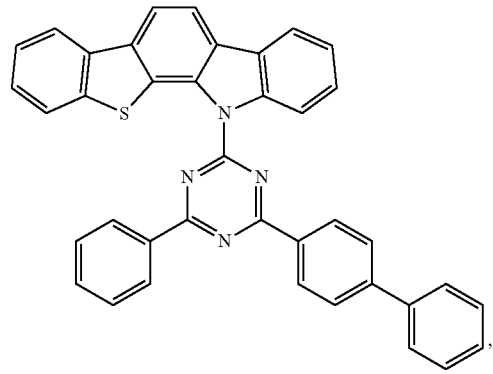
Compound E10
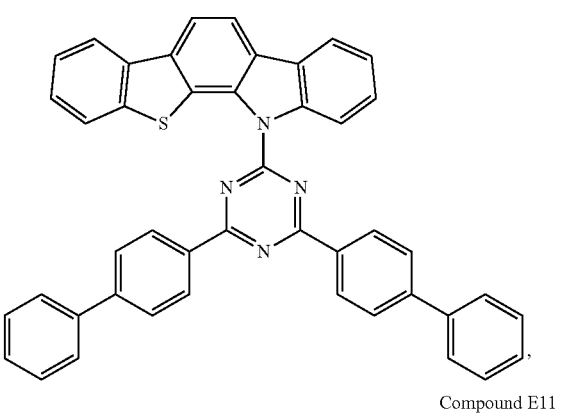
Compound E11
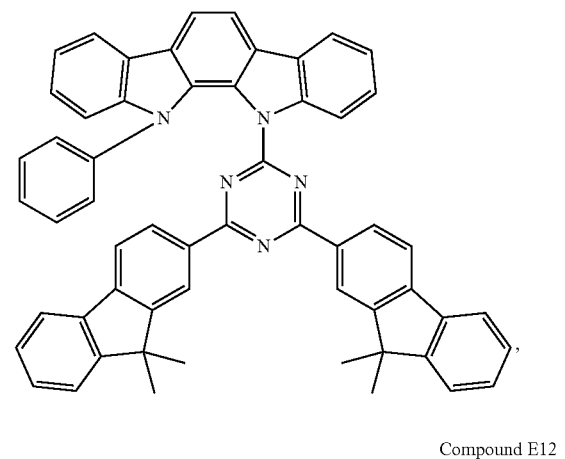
Compound E12
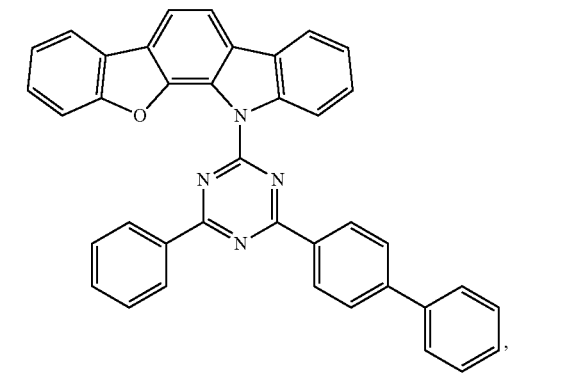

Compound E13
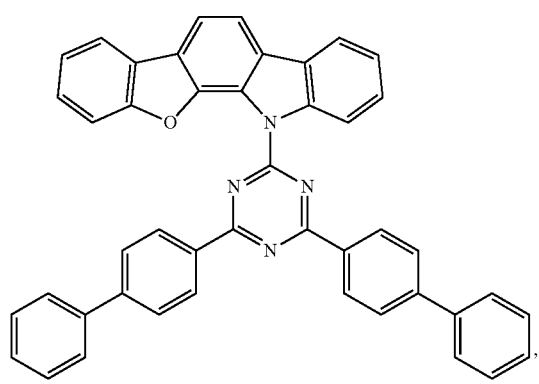
Compound E14
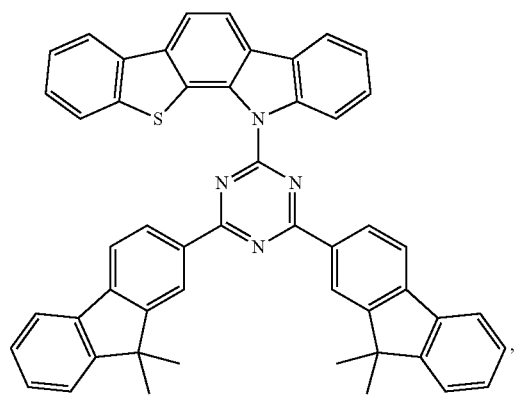
Compound E15
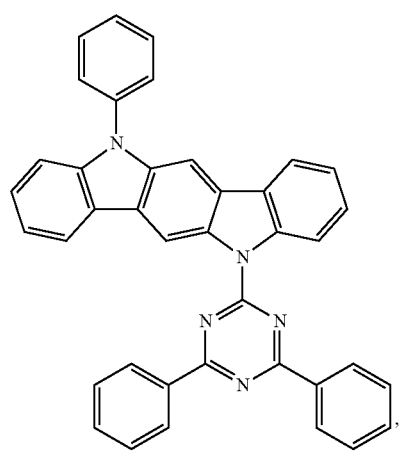
Compound E16
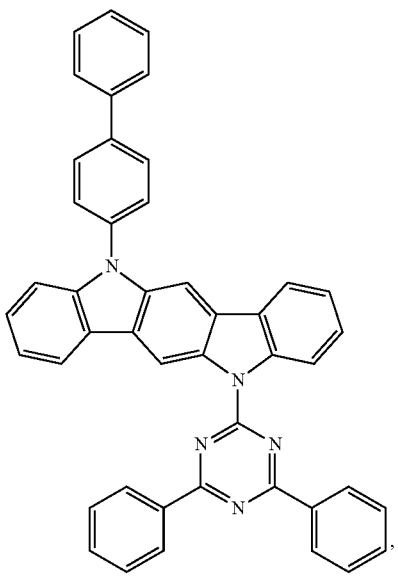
Compound E17
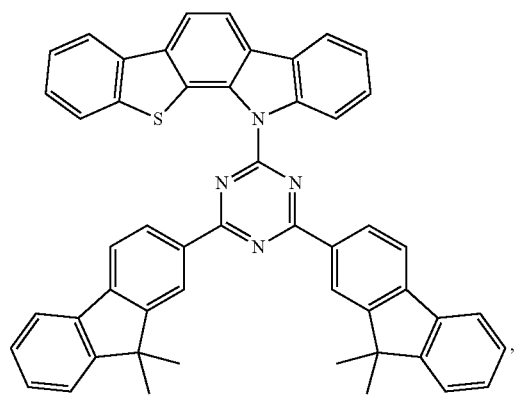
Compound E18
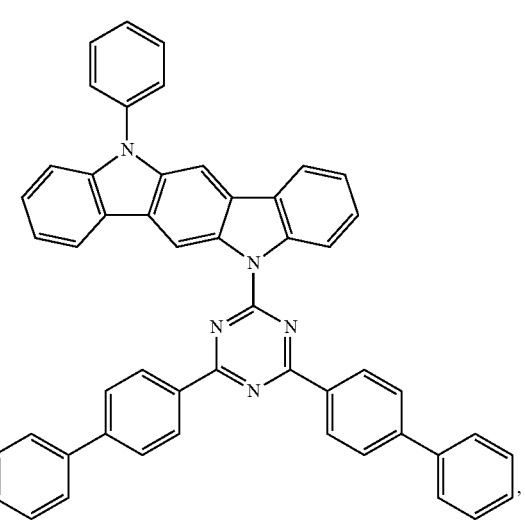

Compound E19
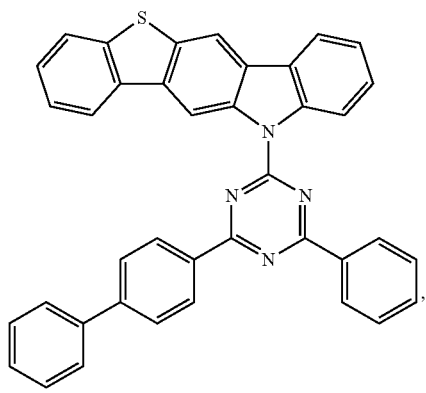
Compound E20
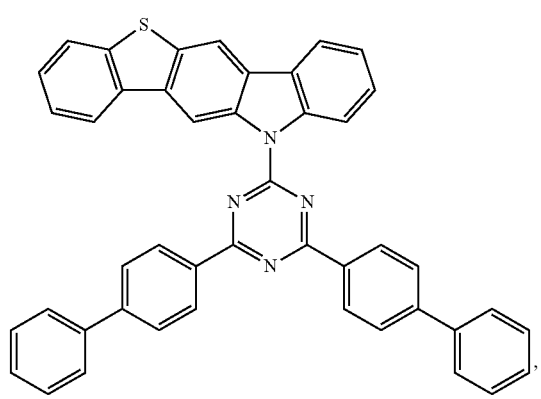
Compound E21
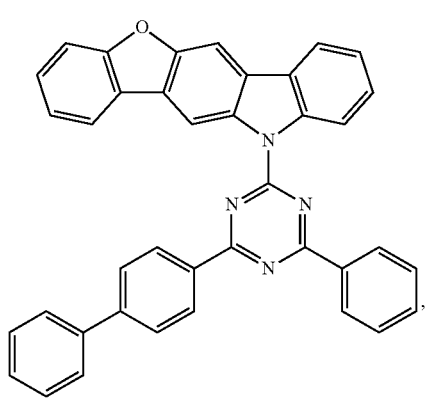
Compound E22
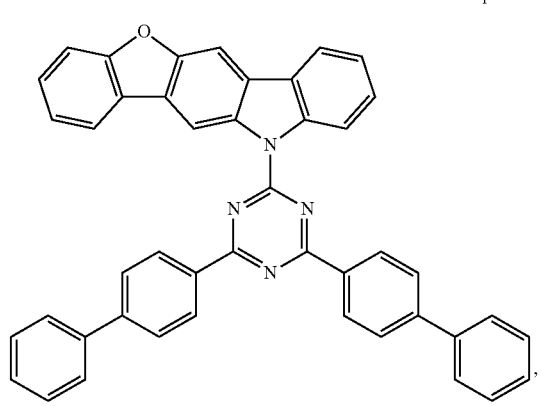
Compound E23
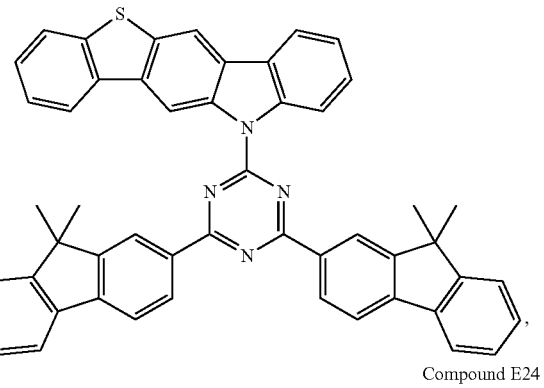
Compound E24
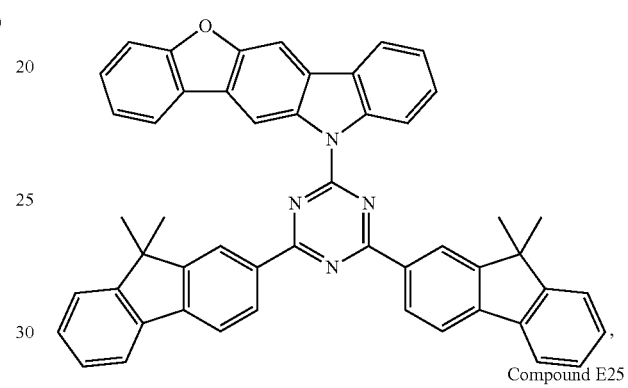
Compound E25
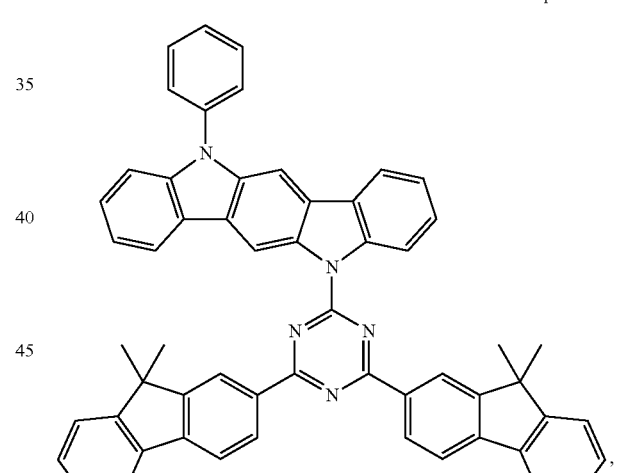
Compound E26
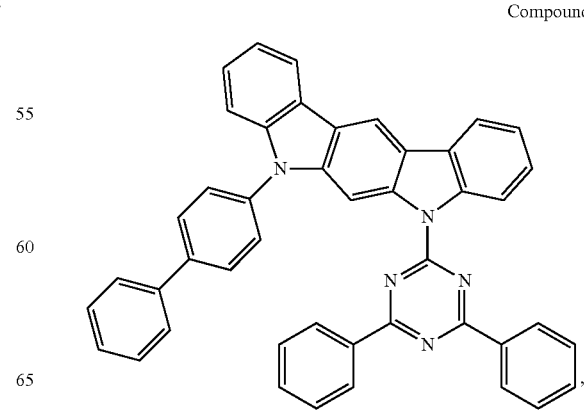

Compound E27
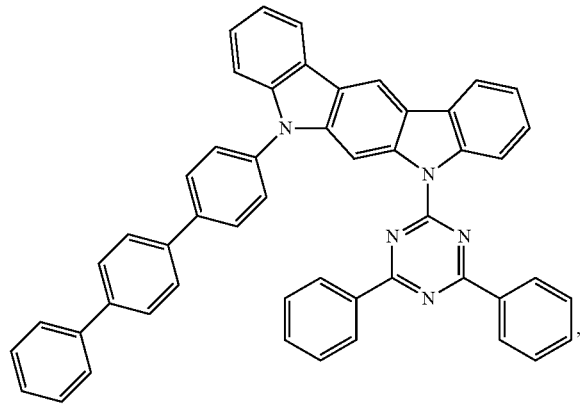
Compound E28
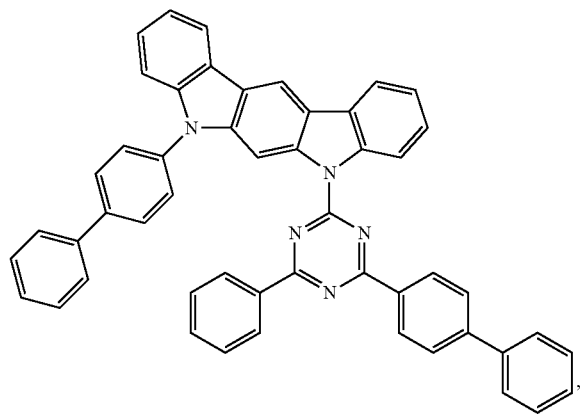
Compound E29
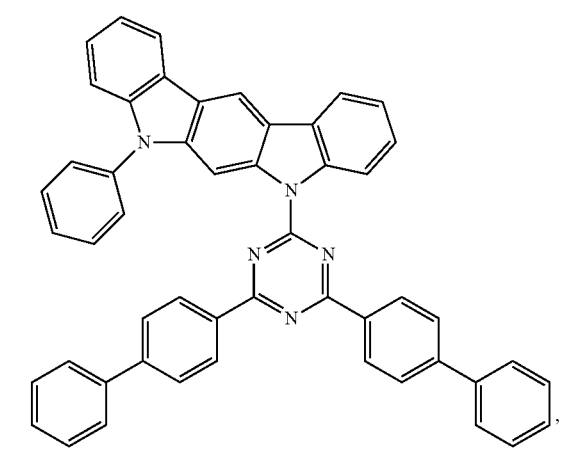
Compound E30
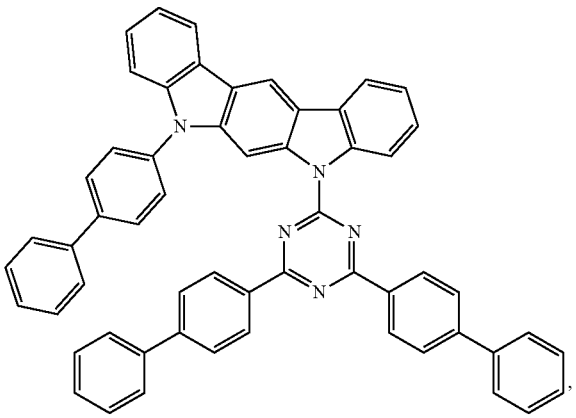
Compound E31
Compound E32
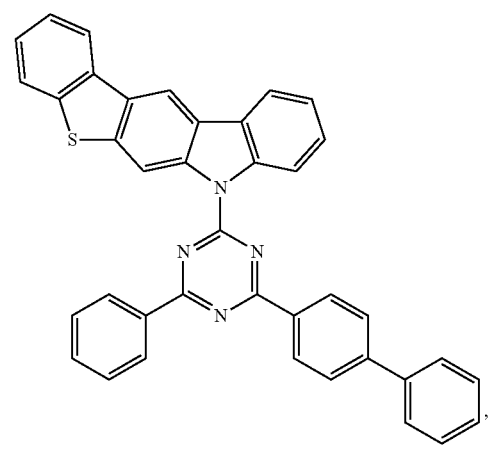

Compound E33
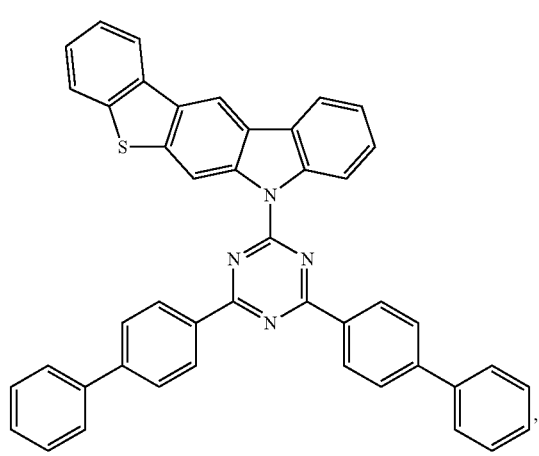
Compound E34
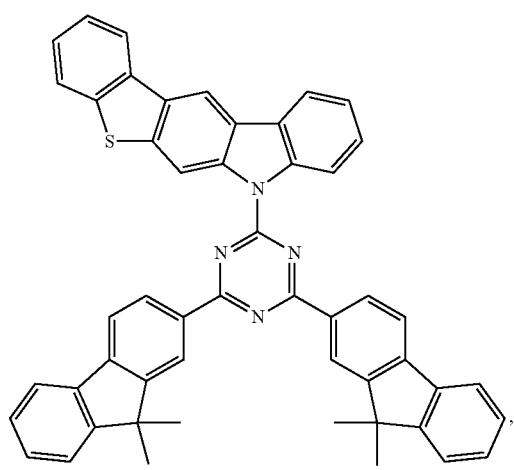
Compound E35
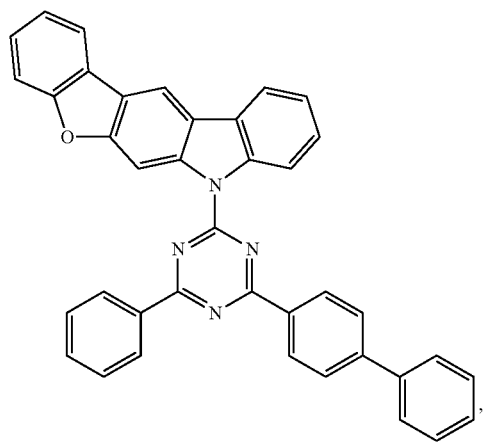
Compound E36
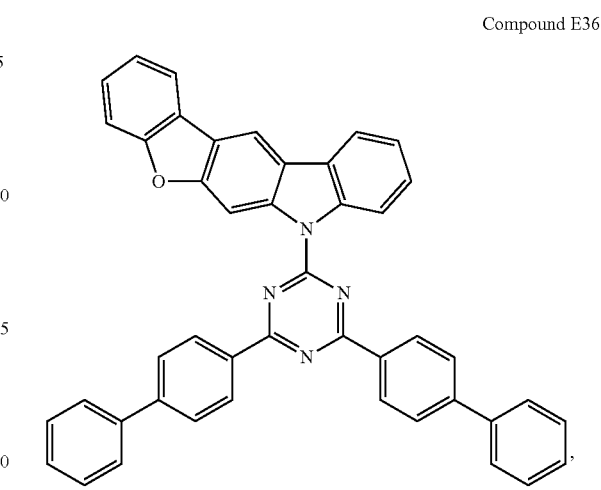
Compound E37
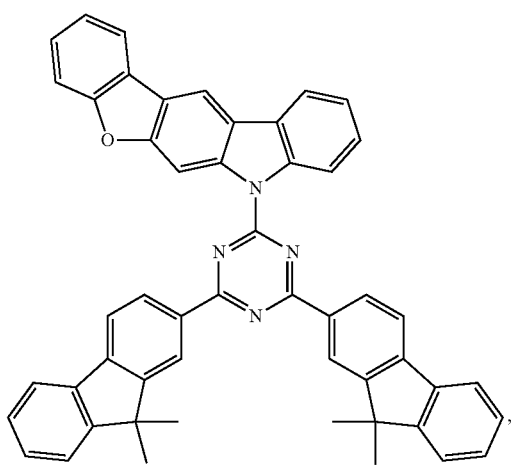
Compound E38
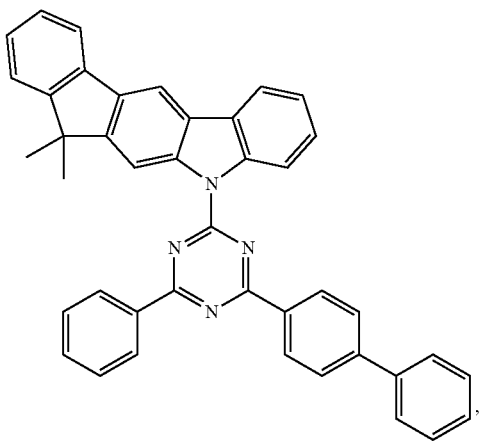

Compound E39
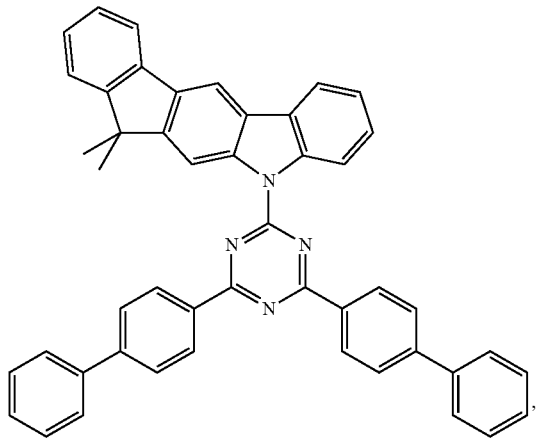
Compound E40
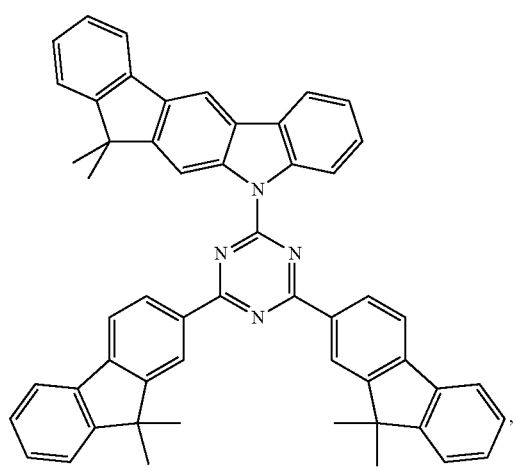
Compound E41
Compound E42
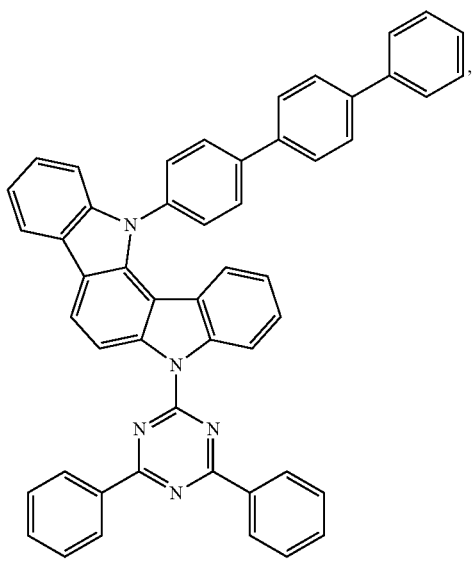
Compound E43
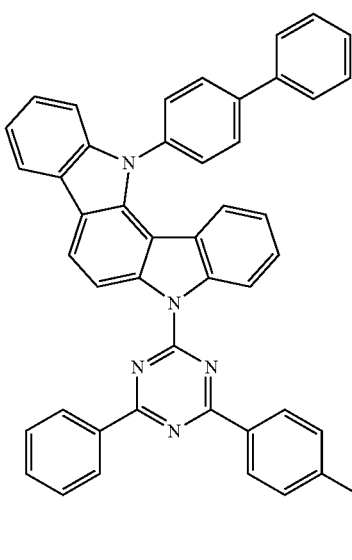
Compound E44
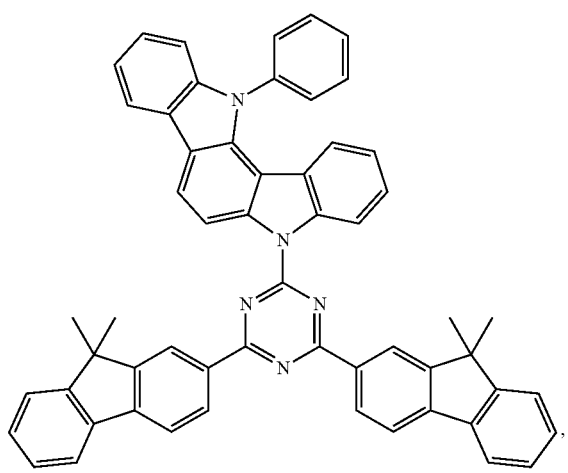

Compound E45
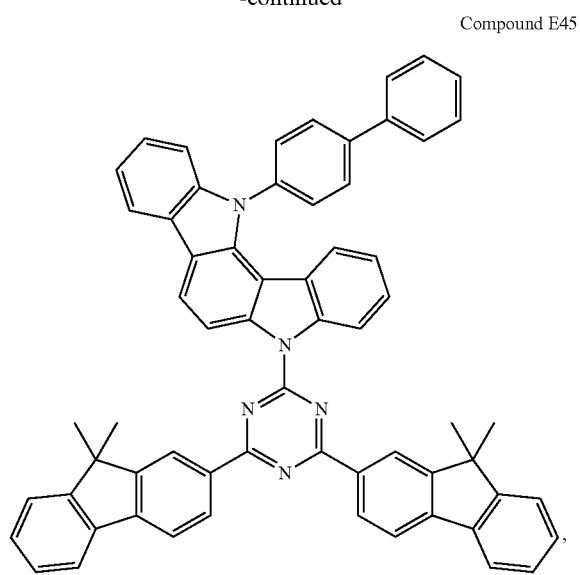
Compound E46
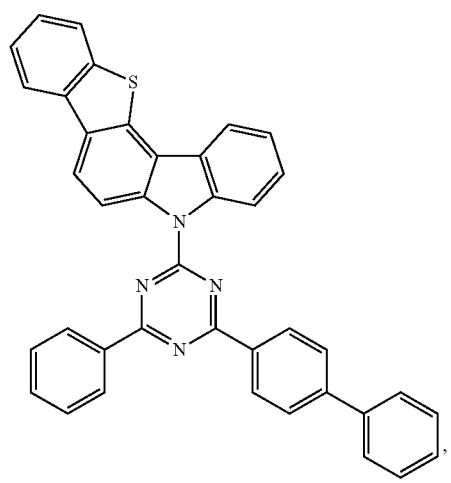
Compound E47
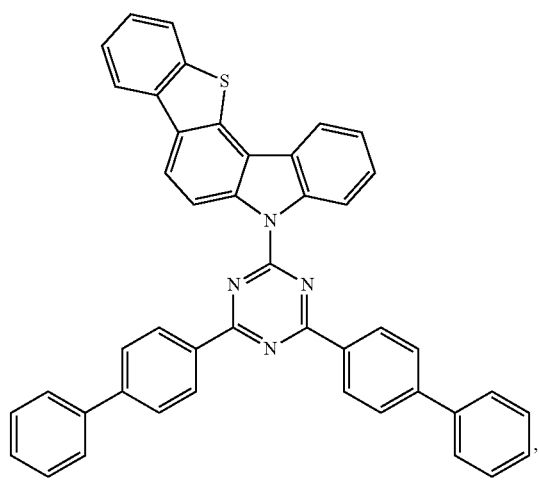
Compound E48
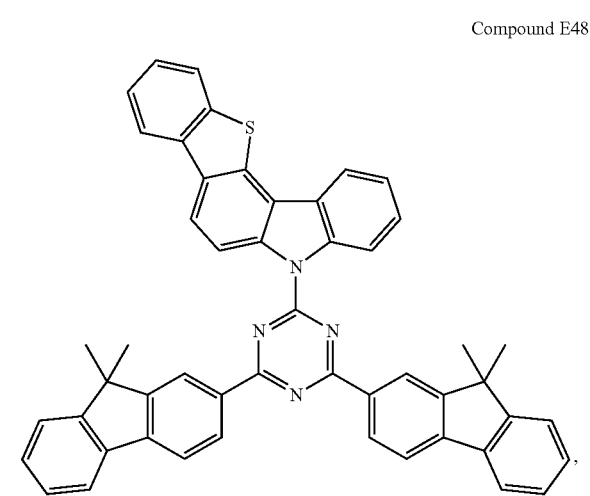
Compound E49
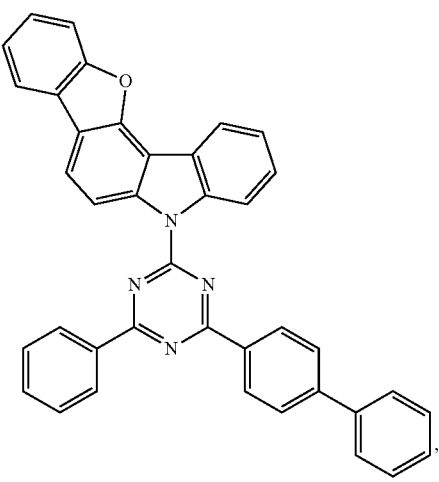
Compound E50
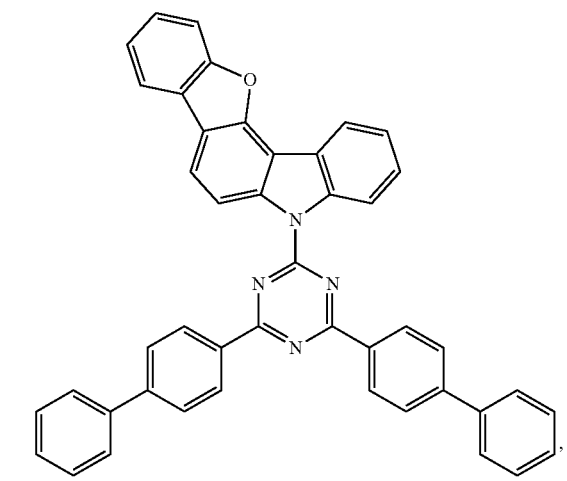

Compound E51
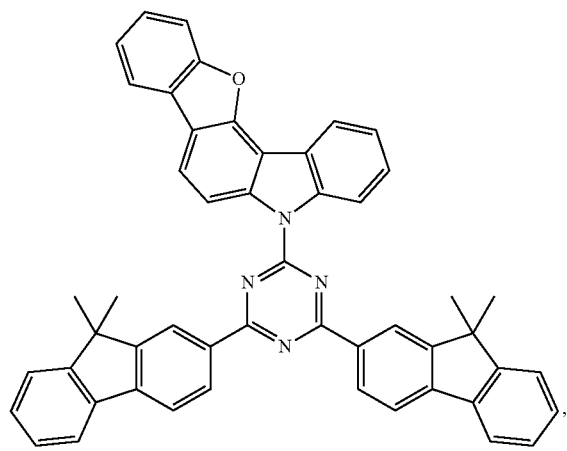
Compound E52
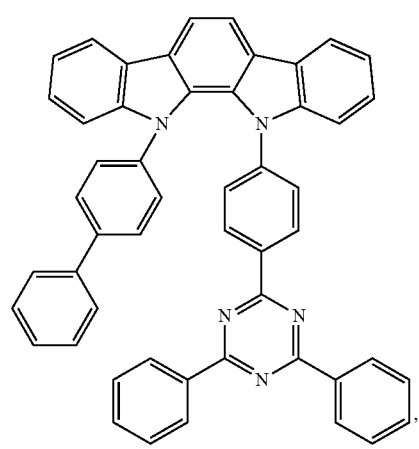
Compound E53
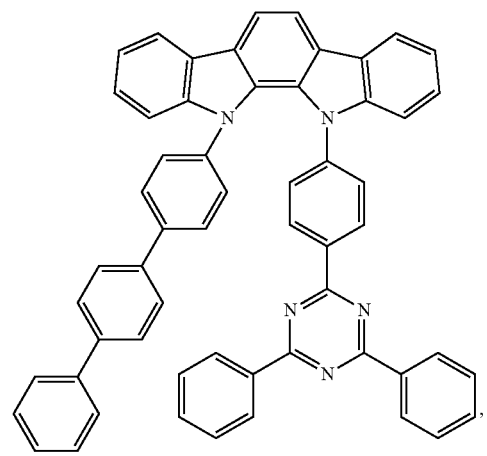
Compound E54
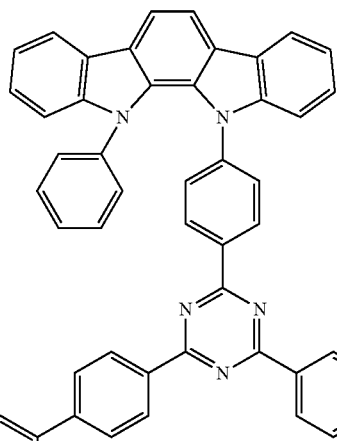
Compound E55
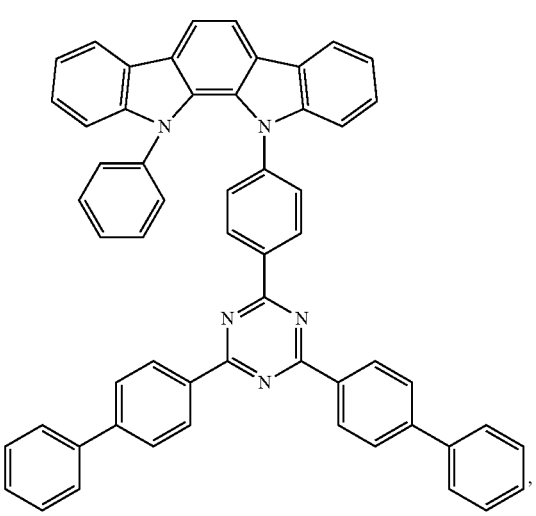
Compound E56
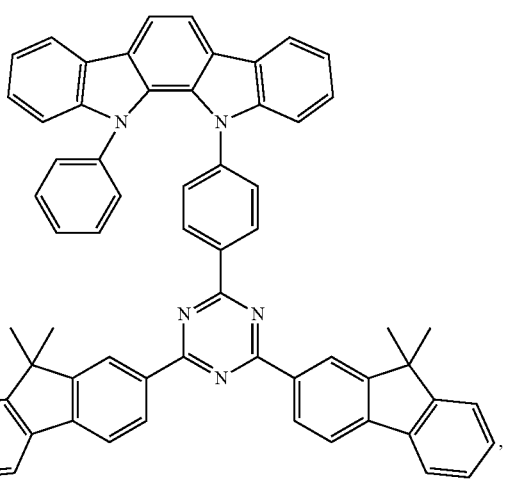

Compound E57
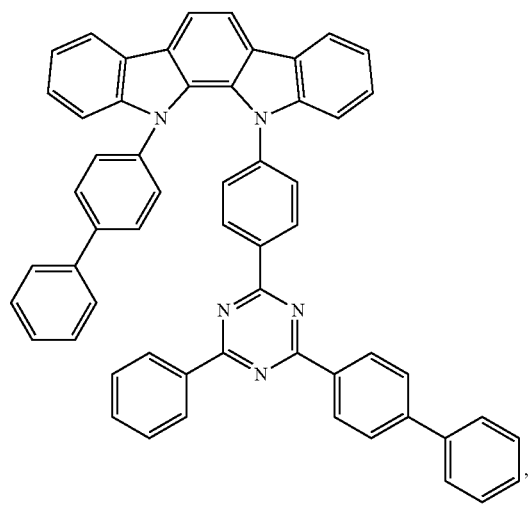
Compound E58
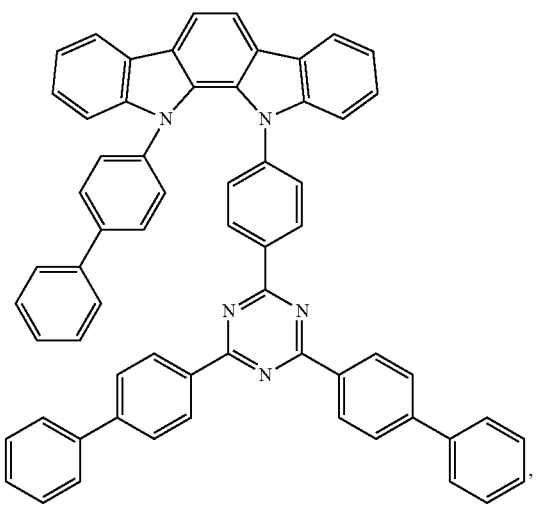
Compound E59
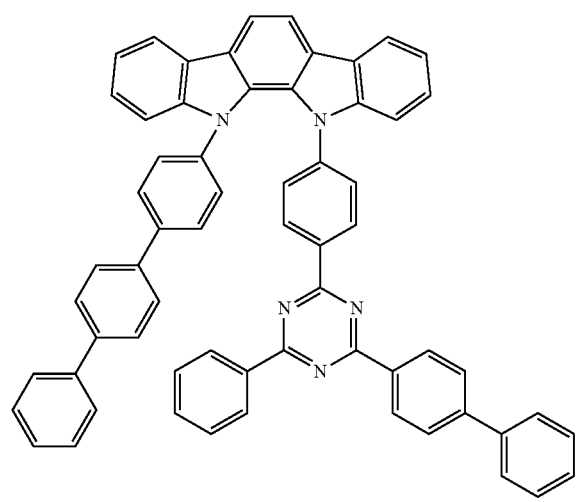
Compound E60
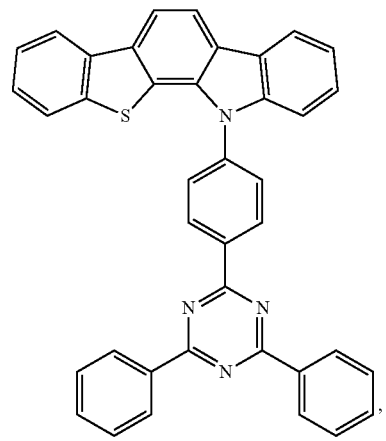
Compound E61
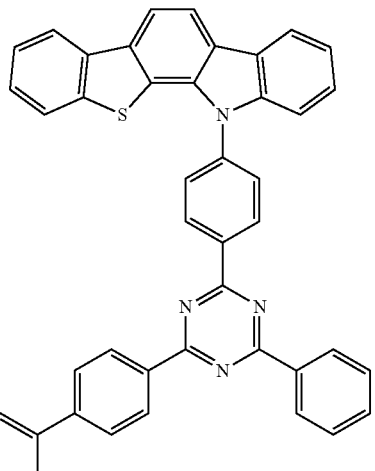
Compound E62
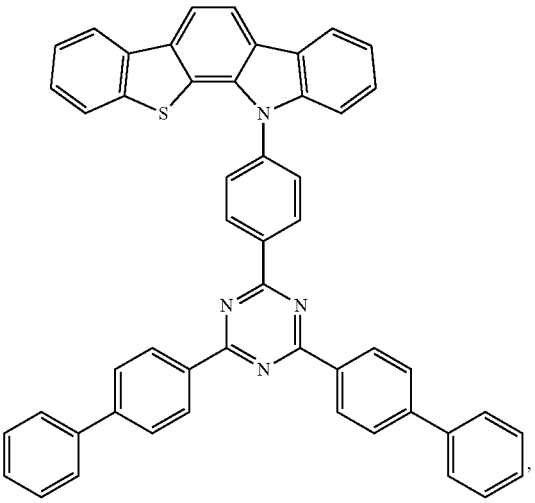

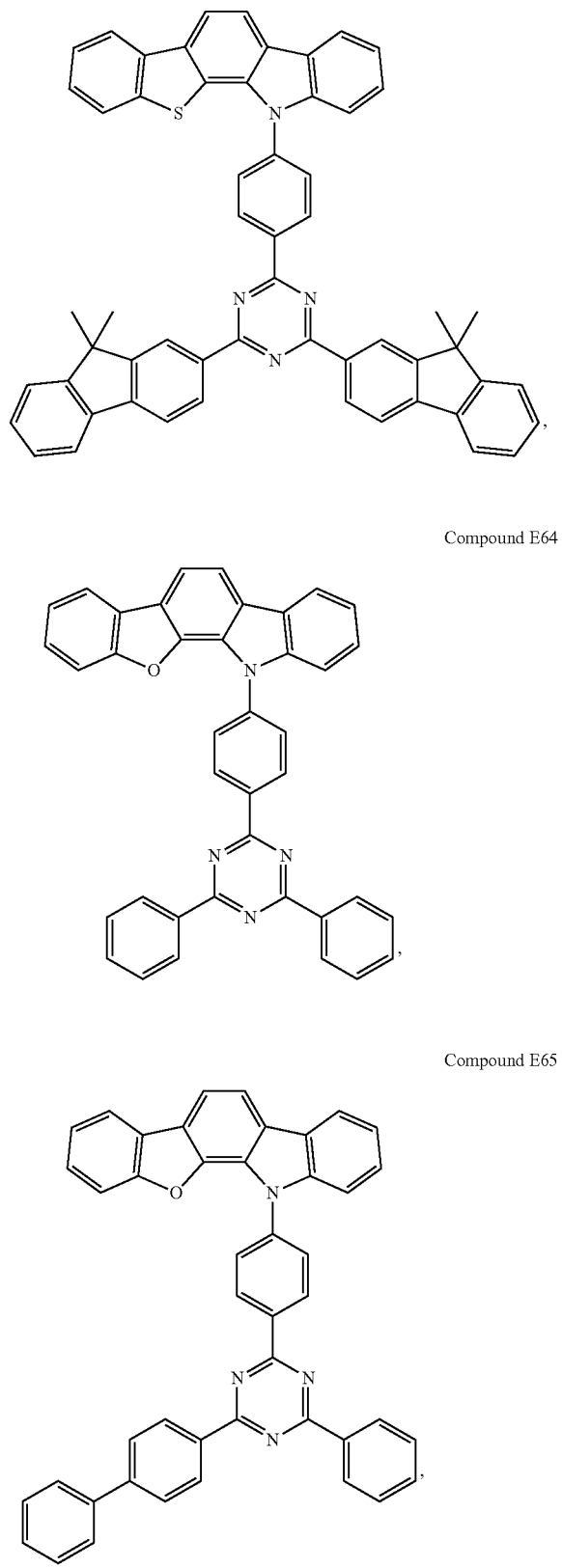

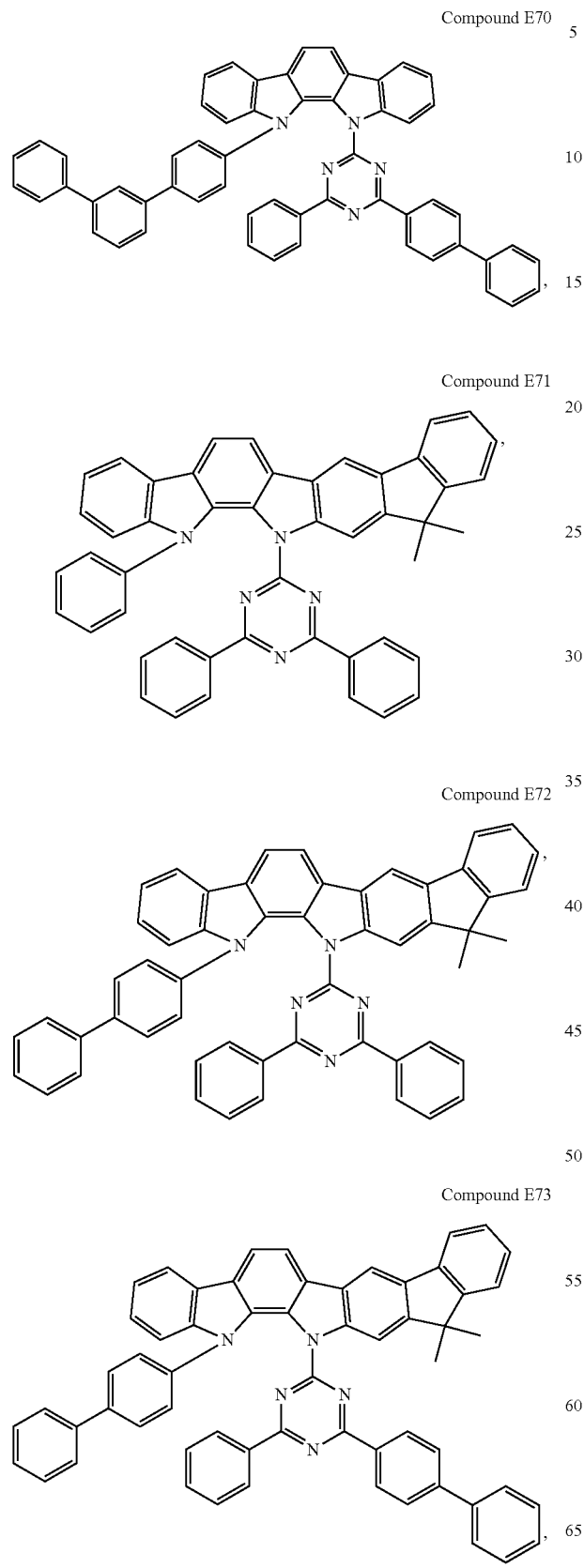
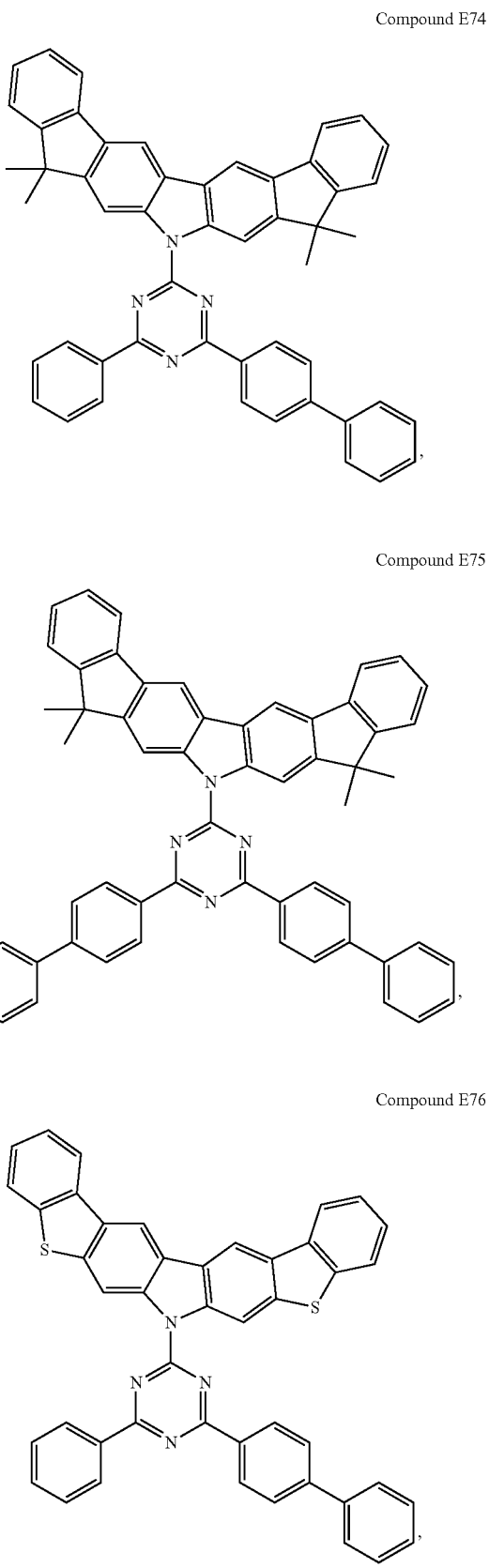

187
-continued

Compound E77

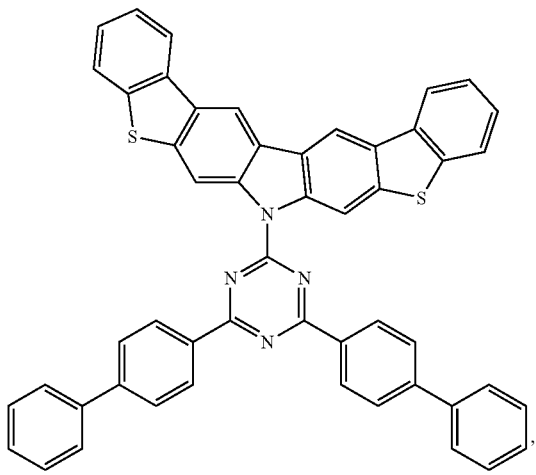

Compound E78

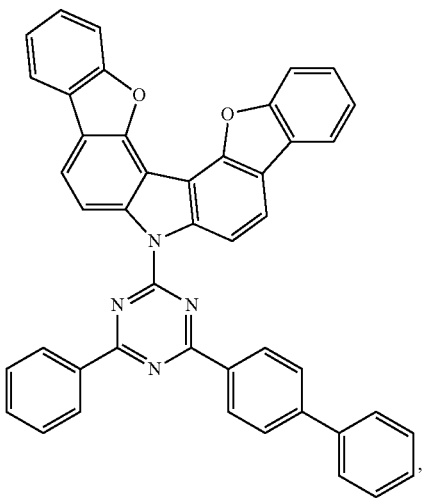

Compound E79

188
-continued

Compound E80

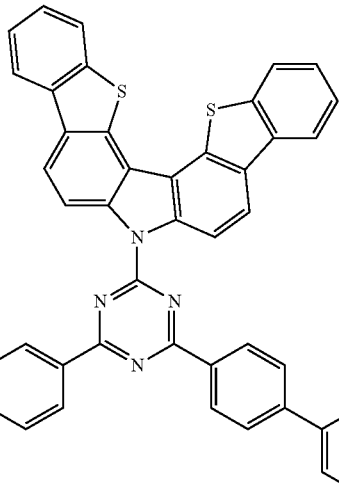

, and

Compound E81

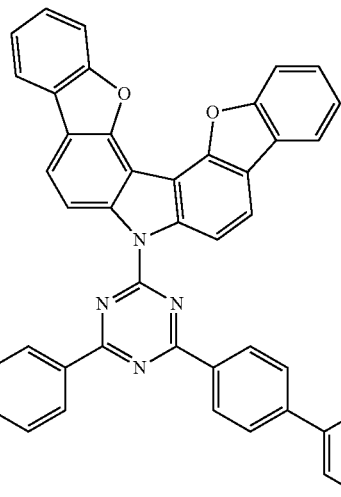

.

15. The composition of claim 1, wherein the mixture of the first host compound and the second host compound is selected from the group consisting of: (Compound 2 and Compound E2), (Compound 3 and Compound E4), (Compound 1 and Compound E5), (Compound 6 and Compound E7), (Compound 7 and Compound E7), (Compound 9 and Compound E8), (Compound 17 and Compound E8), and (Compound 15 and Compound E18).

16. A first device comprising a first organic light emitting device, the first organic light emitting device comprising:
   an anode;
   a cathode; and
   an organic layer, disposed between the anode and the cathode, comprising a first composition comprising a mixture of a first host compound and a second v compound, wherein the first host compound has a different chemical structure than the second host compound;
   wherein the first host compound is capable of functioning as a hole transporting material in an organic light emitting device at room temperature;
   wherein the first host compound comprises at least one carbazole group;

wherein the first host compound has evaporation temperature of T1 of 150 to 350° C. and the second host compound has evaporation temperature of T2 of 150 to 350° C., wherein the evaporation temperature a compound is measured in a vacuum deposition tool at a constant pressure, between 1×10⁻⁶ Torr to 1×10⁻⁹ Torr, at a 2 Å/sec deposition rate on a surface positioned at a predefined distance away from the evaporating compound;

wherein the absolute value of T1−T2 is less than 20° C.;

wherein the first host compound has a concentration C1 in said mixture, and the first host compound has a concentration C2 in a film formed by evaporating the mixture in a vacuum deposition tool at a constant pressure between 1×10⁻⁶ Torr to 1×10⁻⁹ Torr, that can produce a 2 Å/sec deposition rate on a surface positioned at a predefined distance away from the mixture being evaporated;

wherein the absolute value of (C1−C2)/C1 is less than 5%;

wherein the first host compound has a structure according to formula (I):

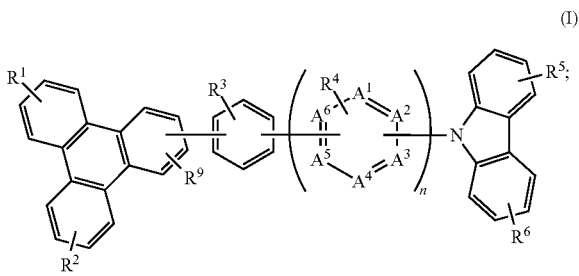

wherein

R¹, R², R³, R⁴, R⁵, and R⁶ each represent mono, di, tri, tetra substitutions, or no substitution;

R⁹ represents mono, di, tri substitutions, or no substitution;

R², R³, R⁴, R⁵, R⁶, and R⁹ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof;

A¹, A², A³, A⁴, A⁵, and A⁶ are each independently selected from N or C;

n is an integer from 1 to 20;

wherein the second host compound has a structure according to a formula (II):

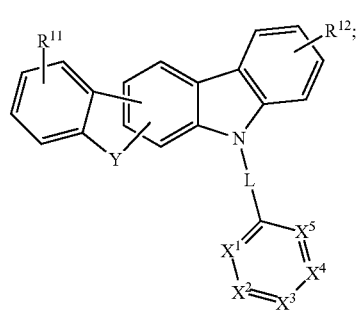

wherein R¹¹ and R¹² each represent mono, di, tri, tetra substitutions, or no substitution;

Y is selected from the group consisting of O, S, Se, NR', and CR''R''',

L is a single bond or comprises an aryl or heteroaryl group having from 5-24 carbon atoms, which is optionally further substituted;

X¹, X², X³, X⁴, and X⁵ are each independently selected from group consisting of CR and N;

at least one of X¹, X², X³, X⁴, and X⁵ is N; and

R, R', R'', and R''' are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof.

17. A method of fabricating an organic light emitting device comprising a first electrode, a second electrode, and a first organic layer disposed between the first electrode and the second electrode, wherein the first organic layer comprises a first organic composition further comprising a first mixture of a first host compound and a second host compound, the method comprising:

providing a substrate having the first electrode disposed thereon;

depositing the first organic composition over the first electrode; and depositing the second electrode over the first organic layer, wherein the first compound has a different chemical structure than the second compound;

wherein the first host compound is capable of functioning as a hole transporting material in an organic light emitting device at room temperature;

wherein the first host compound comprises at least one carbazole group;

wherein the first host compound has evaporation temperature T1 of 150 to 350° C. and the second host compound has evaporation temperature T2 of 150 to 350° C., wherein the evaporation temperature a compound is measured in a vacuum deposition tool at a constant pressure, between 1×10⁻⁶ Torr to 1×10⁻⁹ Torr, at a 2 Å/sec deposition rate on a surface positioned at a predefined distance away from the evaporating compound;

wherein the absolute value of T1−T2 is less than 20° C.;

wherein the first host compound has a concentration C1 in said mixture, and the first host compound has a concentration C2 in a film formed by evaporating the mixture in a vacuum deposition tool at a constant pressure between 1×10⁻⁶ Torr to 1×10⁻⁹ Torr, at a 2 Å/sec deposition rate on a surface positioned at a predefined distance away from the mixture being evaporated;

wherein absolute value of (C1−C2)/C1 is less than 5%;

wherein the first host compound has a structure according to formula (I):

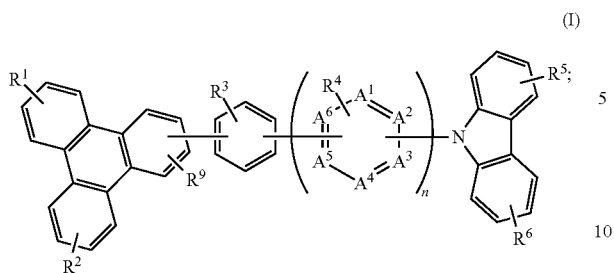

(I)

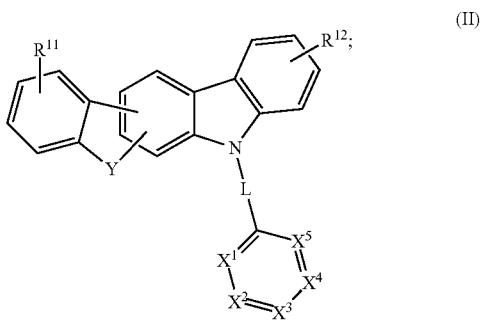

(II)

wherein $R^1$, $R^2$, $R^3$, $R^4$, $R^5$, and $R^6$ each represent mono, di, tri, tetra substitutions, or no substitution;

$R^9$ represents mono, di, tri substitutions, or no substitution;

$R^1$, $R^2$, $R^3$, $R^4$, $R^5$, $R^6$, and $R^9$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof;

$A^1$, $A^2$, $A^3$, $A^4$, $A^5$, and $A^6$ are each independently selected from N or C;

n is an integer from 1 to 20;

wherein the second host compound has a structure according to a formula (II):

wherein $R^{11}$ and $R^{12}$ each represent mono, di, tri, tetra substitutions, or no substitution;

Y is selected from the group consisting of O, S, Se, NR', and CR"R'",

L is a single bond or comprises an aryl or heteroaryl group having from 5-24 carbon atoms, which is optionally further substituted;

$X^1$, $X^2$, $X^3$, $X^4$, and $X^5$ are each independently selected from group consisting of CR and N;

at least one of $X^1$, $X^2$, $X^3$, $X^4$, and $X^5$ is N; and

R, R', R", and R'" are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof.

* * * * *

UNITED STATES PATENT AND TRADEMARK OFFICE
CERTIFICATE OF CORRECTION

PATENT NO. : 9,831,437 B2
APPLICATION NO. : 14/253471
DATED : November 28, 2017
INVENTOR(S) : Lichang Zeng et al.

It is certified that error appears in the above-identified patent and that said Letters Patent is hereby corrected as shown below:

In the Claims

In Claim 12, Column 156, Lines 1-15, please delete:

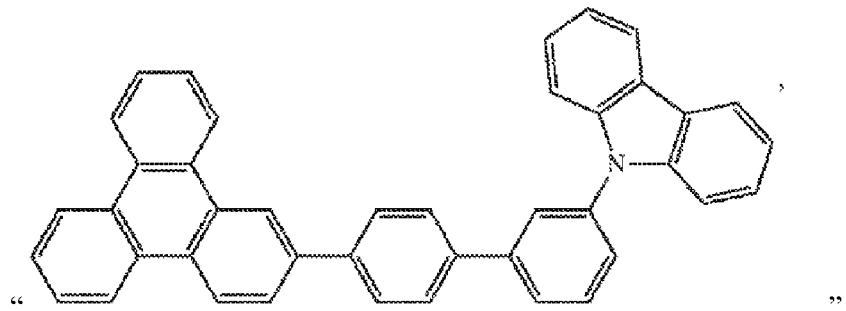

And insert:

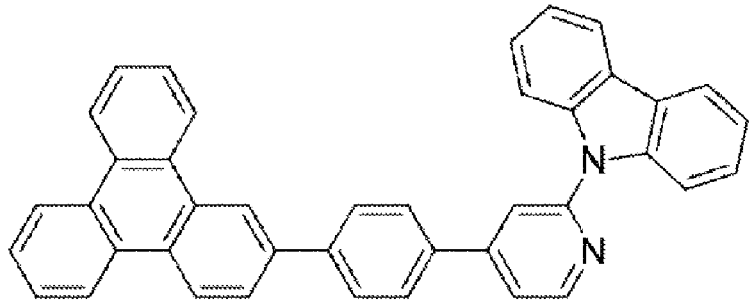

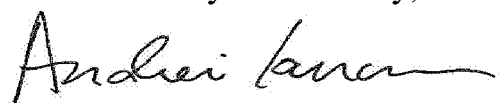

Signed and Sealed this
Twentieth Day of February, 2018

Andrei Iancu
*Director of the United States Patent and Trademark Office*